US00RE40673E

(19) United States
(12) Reissued Patent
Kanbara et al.

(10) Patent Number: US RE40,673 E
(45) Date of Reissued Patent: Mar. 24, 2009

(54) SHIFT REGISTER AND ELECTRONIC APPARATUS

(75) Inventors: Minoru Kanbara, Hachioji (JP); Kazuhiro Sasaki, Sagamihara (JP); Katsuhiko Morosawa, Higashiyamato (JP)

(73) Assignee: Casio Computer Co., Ltd., Tokyo (JP)

(21) Appl. No.: 11/193,995
(22) Filed: Jul. 29, 2005

Related U.S. Patent Documents

Reissue of:
(64) Patent No.: 6,611,248
Issued: Aug. 26, 2003
Appl. No.: 09/852,944
Filed: May 10, 2001

(30) Foreign Application Priority Data

May 31, 2000 (JP) ..... 2000-162671
Jun. 6, 2000 (JP) ..... 2000-169002
Apr. 26, 2001 (JP) ..... 2001-128909

(51) Int. Cl.
*G11C 19/28* (2006.01)
*G11C 19/00* (2006.01)

(52) U.S. Cl. ..... 345/100; 345/98; 345/204; 345/214; 345/205; 377/64; 377/68; 377/75; 377/58; 323/313; 323/314; 323/907; 327/542; 327/543

(58) Field of Classification Search ..... 345/98, 345/99, 199, 204, 205, 214; 377/58, 64, 68, 377/70, 74, 75; 323/313; 327/542
See application file for complete search history.

(56) References Cited

U.S. PATENT DOCUMENTS 4,084,106 A * 4/1978 Ullrich ..... 377/79
5,105,450 A * 4/1992 Yamada ..... 377/58
5,517,543 A * 5/1996 Schleupen et al. ..... 377/79
5,545,977 A * 8/1996 Yamada et al. ..... 323/313
6,300,928 B1 10/2001 Kim
6,621,481 B1 9/2003 Kanbara

FOREIGN PATENT DOCUMENTS

DE 199 50 860 A1 5/2000
EP 0 957 491 A1 11/1999
JP 5-84967 B2 12/1993
JP 06-202588 A 7/1994
KR 00242244 B1 11/1999

* cited by examiner

*Primary Examiner*—Amare Mengistu
*Assistant Examiner*—Vincent E. Kovaick
(74) *Attorney, Agent, or Firm*—Frishauf, Holtz, Goodman & Chick, P.C.

(57) ABSTRACT

Each of stages RS(1), RS(2), . . . of a shift register is constituted by six TFTs. A ratio of a channel width and a channel length (W/L) of each of these TFTs 1 to 6 is set in accordance with a transistor characteristic of each TFT in such a manner that the shift register normally operates for a long time even at a high temperature.

41 Claims, 31 Drawing Sheets

SHIFT REGISTER AND ELECTRONIC APPARATUS

Matter enclosed in heavy brackets [ ] appears in the original patent but forms no part of this reissue specification; matter printed in italics indicates the additions made by reissue.

CROSS-REFERENCE TO RELATED APPLICATIONS

This application is based upon and claims the benefit of priority from the prior Japanese Patent Applications No. 2000-162671, filed May 31, 2000; No. 2000-169002, filed Jun. 6, 2000; and No. 2001-128909, filed Apr. 26, 2001, the entire contents of all of which are incorporated herein by reference.

BACKGROUND OF THE INVENTION

The present invention relates to a shift register and an electronic apparatus such as a display unit or an imaging apparatus, using this shift register as a driver.

In an active matrix type liquid crystal display such as a TFT liquid crystal display, each one line of display pixels arranged in the matrix form is selected, and display data is written in a pixel capacitance of the selected pixels, thereby obtaining desired display.

In the TFT liquid crystal display, there are used a gate driver for serially outputting a gate signal for pixel selection to a gate of the TFT functioning as a pixel switching device, and a drain driver for outputting a drain signal which serves as image data during a gate selection period in parallel. Since the drain driver which outputs usual moving image data must be constituted by multiple complex transistors and driven at a high speed, there is adopted a driver consisting of monocrystal silicon or polysilicon which can reduce the size of the transistors and has the high mobility.

On the other hand, since the structure of the gate driver is not very complicated as the drain electrode and the gate driver has a low driving frequency, it can be theoretically driven by a driver consisting of amorphous silicon TFTs but it has not been put into practical use.

Among the gate drivers constituted by multiple amorphous silicon TFTs, there are drivers having a threshold value characteristic of each TFT being shifted with a lapse of time, or those disadvantageously causing an erroneous operation in the high-temperature environment.

BRIEF SUMMARY OF THE INVENTION

It is an object of the present invention to provide a shift register which can obtain a correct circuit operation even at a high temperature and obtain a stable operation in a long period of time.

According to a first aspect of the present invention there is provided a shift register, each stage of the shift register comprising:

a first transistor which has a first control terminal, is turned on by a signal on a predetermined level supplied from one stage to the first control terminal, and outputs the signal on a predetermined level from one end of a first electric current path to the other end of the first electric current path;

a second transistor which has a second control terminal, is turned on in accordance with a voltage applied to a wiring between the second control terminal and the other end of the first electric current path of the first transistor, and outputs a first or second signal supplied from outside to one end of a second electric current path as an output signal from the other end of the second electric current path;

a load for outputting a power supply voltage supplied from outside;

a third transistor which has a third control terminal, is turned on in accordance with a voltage applied to a wiring between the third control terminal and the other end of the first electric current path of the first transistor, and outputs the power supply voltage supplied from the outside through the load from one end of a third electric current path to the other end of the third electric current path so that the power supply voltage outputted from the load is displaced to a voltage on a predetermined level; and a fourth transistor which has a fourth control terminal, is turned on in accordance with a voltage applied to a wiring between the fourth control terminal and the load, and outputs a reference voltage to one end of a fourth electric current path from the other end of the fourth electric current path, one end of the fourth electric current path being connected to the other end of the second electric current path of the second transistor, a value (a channel-width/a channel-length of the fourth transistor) being equal to or larger than another value (a channel width of the second transistor/s channel length of the second transistor).

According to a second aspect of the present invention, there is provided a shift register each stage of the shift register comprising:

a first transistor which has a first control terminal, is turned on by a signal on a predetermined level supplied from one stage to the first control terminal, and outputs the signal on a predetermined level from one end of a first electric current path to the other end of the first electric current path;

a second transistor which has a second control terminal, is turned on in accordance with a voltage applied to a wiring between the second control terminal and the other end of the first electric current path of the first transistor, and outputs a first or second signal supplied from outside to one end of a second electric current path as an output signal from the other end of the second electric current path;

a third transistor which has a third control terminal and outputs a power supply voltage from one end of a third electric current path to the other end of the third electric current path;

a fourth transistor which has a fourth control terminal, is turned on in accordance with a voltage applied to a wiring between the fourth control terminal and the other end of the first electric current path of the first transistor, and outputs from one end of a fourth electric current to the other end of the fourth electric current path the power supply voltage supplied from the third transistor so that the power supply voltage outputted from the third transistor is displaced to a voltage on a predetermined level;

a fifth transistor which has a fifth control terminal, is turned on in accordance with a voltage applied to a wiring between the fifth control terminal and the third transistor, and outputs a reference voltage to one end of a fifth electric current path from the other end of the fifth electric current path, one end of the fifth electric current path being connected to the other end of the second electric current path of the second transistor; and a sixth transistor which has a sixth control terminal and resets a voltage applied to the wiring between the second control terminal of the second transistor and the first electric current path of the first transistor when turned on by turning on the sixth control terminal by an output signal of the other stage, a value (a channel-width/a channel-length of the fifth transistor) being larger than another value (a channel-width/a channel-length of the first transistor).

According to a third aspect of the present invention, there is provided a shift register, each stage of the shift register comprising:

a first transistor having a control terminal to which an output signal of a stage on one side is supplied and one end of an electric current path to which a first voltage signal is supplied;

a second transistor having a control terminal to which an output signal of a stage on the other side is supplied and one end of an electric current path to which a second voltage signal is supplied; and a third transistor which has a control terminal being connected to the other end of each electric current path of the first and second transistors, is turned on or off by the first or second voltage signal supplied to a wiring between the control terminal and the other end of each electric current path through the first or second transistor, and outputs from the other end of the electric current path a first or second clock signal supplied to one end of the electric current path as an output signal of that stage when turned on, at least one of the first and second transistor being constituted so as to be capable of discharging electric charge accumulated in the wiring by an output signal of the stage on one side or the other side supplied to the control terminal.

According to a forth aspect of the present invention, there is provided an electronic apparatus comprising:

(A) a shift register including on each stage:

a first transistor which has a first control terminal, is turned on by a signal on a predetermined level supplied from one stage to the first control terminal, and outputs the signal on a predetermined level from one end of a first electric current path to the other end of the first electric current path;

a second transistor which has a second control terminal, is turned on in accordance with a voltage applied to a wiring between the second control terminal and the other end of the first electric current path of the first transistor, and outputs a first or second signal supplied from outside to one end of a second electric current path as an output signal from the other end of the second electric current path;

a third transistor which has a third control terminal and outputs a power supply voltage from one end of a third electric current path to the other end of the third electric current path;

a fourth transistor which has a fourth control terminal, is turned on in accordance with a voltage applied to a wiring between the fourth control terminal and the other end of the first electric current path of the first transistor, and outputs from one end of a fourth electric current to the other end of the fourth electric current path the power supply voltage supplied from the third transistor so that the power supply voltage outputted from the third transistor is displaced to a voltage on a predetermined level;

a fifth transistor which has a fifth control terminal, is turned on in accordance with a voltage applied to a wiring between the fifth control terminal and the third transistor, and outputs a reference voltage to one end of a fifth electric current path from the other end of the fifth electric current path, one end of the fifth electric current path being connected to the other end of the second electric current path of the second transistor; and a sixth transistor which has a sixth control terminal and resets a voltage applied to the wiring between the second control terminal of the second transistor and the first electric current path of the first transistor by turning on the sixth control terminal by an output signal of the other stage; and (B) a drive device driven in accordance with the output signal from the second transistor of the shift register, a value (a channel-width/a channel-length of the fifth transistor) being larger than another value (a channel-width/a channel-length of the first transistor).

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

First Embodiment

Figure 1:
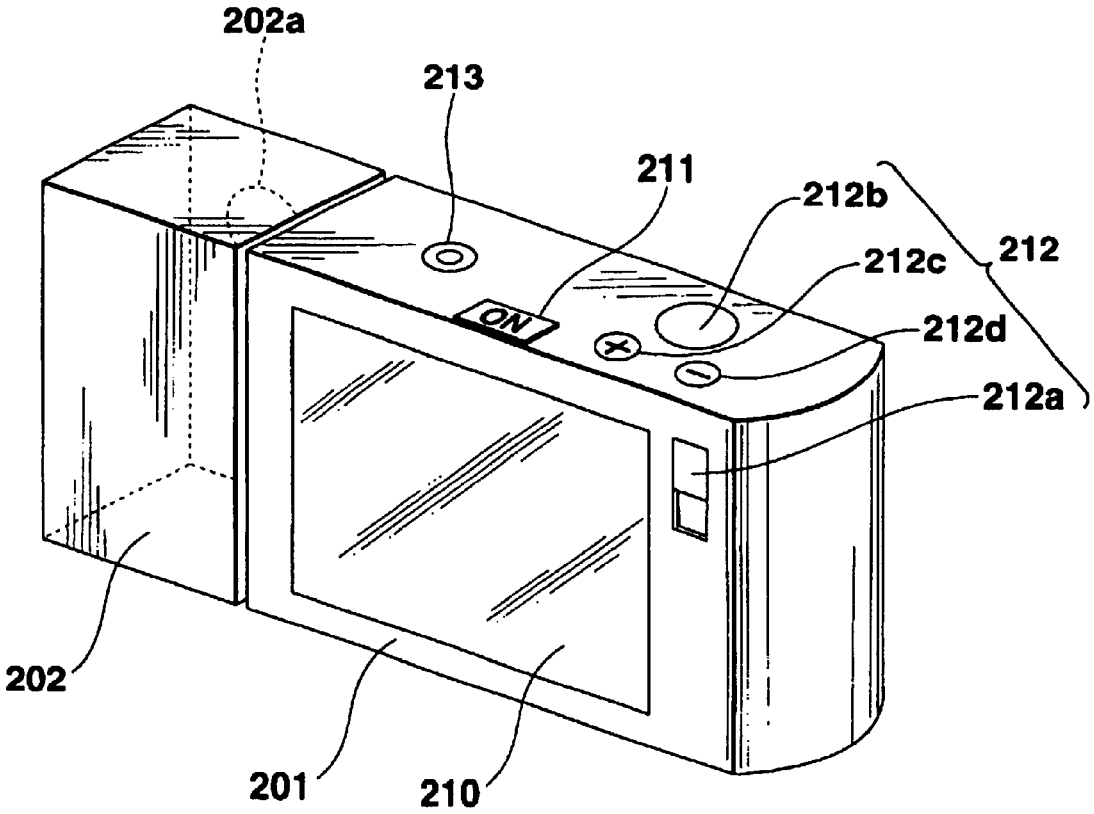
FIG. 1 is a perspective view showing an external appearance structure of a digital still camera according to a first embodiment of the present invention.

Preferred embodiments according to the present invention will now be described with reference to the accompanying drawings. FIG. 1 is a view showing an external appearance structure of a digital still camera according to this embodiment. As shown in the figure, this digital still camera is constituted by a camera main body portion 201 and a lens unit portion 202.

The camera main body portion 201 includes a display portion 210 and a mode setting key 212a in the front part thereof. The mode setting key 212a is a key used for switching between a recording mode for picking up an image and recording it in a later-described memory and a reproduction mode for reproducing the recorded image. The display portion 210 is constituted by a liquid crystal display. This portion functions as a view finder for displaying an image captured by a lens 202a before image pickup in the recording mode (monitoring mode) and functions as a display for displaying a recorded image in the reproduction mode. The configuration of the display portion 210 will be described later in detail.

The camera main body portion 201 includes on the top face thereof a power supply key 211, a shutter key 212b, a "+" key 212c,a "−" key 212d, and a serial input/output terminal 213. The power supply key 211 is used for turning on/off the power supply of the digital still cameral by performing the slide operation. The shutter key 212b, the "+" key 212c and the "−" key 212d constitute the key input portion 212 together with the above-described mode setting key 212a.

The shutter key 212b is used for instructing recording of an image in the recording mode and instructing determination of a selection content in the reproduction mode. The "+" key 212c and the "−" key 212d are used to select image data to be displayed on the display portion 210 from image data recorded in the image memory in the recording mode or to set conditions at the time of recording/reproduction. The serial input/output terminal 213 is a terminal to which a cable is inserted in order to transmit/receive data with respect to an external device (such as a personal computer or a printer).

The lens unit portion 202 includes the lens 202a for forming an image to be picked up on a rear surface side of the drawing. The lens unit portion 202 is attached so as to be capable of swiveling 360 degrees around a shaft joined to the camera main body portion 201 in the vertical direction.

Figure 2:
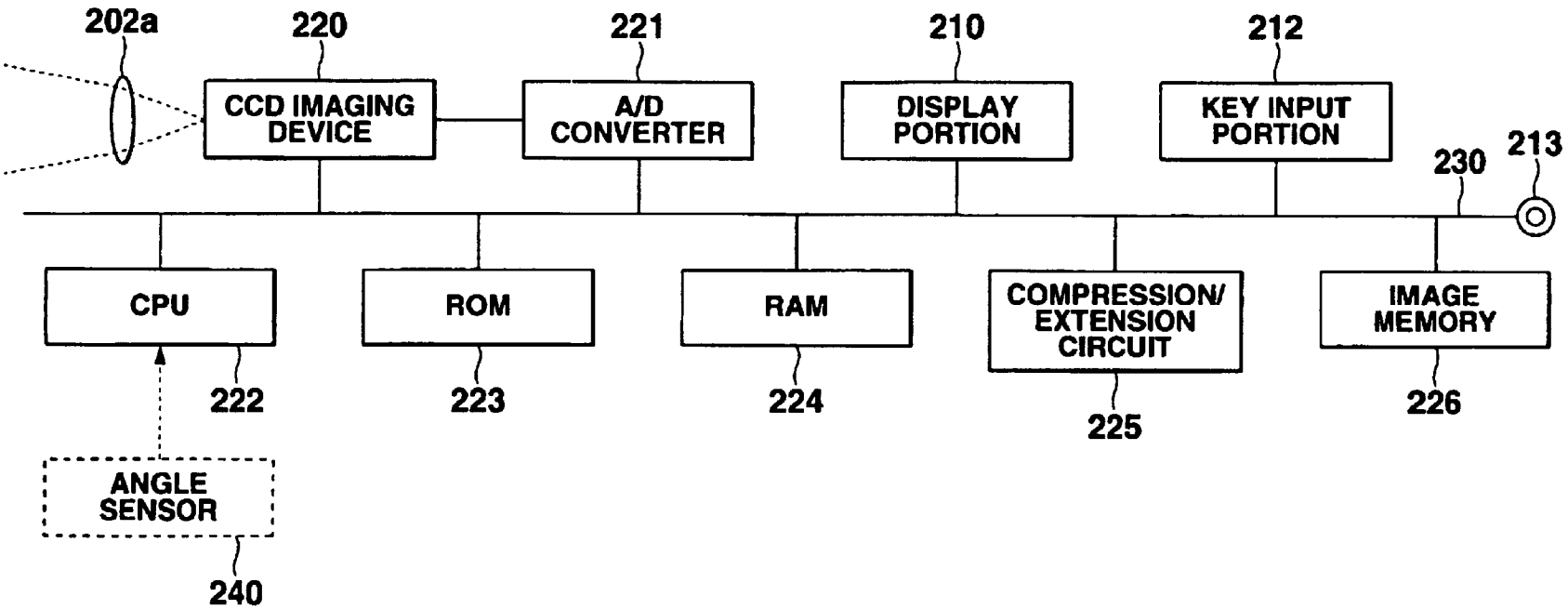
FIG. 2 is a circuit diagram of the digital still camera illustrated in FIG. 1.

FIG. 2 is a block diagram showing a circuit structure of the digital still camera according to this embodiment. As shown in the figure, this digital still camera includes: a CCD (Charge Coupled Device) imaging device 220; an A/D (Analogue/Digital) converter 221; a CPU (Central Processing Unit) 222; a ROM (Read Only Memory) 223; a RAM (Random Access Memory) 224; a compression/extension circuit 225; an image memory 226; the above-described display portion 210; the key input portion 212; and the serial input/output terminal 213. These members are connected to each other through a bus 230. The CCD imaging device 220 and the A/D converter 221 are also connected to each other through a dedicated line. An angle sensor 240 indicated by a broken line is not included in this embodiment (see the later-described second embodiment).

The CCD imaging device 220 has a plurality of imaging pixels formed in the matrix and photoelectrically converts a light ray image-formed by the imaging lens 202a to output an electric signal according to the intensity of the light of each pixel. The A/D converter 221 converts an analog electric signal outputted from the CCD imaging device 220 into a digital signal to be outputted. The CPU 222 controls a circuit in each portion of the digital still camera by executing a program stored in the ROM 223 in accordance with an input from the key input portion 212. The ROM 223 stores a program executed by the CPU 222 as well as fixed data. The RAM 224 is used as a work area when executing a program by the CPU 222. In RAM 224 is provided a VRAM area for developing image data to be displayed on the display portion 210. The compression/extension circuit 225 compresses image data picked-up by the CCD imaging device when the shutter key 212 is operated and converted into a digital signal by the A/D converter 221, and records this image data in the image memory 226. The compression/extension circuit 225 extends image data compressed and recorded in the image memory 226 when a command for displaying the picked-up image is issued from the key input portion 212. The image memory 226 is constituted by a non-volatile storage medium such as a flash memory from which data can not be erased, and records image data picked-up and compressed as described above. The image memory 226 may be constituted so as to be detachable from the digital still camera.

Figure 3:
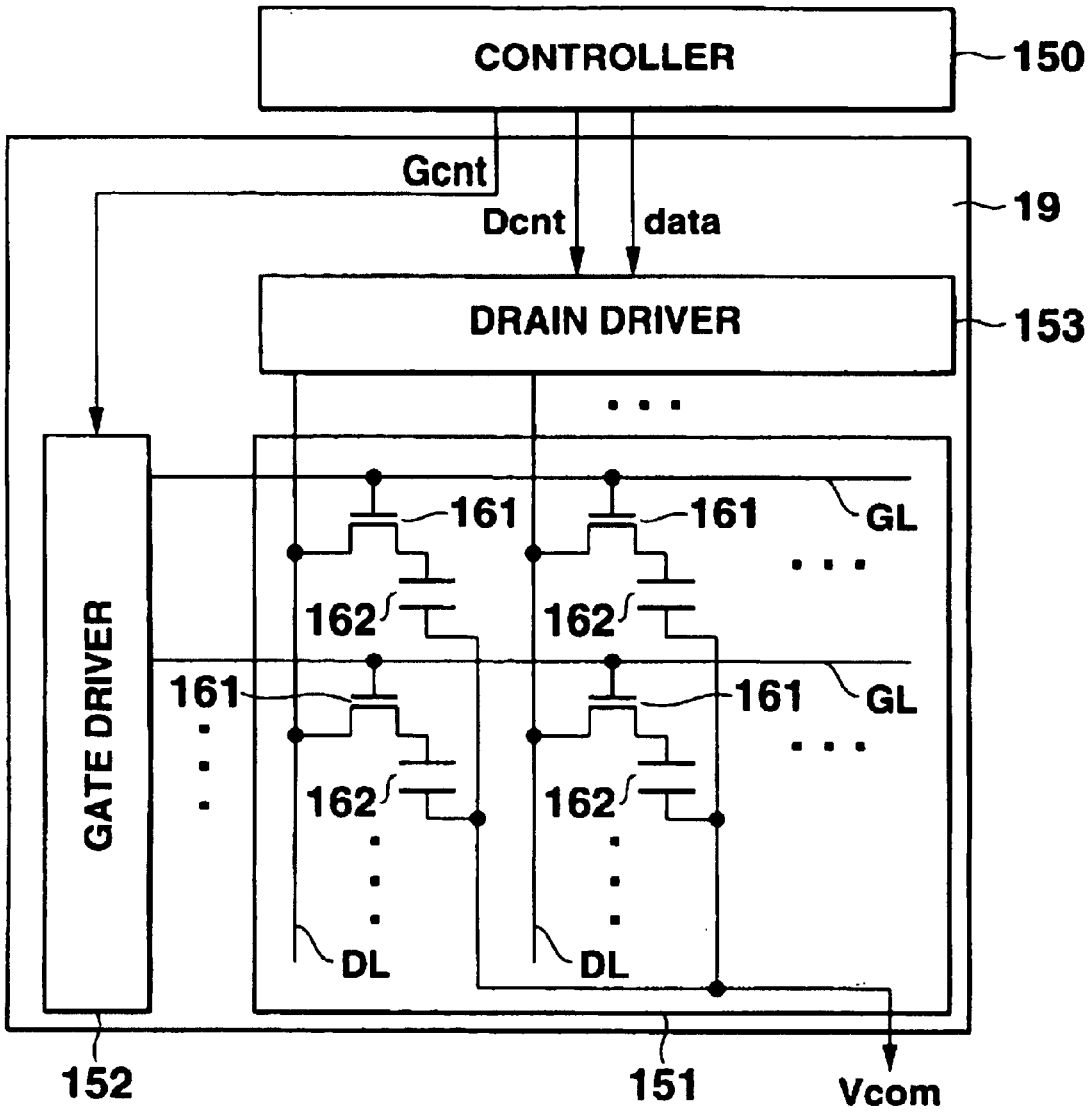
FIG. 3 is a block diagram showing a circuit structure of a display portion illustrated in FIG. 2.

FIG. 3 is a block diagram showing the structure of a liquid crystal display constituting the display portion 210. AS shown in the figure, the liquid crystal display has a controller 150, a display area 151, a gate driver 152, and a drain driver 153. From the controller 150, a control signal group Gcnt is supplied to the gate driver 152, meanwhile a control signal group Dcnt and display data data are supplied to the drain driver 153.

The controller 150 generates control signal groups Gcnt and Dcnt in accordance with a control signal from the CPU 222 and supplies them to the gate driver 152 and the drain driver, respectively. Further, the controller 150 reads image data developed in the VRAM area in the RAM 224 and supplies it to the drain driver 153 as display data (data) in accordance with a control signal from the CPU 222.

The display area 151 is constituted by sealing liquid crystal in a pair of substrates, and a plurality of TFTs 161 for active drive are formed in the matrix on one substrate 19 with a-Si layer being used for a semiconductor layer. In each TFT 161, a gate is connected to a gate line GL, a drain is connected to a drain line DL, and a source is similarly connected to each of pixel electrodes formed in the matrix. A common electrode to which a predetermined voltage Vcom is applied is formed on the other substrate, and the common electrode, each pixel electrode and the liquid crystal therebetween form a pixel capacitance 162. When the alignment state of the liquid crystal varies by electric charge accumulated in the pixel capacitance 162, the display area 151 controls a quantity of light to be transmitted and then displays an image.

The gate driver 152 is constituted by a shift register which operates in accordance with a control signal group Gcnt from the controller 150. The gate driver 152 sequentially selects the gate line GL to output a predetermined voltage in accordance with the control signal group Gcnt from the controller 150. The shift register constituting the gate driver 152 will be described later in detail.

The drain driver 153 sequentially fetches display data (data) from the controller 150 in accordance with the control signal group Dcnt from the controller. When display data (data) corresponding to one line is accumulated, the drain driver 153 outputs this data to the drain line DL in accordance with the control signal group Dcnt from the controller 150, and accumulates it in the pixel capacitance 162 through the TFT 161 (ON state) connected to the gate line GL selected by the gate driver 152.

Figure 4:
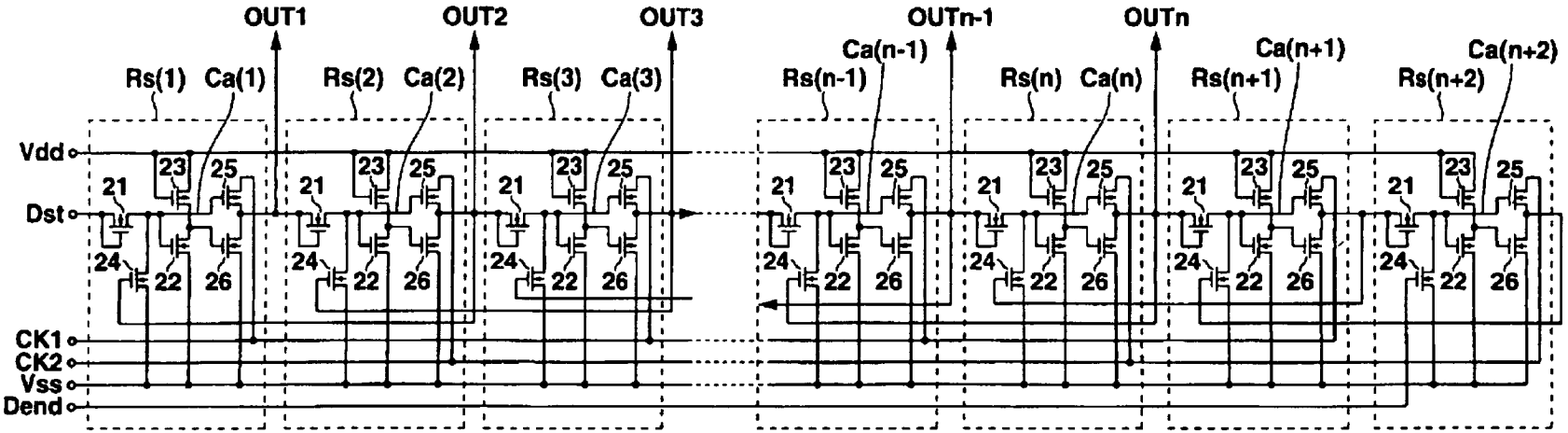
FIG. 4 is a view showing a circuit structure of a shift register used as a gate driver.

The gate driver 152 illustrated in FIG. 3 will now be described in detail. FIG. 4 is a circuit diagram showing the entire structure of the gate driver 152. Assuming that a number of stages of the gate driver 152 arranged in the imaging device (a number of the gate lines GL) is n, the gate driver 152 is constituted by n stages RS(1) to RS(n) for outputting gate signals, a dummy stage RS(n+1) and a dummy stage RS(n+2) for controlling the stage RS(n) and the like. FIG. 4 shows the structure in which n is an even number not less than 2.

As a control signal Gcnt from the controller, a signal CK1 is supplied to the odd-numbered stages RS(1), RS(3), . . . , RS(2t−1). A signal CK2 is supplied to the even-numbered stages RS(2), RS(4), . . . , RS(2t). A constant voltage Vss is supplied from the controller to each stage. The high level of the signals CK1 and CK2 corresponds to +15 (V) and the low level of the same corresponds to −15 (V). Furthermore, the level of the constant voltage Vss corresponds to −15 (V).

To the first stage RS(1) is supplied a start signal Dst from the controller. The high level and the low level of the start signal Dst corresponds to +15 (V) and −15 (V), respectively. Output signals OUT1 to OUTn−1 are supplied from the respective preceding stages RS(1) to RS(n−1) to the second and the subsequent stages RS(2) to RS(n). Moreover, to each stage RS(k) (k: an arbitrary integer from 1 to n) is supplied an output signal OUTk+1 (however, a reset signal Dend in case of the last stage RS(n)) from the following stage RS(k+1) as a reset pulse. The output signals OUT1 to OUTn of the respective stages RS(1) to RS(n) are outputted to a plurality of gate lines GL of the imaging device 1.

Figure 5:
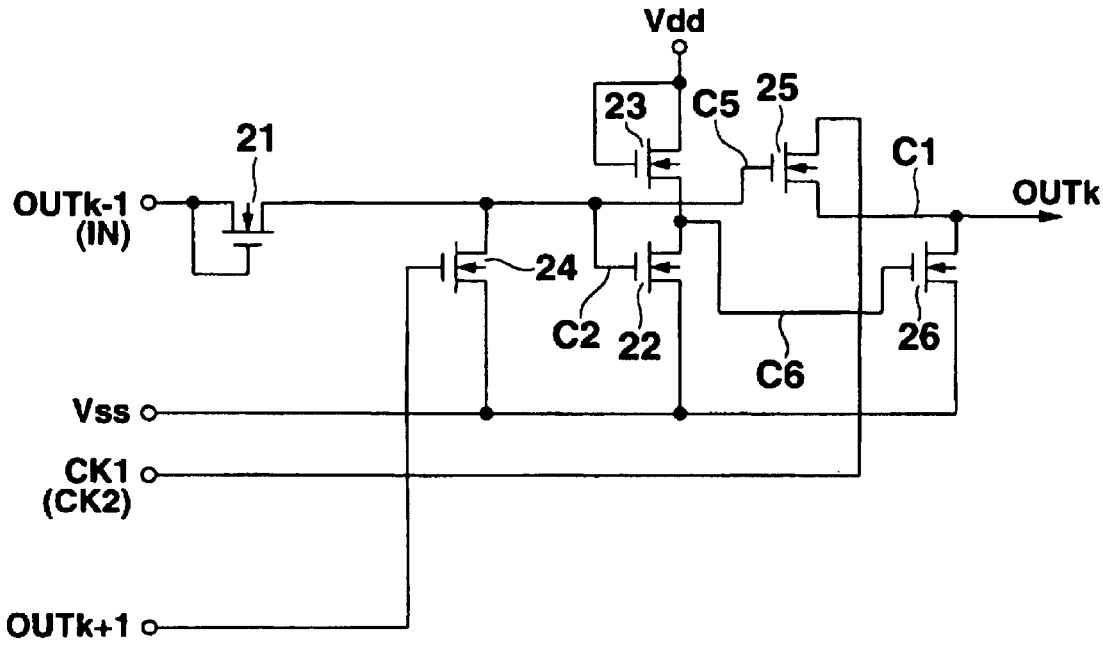
FIG. 5 is an enlarged view showing the structure of each stage of the shift register illustrated in FIG. 4.

FIG. 5 is a view showing the circuit structure of the respective stages RS(1) to RS(n) of the gate driver 152. AS shown in the figure, each stage has six TFTs (Thin Film Transistors) 21 to 26 as a basic structure. Each of the TFTs 21 to 26 is constituted by an n channel MOS type field effect transistor. In addition, silicon nitride film is used for a gate insulating film and amorphous silicon film is used for a semiconductor layer.

A gate electrode and a drain electrode of the TFT 21 in each stage RS(k) are connected to a source electrode of the TFT 25 in each preceding stage RS(k−1), and the source electrode of the TFT 21 is connected to the gate electrode of the TFT 22 in the same stage, the gate electrode of the TFT 25, and the drain electrode of the TFT 24. The drain electrode of the TFT 22 is connected to the source electrode of the TFT 23 and the gate electrode of the TFT 26, and the constant voltage Vss is supplied to the source electrode of the TFT 22 and the source electrode of the TFT 24. A power supply voltage vdd is supplied to the gate electrode and the drain electrode of the TFT 23; the signal CK1, to the drain electrode of the TFT 25 in the odd-numbered stage; and the signal CK2, the drain electrode of the TFT 25 in the even-numbered stage. The source electrode of the TFT 25 in each stage is connected to the drain electrode of the TFT 26, and the constant voltage Vss is supplied to the source electrode of the TFT 26. An output signal OUTk+1 of the next stage is inputted to the gate electrode of the TFT 24.

Figure 6:
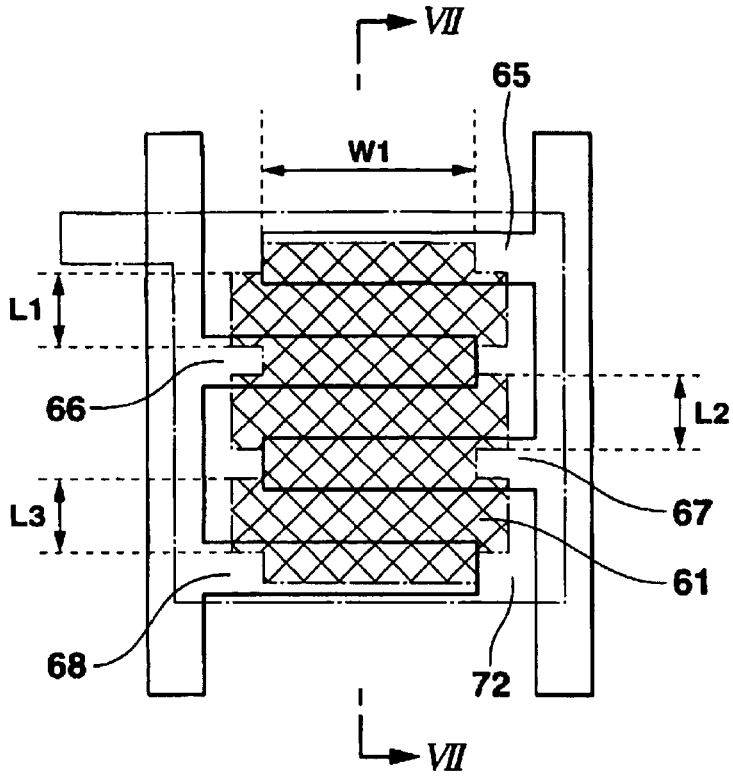
FIG. 6 is a plane view of a TFT constituting the shift register.
Figure 7:
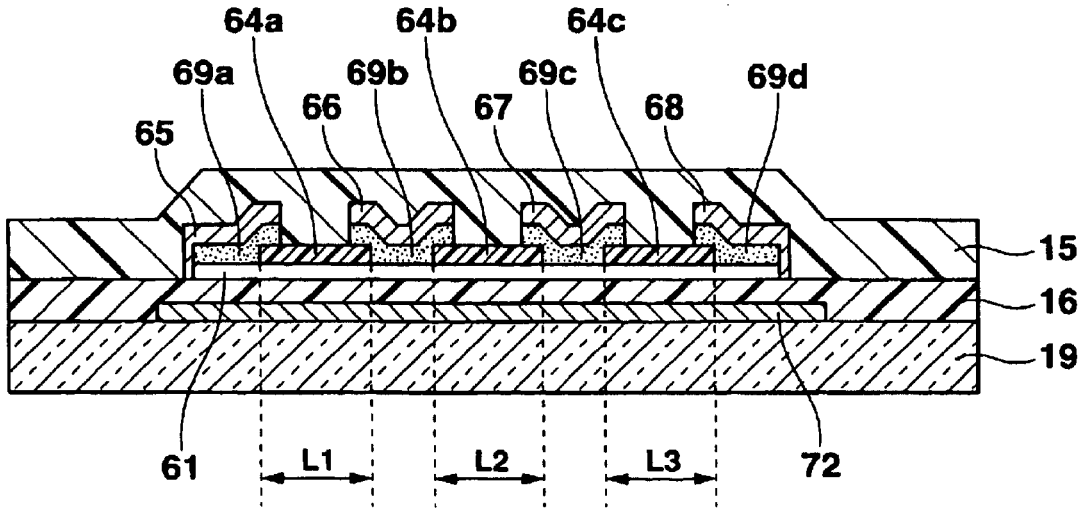
FIG. 7 is a cross-sectional view taken along the line VII—VII of the TFT illustrated in FIG. 6.

FIG. 6 is a schematic block diagram showing an example of an inverted stagger type transistor applied suitably constructing to the respective TFTs 21 to 26 of the shift register according to the embodiment of the present invention, and FIG. 7 is a cross-sectional view taken along the line VII—VII in FIG. 6.

The inverted stagger type transistor is constituted by: a gate electrode 72 formed on an insulating substrate 19 made of, e.g., glass in the display area 151 (FIG. 3); a gate insulating film 16 provided on the gate electrode 72 and the insulating substrate 19; a semiconductor layer 61 which is provided so as to be opposed to the gate electrode 72 and consists of, e.g., amorphous silicon; block insulating films 64a, 64b and 64c which are arranged in parallel so as to be separated from each other on the semiconductor layer 61; an impurity dope layer 69a which extends over one end portion of the block insulating film 64a in the channel length direction and is provided on the semiconductor layer 61; an impurity dope layer 69b which extends over the other end portion of the block insulating film 64a in the channel length direction and one end of the block insulating film 64b in the channel length direction and is provided on the semiconductor layer 61; an impurity dope layer 69c which extends over the other end portion of the block insulating film 64b in the channel length direction and one end portion of the block insulating film 64c in the channel length direction is provided on the semiconductor layer 61; an impurity dope layer 69d which extends over the other end portion of the block insulating film 64c in the channel length direction and is provided on the semiconductor layer 61; a source electrode 65 which is provided on each of the impurity dope layer 69a, the impurity dope layer 69b, the impurity dope layer 69c, and the impurity dope layer 69d; a drain electrode 66; a source electrode 67; a drain electrode 68; and an interlayer insulating film 15 formed so as to cover the gate insulating film 16, the block insulating films 64a, 64b and 64c, the source electrodes 65 and 67 and the drain electrodes 66 and 68.

The gate electrode 72, and the source and drain electrodes 65 to 68 are made of material selected from chrome, a chrome alloy, aluminium and an aluminium alloy. The impurity dope layers 69a, 69b,69c and 69d are made of amorphous silicon in which n type impurity ions are doped. The semiconductor layer 61 has a single layer structure existing in an area indicated by hatching in the form of a grid.

Description will now be given as to the actions of the respective TFTs 21 to 26 of this shift register. Since each stage has substantially the same structure, the first stage RS(1) is exemplified.

The start signal Dst is supplied to the gate and the drain (electrode) of the TFT 21. The source (electrode) of the TFT 21 is connected to the gate (electrode) of the TFT 25, the gate of the TFT 22 and the source of the TFT 24. The TFT 25 is turned on when a node of a wiring Ca(1) between the TFT 25 and the source of the TFT 21 is on the high level. The clock signal CK1 is supplied to the drain of the TFT 25, and the TFT 25 itself is turned on. Further, this signal is outputted as the output signal OUT1 of this stage RS(1) when the TFT 26 is in the OFF state.

The power supply Vdd is supplied to the gate and the source of the TFT 23. When the source potential is sufficiently low with respect to the power source voltage Vdd, the TFT 23 is turned on and outputs the power supply voltage Vdd from the source. The voltage outputted from the source of the TFT 23 is supplied to the drain of the TFT 22, and the TFT 23 functions as a load so that the power supply voltage Vdd is supplied to the TFT 22. The TFT 22 is turned on when the node of the wiring Ca(1) between the TFT 22 and the source of the TFT 21 is on the high level. The TFT 22 then emits the power supply voltage Vdd supplied through the TFT 23 from the wiring of the reference voltage Vss which is a lower voltage.

When the TFT 22 is in the OFF state, the TFT 26 is turned on by the power supply voltage Vdd fed through the TFT 23 and sets the voltage level of the output signal OUT1 as the reference voltage Vss. Furthermore, when the TFT 22 is in the ON state, the TFT 26 is turned off, and the voltage level of the clock signal CK1 becomes the voltage level of the output signal OUT1 at this time. The TFT 24 is turned on by an output signal OUT2 of a subsequent stage RS(2), and the potential of the node of the wiring Ca between the source of the TFT 21, the gate of the TFT 25 and the gate of the TFT 22 changes to the reference voltage Vss.

The structure of the odd-numbered stages RS(2t+1) (t: an integer of 1 to n/2) excluding the first stage is the same as that of the first stage RS(1) except that the output signal OUT(2t) of the preceding stage RS(2t) is supplied to the gate and the drain of the TFT 21. The structure of the even-numbered stages RS(2t+2) (t: an integer of 0 to n/2) is the same as that of the first stage RS(1) except that an output signal OUT(2t+1) of the preceding stage RS(2t+1) is supplied to the gate and the drain of the TFT 21 and the clock signal CK2 is supplied to the drain of the TFT 25 instead of the clock signal CK1. Moreover, although the reset signal Dend fed to the gate of the TFT 24 of the last dummy stage RS(n+2) is supplied from the controller 150, an output signal OUT3 of the third stage RS(3) in the next scanning may be used instead.

Description will now be given as to the specific design of each stage of the shift register, especially how to set the relative dimension of the TFTs 21 to 26.

In the semiconductor layer 61 of each of the TFTs 21 to 26, the channel area in which the drain electric current flows is determined as a rectangle having two adjacent sides defined by a channel length $L_1$ and a channel width $W_1$, a rectangle having two adjacent sides defined by a channel length $L_2$ and the channel width $W_1$, and an orthogon having two adjacent sides defined by a channel length $L_3$ and the channel width $W_1$. Incidentally, as to an optimum value for a later-described value (W/L) of the respective TFTs 21 to 26, all the TFTs 21 to 26 which are roughly different from each other do not need to have the same structure as that shown in FIGS. 6 and 7, and a number of channel areas of the semiconductor layer 61 may be increased as a channel length $L_4$, a channel length $L_5$, . . . . Further, in case of a TFT having a small value (W/L), a number of the three channel areas constituted by the channel length $L_1$ to the channel length $L_3$ may be reduced to two or lower.

The drain electric current Ids flowing through this transistor can be expressed by the following formula.

$$Ids\ (W_1/L_1+W_1/L_2+W_1/L_3)=\Sigma(W/L)$$

Here, if $L_1=L_2=L_3$ is set, $\Sigma(W/L)=3W_1/L_1$ is obtained.

In the present invention, the relative value of the value $\Sigma(W/L)$ of each of the TFTs 21 to 26 is optimized to realize the shift register which does not erroneously operate even in the high-temperature environment. In the following description, the value $\Sigma(W/L)$ is simplified and written as the value (W/L). Therefore, the value (W/L) means $\Sigma(W/L)$ as described above if there are a plurality of channel areas. Here, a signal on a voltage level whose high level and low level largely differ from each other is supplied from outside to the drains of the TFT 21 and the TFT 25, and this signal must be outputted from their sources. Thus, the value (W/L) of their size is restricted in a given range.

Here, to the TFT 25 is supplied the clock signal CK1 or the clock signal CK2 having a large voltage difference between the low level and the high level, and on level (high level) output signals OUT1 to OUTn must be outputted as gate signals having rectangular waves with less noise. Therefore, the level of the output signals OUT1 to OUTn must be sufficiently increased in a short period of time. Accordingly, the bootstrap effect must be generated to cause the high drain electric current to flow in a short period of time. Therefore, as (W/L), a larger value is desirable. In addition, since the parasitic capacitances between the gate and the source and between the gate and the drain of the TFT 25 must be increased in order to obtain the larger bootstrap effect, the relatively larger size of the transistor is desirable for the TFT 25.

On the other hand, although the start signal Dst having a large voltage difference between the low level and the high level or an output signal of the preceding stage is supplied to the TFT 21 and outputted to the wiring Ca, it is unnecessary to increase the potential level of the node of the wiring Ca in a short period of time as will be described later. Therefore, a considerably large value is required for the TFT 25, but the value for the TFT 21 does not have to be increased as the value (W/L) for the TFT 25. Thus, when the TFT 21 is used for the gate driver of the liquid crystal display, that TFT can function even if its value is approximately ⅓ of that of the TFT 25.

Since both the TFT 23 and the TFT 22 are used for switching of the TFT 26 and do not supply output signals, the high drain electric current does not have to flow in a short period of time, and a steep and large potential change such as that in the bootstrap effect is not observed in each terminal. Therefore, the influence of the erroneous operation of the shift register is small even if the value (W/L) of each of the TFTs 23 and 22 is set smaller than that of each of the TFTs 21 and 25. It is, however, preferable that the TFT 23 has a value (W/L) larger than 1/20 of the value of the TFT 25, and more desirable that the TFT 23 has a value (W/L) which is not less than ⅕ of the value of the TFT 25.

Since the influence of the TFT 22 to the output signals OUT1 to OUTn is smallest, it is desirable that the value (W/L) of the TFT 22 is the smallest value among the values (W/L) of the other TFTs 21 and 23 to 26.

The voltage of the TFT 26 must be forcibly changed from the high level to the reference voltage Vss which is on the low level so that the drain electric current can rapidly flow, when the output signals OUT1 to OUTn are switched from the ON level (high level) to the OFF level (low level). Thus, the larger value (W/L) is desirable for the TFT 26.

Although it is desirable that the gate voltage of the TFT 25 in the OFF level period is on a constant low level, the noise may be disadvantageously added to the gate signal (low level of the output signals OUT1 to OUTn) in the OFF level period, which are supplied to the gate line GL, due to a leak electric current of the TFT 25 which is generated because the gate voltage of the TFT 25 oscillates in accordance with an amplitude of the low level and the high level of the clock signal CK1 or CK2. Further, since the OFF level period of each gate line GL is overwhelmingly longer than the ON level period, the above-described action greatly affects the liquid crystal display. It is, therefore, desirable to set the value (W/L) of the TFT 26 equal to or above that of the TFT 25 in order to suppress the noise added to the gate line GL during the OFF level period and stabilize the low level voltage.

The TFT 21 sets the TFT 25 on the ON level (high level), whereas the TFT 24 sets the TFT 25 on the OFF level (low level). Thus, it is desirable that the value (W/L) of the TFT 24 is substantially equal to that of the TFT 21.

In order to prevent the malfunction of the shift register even under high-temperature conditions, it is desirable to set the values (W/L) of the TFTs 21 to 26 as high as possible. However, the entire area of the shift register increases as the values of the TFTs 21 to 26 are set higher. Therefore, taking the environment conditions for use or the circuit arrangement into consideration, setting each value (W/L) in the above-described condition range can suffice. The relationship between the value (W/L) of each of the TFTs 21 to 26 and the durable temperature will be further considered in accordance with the later-described embodiment.

Figure 8:
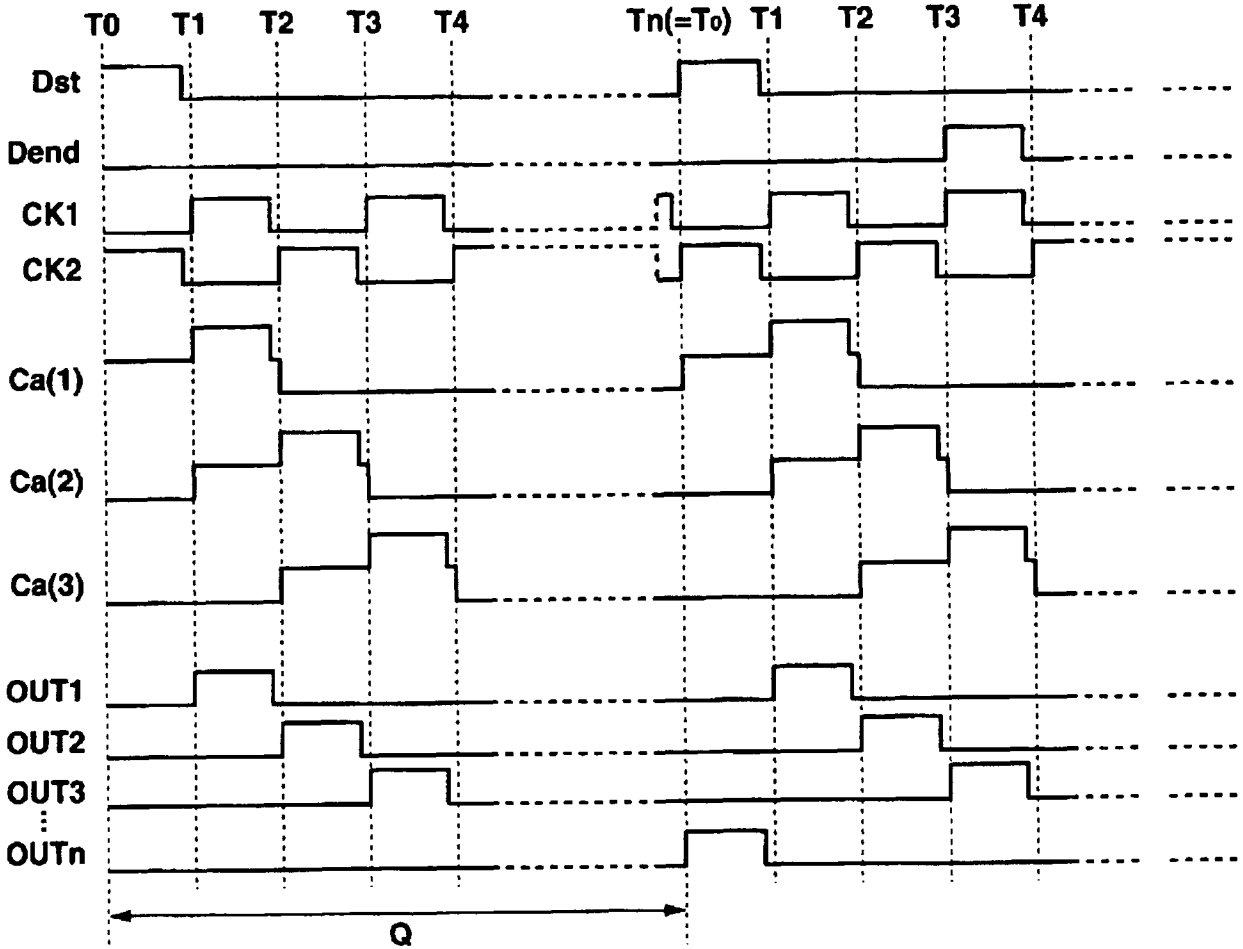
FIG. 8 is a timing chart showing the operation of the shift register illustrated in FIG. 4.

Description will now be given as to the operation of the shift register according to this embodiment. FIG. 8 is a timing chart showing the operation of the shift register illustrated in FIG. 4.

In a period from a timing T0 to another timing T1, when the start signal Dst rises to the high level, the TFT 21 of the first stage RS(1) is turned on, and this signal is outputted from the drain of the TFT 21 to the source. As a result, the node potential of the wiring Ca(1) of the first stage RS(1) rises to the high level. Consequently, the gate voltages of the TFT 25 and the TFT 22 rise to the high level, thereby turning on the TFTs 25 and 22. Further, when the TFT 22 is turned on, the power supply voltage Vdd fed through the TFT 23 is no longer supplied to the gate of the TFT 26 and the TFT 26 is turned off. In this period, since the clock signal CK1 is on the low level, it can be understood that the level of the output signal OUT1 remains on the low level.

Subsequently, at the timing T1, when the clock signal CK1 changes to the high level, this signal is outputted from the drain of the TFT 25 of the first stage RS(1) to the source, and the level of the output signal OUT1 varies to the high level. At this time, since the potential of the wiring Ca(1) raises to a high voltage due to the bootstrap effect, it reaches to a saturation gate voltage of the TFT 25, and the output signal OUT1 has the potential substantially equal to that of the clock signal CK1 on the high level. Thereafter, when the clock signal CK1 falls to the low level in a period from the timing T1 to the next timing T2, the output signal OUT1 approximates the low level.

Furthermore, in the period from the timing T1 to the next timing T2, the TFT 21 of the second stage RS(2) is turned on by the output signal OUT1 of the first stage RS(1) which has risen to the high level, and the potential of the node of the wiring Ca(2) reaches the high level. As a result, the TFT 25 and the TFT 22 of the second stage RS(2) are turned on, and the TFT 26 is turned off.

Subsequently, at the timing T2, when the clock signal CK2 changes to the high level, this signal is outputted from the drain of the TFT 25 of the second stage RS(2) to the source, and the level of the output signal OUT2 changes to the high level. At this time, since the potential of the node of the wiring Ca(2) rises to a high voltage due to the bootstrap effect, it reaches the saturation gate voltage of the TFT 25, and the output signal OUT2 has the potential substantially equal to that of the clock signal CK2 on the high level. Moreover, when the output signal OUT2 on the high level is supplied to the gate of the TFT 24 of the first stage RS(1), the TFT 24 is turned on in the first stage RS(1), and the high level voltage of the node of the wiring CA(1) becomes the reference voltage Vss. Thereafter, when the clock signal CK2 falls to the low level in a period from the timing T2 to the next timing T3, the output signal OUT2 approximates the low level.

In addition, in a period from the timing T2 to the next timing T3, TFT 21 of the third stage RS(3) is turned on by the output signal OUT2 of the second stage RS(2) which has risen to the high level, and the potential of the node of the wiring Ca(3) changes to the high level. Consequently, the TFTs 25 and 22 of the third stage RS(3) are turned on, and the TFT 26 is turned off.

Subsequently, in the timing T3, when the clock signal CK1 changes to the high level, this signal is outputted from the drain of the TFT 25 of the third stage RS(3) to the source, and the level of the output signal OUT3 varies to the high level. At this time, since the potential of the wiring Ca(3) rises to a high voltage due to the bootstrap effect, it reaches to the saturation gate voltage of the TFT 25, and the output signal OUT 3 has the potential substantially equal to that of the clock signal CK1 on the high level. Additionally, when the output signal OUT3 on the high level is supplied to the gate of the TFT 24 of the second stage RS(2), the TFT 24 is turned on in the second stage RS(2), and the high level voltage of the wiring Ca(2) is set as the reference voltage Vss.

Subsequently, the output signals OUT1 to OUTn of the respective stages similarly sequentially rise to the high level in one scanning period Q until the timing Tn (next timing T0). As described above, the high level potential of each of the output signals OUT1 to OUTn is not gradually decreased even if shifted to the next stage. Further, the start signal Dst again rises to the high level after the one scanning period Q, and the above-mentioned operation is thereafter repeated in the stages RS(1) to RS(n).

Although the node of the wiring Ca(n) remains on the high level after outputting the output signal OUTn on the high level in the last stage RS(n) of the gate line GL, the TFT 24 of the last stage RS(n) is turned on by the output signal OUTn+1 of the dummy stage RS(n+1) which commences to be driven by the output signal OUTn, and the node of the wiring Ca(n) changes to have the reference voltage Vss. Similarly, the TFT 24 of the dummy stage RS(n+1) is turned on by the output signal OUTn+2 of the dummy stage RS(n+2), and the node of the wiring Ca(n+1) varies to have the reference voltage Vss. Further, the node of the wiring Ca(n+2) of the dummy stage RS(n+2) changes from the high level to the reference voltage Vss, when the reset signal Dend on the high level is supplied to the TFT 24 of the dummy stage RS(n+2).

Although the above-described shift register ideally operates in accordance with the timing chart shown in FIG. 8, the possibility of a malfunction of the shift register becomes higher as the temperature increases because the characteristic of the TFTs 21 to 26 changes as the temperature increases. That is, there increases the possibility of occurrence of a malfunction or a disabled normal operation that the potential of the wiring Ca which is in the floating state between the gate of the TFT 25 and the source of the TFT 21 increases in synchronization with the clock signal CK1 or CK2 and the TFTs 25 and 22 are turned on.

Description will now be given on how a malfunction of the above-mentioned shift register affects an electronic apparatus using this shift register. Although the above-described shift register is used as a driver for, e.g., a liquid crystal display or an imaging device, the case where the shift register is used in the liquid crystal display will be explained herein.

The gate driver 152 to which the shift register according to this embodiment is applied sequentially selects the gate line GL in accordance with the control signal group Gcnt from the controller and outputs a predetermined voltage. This control signal group Gcnt includes the clock signals CK1 and CK2, the start signal Dst, the power supply voltage Vdd and the reference voltage Vss described above.

Description will now be given hereinafter on how the operation of the liquid crystal display varies in the case where the gate driver 152 to which the above shift register is applied normally functions and in the case where the same erroneously operates. In the following description, it is assumed that the pixel TFT 161 and the drain driver 153 in the display area 151 normally function without any malfunction.

When the gate driver 152 normally functions, the level of the voltage outputted to the gate line GL from a plurality of stages except a stage which should essentially output the high level signal is suppressed to be lower than that of a threshold voltage of the pixel TFT 161. The signal on the high level is outputted to the gate lines GL one by one by the output signals sequentially supplied from the respective stages of the gate driver 152, and the pixel TFT 161 for the corresponding one line is turned on.

The drain driver 153 fetches image data data supplied from the controller in accordance with each line and outputs a corresponding signal to each drain line DL in accordance with a selection of the gate line GL. The signal outputted to the drain line DL in this manner is written in the pixel capacitance 162 through the pixel TFT 161 which is in the ON state. Moreover, the orientation state of the liquid crystal changes in accordance with the signal written in the pixel capacitance varies and a quantity of light to be transmitted is adjusted, thereby displaying an image on a screen of the liquid crystal display.

On the other hand, when the gate driver 152 erroneously operates as described above, the voltage outputted to the gate line GL from a stage which essentially should not output the high level signal approximates or exceeds the threshold voltage of the pixel TFT 161, and the pixel TFT 161 may accidentally cause the drain electric current to flow. In this case, the signal outputted from the drain driver 153 to the drain line DL is also written in the pixel capacitance 162 in which a signal should not be written through the pixel TFT 161, as well as the pixel capacitance 161 in which a signal should be essentially written. As a result, the orientation state of the liquid crystal differs from the true orientation state, and an image displayed on the liquid crystal display becomes different from an image which should be primarily displayed.

As described above, in the shift register according to this embodiment, by setting the value (W/L) of each of the TFTs 21 to 26 in a range of the above-described conditions, the shift register can normally operate for a long time even under the high-temperature conditions. Therefore, for example, in the liquid crystal display in which this shift register is applied as the gate driver 152, the noise of the output signal fed to the pixel TFT 161 of the liquid crystal display can be reduced, and data which should not be essentially written in the pixel capacitance 162 can be prevented from being written. This improves the grade of an image displayed on the liquid crystal display.

As the value (W/L) of each of the TFTs 21 to 26 increases, the shift register can normally operates even under the high-temperature conditions. However, an area of the shift register becomes large. Further, since the display area 151 and the gate driver 152 are formed on the same substrate 19 in the above-described liquid crystal display, an area of the liquid crystal display device relatively becomes small. In particular, when the TFTs 21 to 26 are amorphous silicon TFTs, since one transistor size is large as compared with that in case of polysilicon TFTs or monocrystal silicon transistors, its influence necessarily becomes great. Therefore, the largeness of the value (W/L) of each of the TFTs 21 to 26 is restricted. The preferable balance of the operation stability of the shift register and the value (W/L) of each of the TFTs 21 to 26 will be considered in the later-described embodiment.

In cases where the value (W/L) of the TFT 21 is fixed at 120 and the value (W/L) of the TFT 25 is fixed at 320 as shown in Table 1, shift registers (A) to (J) having different values (W/L) of the TFTs 22 to 24 and 26 were created as the shift register of the gate driver 152 described in the above embodiment. In this connection, W/L of the TFT 21 is determined as 120 because the shift register with the value (W/L) of the TFT 21 being 60 as a comparative example has a low drive capability and its lower limit of the temperature at which the malfunction occurs is lower than that of the shift register with the value (W/L) of the TFT 21 being 120. Here, the values (W/L) of the TFTs 21 and 25 are fixed for the reason above-mentioned. Incidentally, it is desirable that the shift register normally operates in the environment with a temperature which is not more than 65° C.

TABLE 1

| SAMPLE | DIMENSION RATIO OF CHANNEL WIDTH/CHANNEL LENGTH (W/L) | | | | | |
|---|---|---|---|---|---|---|
| | TFT21 | TFT22 | TFT23 | TFT24 | TFT25 | TFT26 |
| A | 120 | 24 | 32 | 120 | 320 | 320 |
| B | 120 | 36 | 48 | 120 | 320 | 480 |
| C | 120 | 48 | 64 | 120 | 320 | 640 |
| D | 120 | 12 | 16 | 120 | 320 | 320 |
| E | 120 | 48 | 64 | 120 | 320 | 320 |
| F | 120 | 24 | 24 | 120 | 320 | 320 |
| G | 120 | 24 | 40 | 120 | 320 | 320 |
| H | 120 | 24 | 48 | 120 | 320 | 320 |
| I | 120 | 24 | 32 | 80 | 320 | 320 |
| J | 120 | 24 | 32 | 120 | 320 | 320 |

Here, the channel lengths L of all the TFTs 21 to 26 in the table are set to 9 μm. A considerable difference from the shift register having the channel lengths L being all 9 μm was not obtained even though the channel lengths L of the TFTs 25 and 26 were set to 12 μm and the channel lengths L of the remaining TFTs 21 to 24 were set to 9 μm.

Ten types of shift registers indicated as (A) to (J) in Table 1 were driven under the various temperature conditions, and their temperature characteristics were examined. Table 2 shows its result. In Table 2, "G" represents that the shift register normally operated for a long period of time under that temperature condition, and "NG" represents that the malfunction occurred when the shift register was driven for a long period of time under that temperature condition or the shift register did not operate.

TABLE 2

| SAMPLE | OUTER TEMPERATURE (° C.) | | | | | | | | | | |
|---|---|---|---|---|---|---|---|---|---|---|---|
| | 25 | 35 | 45 | 55 | 60 | 65 | 70 | 75 | 80 | 85 | 90 |
| A | G | G | G | G | G | G | G | G | NG | NG | NG |
| B | G | G | G | G | G | G | G | G | G | G | G |
| C | G | G | G | G | G | G | G | G | G | G | G |
| D | G | G | G | G | G | G | NG | NG | NG | NG | NG |
| E | G | G | G | G | G | G | G | G | G | G | G |
| F | G | G | G | G | G | G | NG | NG | NG | NG | NG |
| G | G | G | G | G | G | G | G | G | NG | NG | NG |
| H | G | G | G | G | G | G | G | G | G | G | G |
| I | G | G | G | G | G | G | NG | NG | NG | NG | NG |
| J | G | G | G | G | G | G | G | G | G | G | G |

From this result, the following respects can be derived.

As apparent from (A), (B) and (C) in Tables 1 and 2, the value (W/L) of the TFT 26 can be set equal to or larger than the value (W/L) of the TFT 25 in order to normally operate the shift register up to the temperature 65° C. When the value (W/L) of the TFT 26 is set larger than the value (W/L) of the TFT 25, the shift register can normally operate up to 90° C. depending on the values (W/L) of the TFTs 23 and 22, which is more preferable.

As apparent from (A), (D) and (E) in Tables 1 and 2, the value (W/L) of the TFT 23 can be set larger than 1/20 of the value (W/L) of the TFT 25 in order to normally operate the shift register up to 65° C. When the value (W/L) of the TFT 23 is set to approximately 1/5 of the value (W/L) of the TFT 25, the shift register can normally operate up to 90° C., which is more preferable.

As apparent from (A), (F), (G) and (H) in Tables 1 and 2, setting the value (W/L) of the TFT 23 to be larger than the value (W/L) of the TFT 22 can suffice the normal operation of the shift register up to 65° C. When the value (W/L) of the TFT 23 is increased to be approximately twofold of the value (W/L) of the TFT 22, the shift register can normally operate up to 90° C., which is more preferable.

As apparent from (A), (I) and (J) in Tables 1 and 2, setting the value (W/L) of the TFT 24 to be larger than 2/3 of the value (W/L) of the TFT 21 can suffice the normal operation of the shift register up to 65° C. When the value (W/L) of the TFT 24 is increased to approximately 4/3 of that of the TFT 21, the shift register can preferably normally operate up to 90° C.

Further, when the value (W/L) of the TFT 21 is set smaller than the value (W/L) of each of the TFTs 25 and 26 and larger than the value (W/L) of each of the TFTs 23 and 22 and the value (W/L) of the TFT 24 is set smaller than the value (W/L) of each of the TFTs 25 and 26 and larger than the value (W/L) of each of the TFTs 23 and 22, the normal operation can to be easily obtained, and the comprehensive duration of life is long in the environment at the temperature of 80° C.

The present invention is not restricted to the above-described embodiment, and various modifications and applications are enabled. A modification of the above-described embodiment which can be applied to the present invention will now be described hereinafter.

Figure 9:
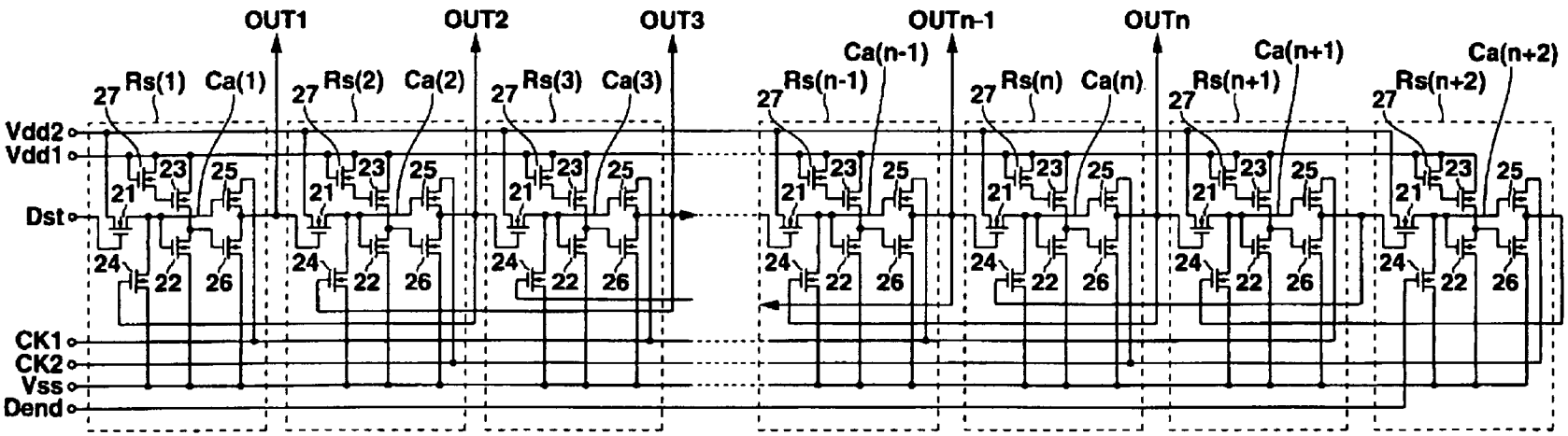
FIG. 9 is a view showing the circuit structure of another shift register.

Although the respective stages RS(1), RS(2), . . . of the shift register are constituted by the six TFTs 21 to 26 in the above-described embodiment, the similar advantages was obtained with seven shift registers having the structure of respective stages RS(1), RS(2), . . . , such as shown in FIG. 9. The value (W/L) of the TFT 27 added herein is 2, and the voltage Vdd1 is determined to be equipotential with the power supply voltage Vdd of the above-described embodiment. Further, the configuration is similar to that of the shift register shown in FIG. 4 except that the voltage Vdd2 is lower than the voltage Vdd1. It is to be noted that the TFT 23 illustrated in FIG. 9 can be replaced with a resistance device other than the transistor.

In the above-described embodiment, although the shift register is constituted by combinations of the amorphous silicon TFTs 21 to 26 which are the field effect transistors, they may be substituted by polysilicon transistors other than the amorphous silicon TFTs. Moreover, although the TFTs 21 to 26 constituting the shift register are of the n channel type in the above example, all the TFTs may be of the p channel type. At this time, the high and low levels of each signal may be inverted from those in the case where the TFTs which are of the n channel type are used.

In the above-described embodiment, although the gate driver 152 of the liquid crystal display is exemplified as an application example of the shift register, the shift register can be also applied to a driver of any other display unit, e.g., an organic EL display unit or a plasma display panel. In addition, the shift register can be applied as a driver for driving a photosensor such as a fingerprint sensor in which a plurality of pixels are vertically and horizontally arranged in a predetermined order, as well as a display unit. In this case, the grade of a picked-up image can be improved. Additionally, the shift register is not only used as such a driver but it can be also applied to the case where serial data is converted into parallel data in a data processor.

Figure 10:
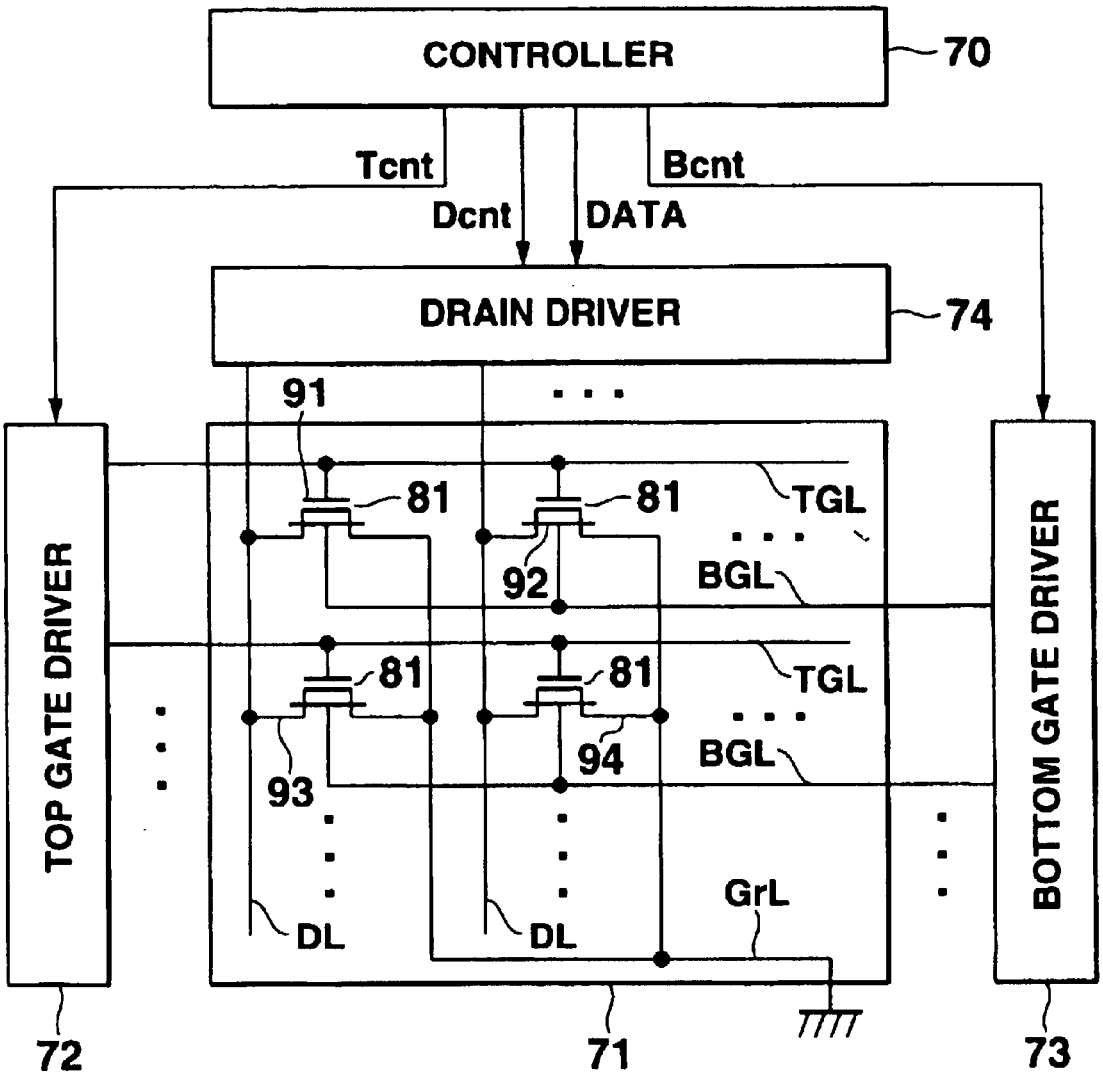
FIG. 10 is a block diagram showing the circuit structure of a photosensor constructed by a double gate transistor.

FIG. 10 is a block diagram showing the structure of an imaging apparatus having an imaging device, in which a double gate transistor is applied as a photosensor. This imaging apparatus is used as, for example, a fingerprint sensor and constituted by a controller 70, an imaging area 71, a tope gate driver 72, a bottom gate driver 73, and a drain driver 74.

The imaging area 71 is constituted by a plurality of double gate transistors 81 arranged in the matrix form. A top gate electrode 91 of the double gate transistor 81 is connected to a top gate line TFL; a bottom gate electrode 92, a bottom gate line BGL; a drain electrode 93, a drain line DL; and a source electrode 94, an earthed ground line GrL, respectively. A back light for emitting a light ray having a wavelength range for exciting the semiconductor layer of the double gate transistor 81 is mounted under the imaging area 71.

When the voltage applied to the top gate electrode 91 is +25 (V) and the voltage applied to the bottom gate electrode 92 is 0 (V), the positive hole accumulated in the semiconductor layer and the gate insulating film consisting of silicon nitride arranged between the top gate electrode 91 and the semiconductor layer is emitted, and the double gate transistor 81 constituting the imaging area 71 is reset. The double gate transistor 81 enters the photosensing state in which the voltage between the source electrode 94 and the drain electrode 93 is 0 (V), the voltage applied to the top gate electrode 91 is −15 (V), the voltage applied to the bottom gate electrode 92 is 0 (V) and the positive hole in a pair of the positive hole and the electron generated by incoming radiation of the light to the semiconductor layer is accumulated in the semiconductor layer and the gate insulating film. A quantity of the positive hole accumulated in this period depends on a quantity of light.

In this photosensing state, although the back light emits the light toward the double gate transistor 81, the bottom gate electrode 92 positioned below the semiconductor layer of the double gate transistor 81 prevents transmission of the light as it stands, the sufficient carrier is not generated in the semiconductor layer. At this time, when a finger is put on the insulating film above the double gate transistor 81, the light reflected by the insulating film and the like is less likely to be incident upon the semiconductor layer of the double gate transistor 81 directly below recessions of the finger (corresponding to grooves defining a fingerprint shape).

As described above, when a quantity of the incident light is small, a sufficient quantity of the positive hole is not accumulated in the semiconductor layer, the voltage applied to the top gate electrode 91 is −15 (V) and a voltage applied to the bottom gate electrode 92 become +10 (V), a depletion layer spreads in the semiconductor layer, and the n channel is pinched off, resulting in the high resistance of the semiconductor layer. On the other hand, the light reflected by the insulating film and the like is incident upon the semiconductor layer of the double gate transistor 81 directly below convex portions (protrusions between grooves of a finger) of the finger in the photosensing state, and a sufficient quantity of positive holes is accumulated in the semiconductor layer. In this state, when such a voltage is applied, the accumulated positive hole is attracted to the top gate electrode 91 and held. As a result, the n channel is formed on the bottom gate electrode 92 side of the semiconductor layer, resulting in the low resistance of the semiconductor layer. A difference in resistance value of the semiconductor layer in the reading state appears as a change in potential of the drain line DL.

The top gate drive 72 is connected to the top gate line TGL in the imaging area 71 and selectively outputs a signal of +25 (V) or −15 (V) to each top gate line TGL in accordance with the control signal group Tcnt from the controller 70. The top gate driver 72 has the structure which is substantially the same as that of the shift register constituting the gate driver 152, the top gate driver 72 and the bottom gate driver 73 shown in FIG. 4 or 10 except a difference in level of the output signal, a difference in level of the input signal according to the output signal and a difference in phase of output signal and the input signal.

The bottom gate driver 73 is connected to the bottom gate line BGL in the imaging area 71 and outputs a signal of +10 (V) or 0 (V) to each bottom gate line BGL in accordance with the control signal group Bcnt from the controller 70. The bottom gate driver 73 has the structure which is substantially the same as that of the shift register constituting the gate driver 152, the top gate driver 72 and the bottom gate driver 73 shown in FIG. 4 or 10 except a difference in level of the output signal, a difference in level of the input signal according to the output signal, and a difference in phase of the output signal and the input signal.

The drain driver 74 is connected to the drain line DL in the imaging area 71, and outputs a constant voltage (+10 (V)) to all the drain lines DL in a later-described predetermined period in accordance with the control signal group Dcnt from the controller 70 in order to pre-charge the electric charge. The drain driver 74 reads the potential of each drain line DL which varies depending on whether a channel is formed in accordance with incidence or non-incidence of the light upon the semiconductor layer of the double gate transistor 81 in a predetermined period after pre-charge, and supplies the obtained result to the controller 70 as image data DATA.

The controller 70 controls the top gate driver 72 and the bottom gate driver 73 in accordance with the control signal groups Tcnt and Bcnt, respectively, and outputs a signal on a predetermined level at a predetermined timing from the both drivers 72 and 73. As a result, each line in the imaging area 71 sequentially enters the reset state, the photosensing state and reading state. Further, the controller 70 causes the drain driver 74 to read a change in potential of the drain line DL by the control signal group Dcnt and sequentially fetches these changes as the image data DATA.

Figure 11:
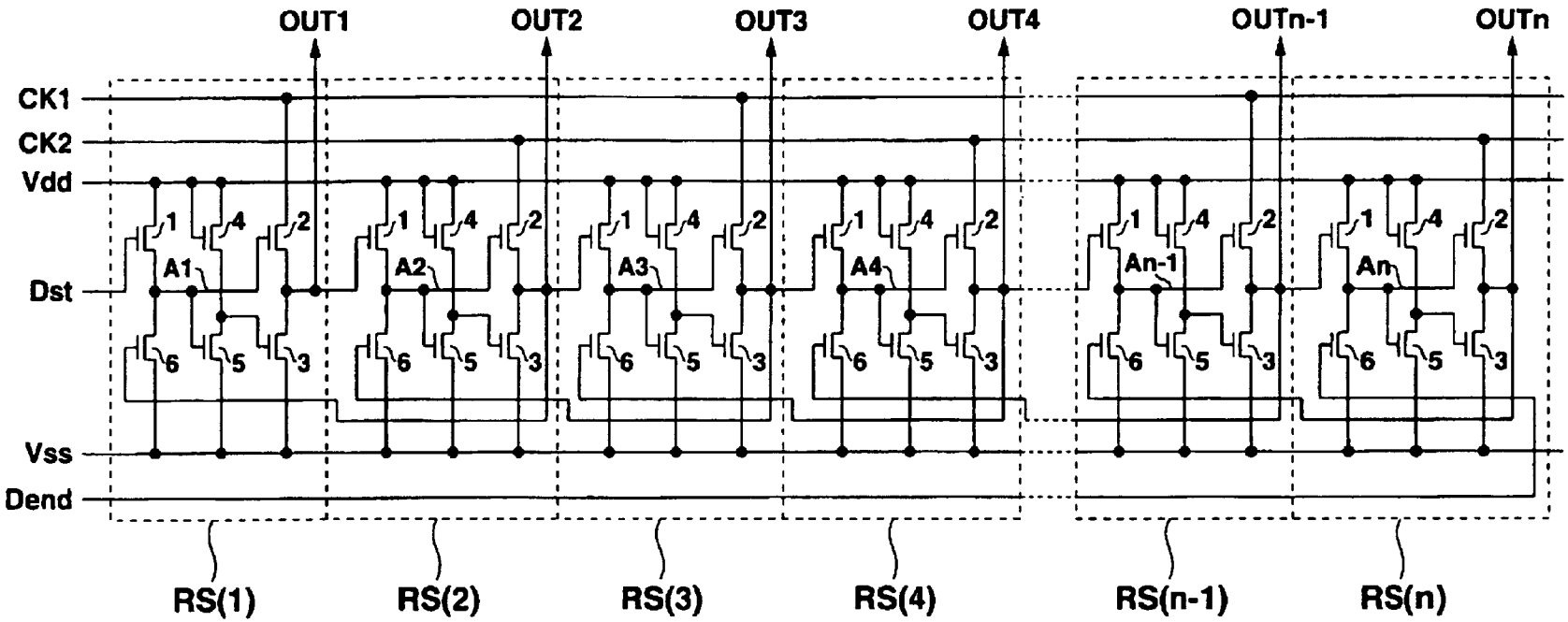
FIG. 11 is a view showing the circuit structure of a shift register used as a gate driver depicted in FIG. 3.

FIG. 11 is a view showing the circuit structure of the shift register applied as a gate driver 152, a top gate driver 72, and a bottom gate driver 73 shown in FIGS. 3 and 10. As shown in the figure, this shift register is constituted by n stages RS(1) to RS(n) (n: an even number) whose number is equal to that of the gate lines GL in the display area 151.

When applied as the gate driver 152, to this shift register are supplied the clock signals CK1 and CK2, the power supply voltage Vdd, the reference voltage Vss (<Vdd), the start signal Dst, and the reset signal Dend as the control signal group Gcnt from the controller 150. Among these voltages and signals, the power supply voltage Vdd and the reference voltage Vss are supplied to all the stages RS(1) to RS(n); the clock signal CK1, the odd-numbered stages RS(1), RS(3), . . . , RS(n−1); the clock signal CK2, the even-numbered stages RS(2), RS(4), . . . , RS(n); the start signal Dst, only the first stage RS(1); and the reset signal Dend, only the n-th stage RS(n).

The structures of the respective stages are substantially the same. Thus, giving description as to the first stage RS(1) as an example, the stage RS(1) has six TFTs 1 to 6 consisting of a-Si semiconductor layers similar to the TFT 161. The TFTs 1 to 6 are field effect transistors which area of the same channel type (here, an n-channel type).

The start signal Dst is supplied to the gate of the TFT 1. The power source voltage Vdd is supplied to the drain of the TFT 1. The source of the TFT 1 is connected to the gate of the TFT 2, the gate of the TFT 5, and the drain of the TFT 6. The wiring surrounded by and connected with the source of the TFT 1, the gate of the TFT 2, the gate of the TFT 5 and the drain of the TFT 6 is referred to as a node A1 (wirings will be referred to as A2 to An in the second and the subsequent stages). When the start signal Dst raises to the high level and the TFT 1 is turned on, the voltage which is equipotential with the power supply voltage Vdd is outputted from the source, thereby applying the voltage to the node A1.

The clock signal CK1 is supplied to the drain of the TFT 2. When the TFT 2 is in the ON state, the level of the clock signal CK1 is outputted as the output signal OUT1 from the source to the first gate line GL substantially without any change.

The power supply voltage Vdd is supplied to the gate and the drain of the TFT 4, and the TFT 4 is constantly in the ON state. The TFT 4 functions as a load when supplying the power supply voltage Vdd, and supplies the power supply voltage Vdd to the drain of the TFT 5 substantially without any change. The TFT 4 can be replaced with the resistance device other than the TFT. The reference voltage Vss is supplied to the source of the TFT 5. When the TFT 5 is turned on, the electric charge accumulated between the source of the TFT 4 and the drain of the TFT 5 is discharged and the gate voltage of the TFT 3 is set as the reference voltage Vss.

The gate of the TFT 3 is connected to the source of the TFT 4 and the drain of the TFT 5. When the TFT 5 is in the OFF state, the TFT 3 is turned on by the power supply voltage vdd fed through the TFT 4. When the TFT 5 is in the ON state, since the electric charge accumulated in the wiring between source of the TFT 4 and the TFT 5 is discharged, and the gate voltage of the TFT 3 falls to the low level, thereby turning off the TFT 3.

The output signal OUT2 of the second stage RS(2) which is the subsequent stage is supplied to the gate of the TFT 6. The drain of the TFT 6 is connected to the node A1, and the reference voltage Vss is supplied to the source. When the output signal OUT2 rises to the high level, the TFT 6 is turned on to discharge the electric charge accumulated in the node A1.

The structure of the odd-numbered stages RS(3), RS(5), . . . , RS(n−1) other than the first stage is the same as that of the first stage RS(1) except that the output signals OUT2, OUT4, . . . , OUTn−2 of the preceding stages RS(2), RS(4), . . . , RS(n−2) are supplied to the gate of the TFT 1.

The structure of the even-numbered stages RS(2), RS(4), . . . , RS(n−2) other than the n-th stage is the same as that of the first stage RS(1) except that the output signals OUT1, OUT3, . . . , OUTn−3 of the preceding stages RS(1), RS(3), . . . , RS(n−3) are supplied to the gate of the TFT 1. The structure of the n-th stage RS(n) is the same as that of other even-numbered stages RS(2), RS(4), . . . , RS(n−2) except that the reset signal Dend is supplied to the gate of the TFT 6.

Moreover, the shift registers constituting the gate driver 152, the top gate driver 72 and the bottom gate driver 73 are configured by combinations of the TFTs 1 to 6, and the TFTs 1 to 6 have substantially the same structure as that of the TFT 161 included in the display area 151. Therefore, the gate driver 152, the top gate driver 72 and the bottom gate driver 73 can be collectively formed on the substrate on the TFT 161 side of the display area 151 by the same process.

The operation of the digital still camera according to this embodiment will now be described. Before explaining the overall operation, the operation of the shift register constituting the above-described gate driver 152 will be first explained with reference to a timing chart of FIG. 12. When the shift register is used as the gate driver 152, respective control signals are all supplied from the controller 150 as the control signal group Gcnt.

In this timing chart, the high level of each of the clock signals CK1 and CK2, the start signal Dst and the reset signal Dend is equal to the power supply voltage Vdd. On the other hand, the low level of these signals is equal to the reference voltage Vss. One scanning period Q is one horizontal period in the display portion 210.

In addition, before starting the shift operation in accordance with this timing chart (before T0), all of the output signals OUT1 to OUTn are on the low level. Additionally, in all of the stages RS(1) to RS(n), no electric charge is accumulated in the nodes A1 to An, and the TFTs 2 and 5 are in the ON state while the TFT 3 is in the OFF state.

In a period from the timing T0 to another timing Ti, when the start signal Dst rises to the high level, the TFT 1 of the first stage RS(1) is turned on, and the power supply voltage Vdd is outputted from the drain of the TFT 1 to the source. As a result, the electric charge is accumulated in the node A1 of the first stage RS(1), and its potential rises to the high level, thereby turning on the TFTs 2 and 5. When the TFT 5 is turned on, the electric charge accumulated between the source of the TFT 4 and the drain of the TFT 5 is discharged, thereby turning off the TFT 3. In this period, the TFT 2 of the first stage RS(1) is turned on, but the clock signal CK1 remains on the low level. Thus, the level of the output signal OUT1 remains as the low level.

Subsequently, in the timing T1, when the clock signal CK1 changes to the high level, this signal is outputted from the drain of the TFT 2 of the first stage RS(1) to the source, and the level of the output signal OUT1 varies to the high level. At this time, since the potential of the node A1 increases to approximately twofold of the power supply voltage Vdd by the so-called bootstrap effect and reaches the saturation gate voltage of the TFT 2, the drain electric current of the TFT 2 becomes a saturation electric current, and the level of the output signal OUT1 rapidly becomes substantially equipotential with the high level of the clock signal CK1. That is, the high level of the output signal OUT1 becomes nearly the power supply voltage Vdd. Thereafter, in a period from the timing T1 to the timing T2, when the clock signal CK1 falls, the output signal OUT1 shifts to the low level.

Further, in a period from the timing T1 to the timing T2, the TFT 1 of the second stage RS(2) is turned on by the output signal OUT1 of the first stage RS(1) which has risen to the high level. Consequently, outputting the power supply voltage Vdd from the source of the TFT 1 of the second stage RS(2) causes the potential of the node A2 to change to the high level, and the TFTs 2 and 5 of the second stage RS(2) are turned on, thereby turning off the TFT 3.

Subsequently, in the timing T2, when the clock signal CK2 changes to the high level, this signal is outputted from the drain of the TFT 2 of the second stage RS(2) to the source, and the level of the output signal OUT2 varies to the high level. Consequently, the TFT 6 of the first stage RS(1) is now turned on, and the electric charge accumulated in the node A1 is discharged through the TFT 6 to obtain the reference voltage Vss. Therefore, the output signal OUT1 maintains the low level state, and the TFTs 2 and 5 of the first stage RS(1) are thereby turned off, and the TFT of the same is turned on. Accordingly, the potential of the output signal OUT1 surely becomes the reference voltage Vss, and this state continues at least until the timing Tn+1. Thereafter, when the clock signal CK2 falls in a period from the timing 2 to the timing T3, the output signal OUT2 falls to the low level.

Furthermore, in the period from the timing T2 to the timing T3, the TFT 1 of the third stage RS(3) is turned on by the output signal OUT2 of the second stage RS(2) which has risen to the high level. As a result, outputting the power supply voltage vdd from the source of the TFT 1 of the third stage RS(3) causes the potential of the node A3 to change to the high level, and the TFTs 2 and 5 of the third stage RS(3) are turned on, thereby turning off the TFT 3.

Subsequently, in the timing T3, when the clock signal CK1 changes to the high level, this signal is outputted from the drain of the TFT 2 of the third stage RS(3) to the source, and the level of the output signal OUT3 varies to the high level. Consequently, the TFT 6 of the second stage RS(2) is now turned on, and the electric charge accumulated in the node A2 is discharged through the TFT 6 without using the TFT 1 of the second stage RS(2) and the TFT 3 of the first stage RS(1) to obtain the reference voltage Vss. Therefore, the low level state of the output signal OUT1 is maintained, and the TFTs 2 and 5 of the second stage RS(2) are thereby turned off, meanwhile the TFT 3 is turned on. That is, since the gate voltage of the TFT 2 falls to the low level and the TFT 3 is turned on in the second stage RS(2), the potential of the output signal OUT2 assuredly becomes the reference voltage Vss, and this state continues at least until the timing Tn+1. Thereafter, in a period from the timing T2 to the timing T3, when the clock signal CK1 falls, the level of the output signal OUT3 becomes the low level.

In addition, in a period from the timing T3 to another timing T4, the TFT 1 of the fourth stage RS(4) is turned on by the output signal OUT3 of the third stage RS(3) which has risen to the high level. As a result, outputting the power supply voltage vdd from the source of the TFT 1 of the fourth stage RS(4) causes the potential of the node A4 to rise to the high level, and the TFTs 2 and 5 of the fourth stage RS(4) are turned on, meanwhile the TFT 3 is turned off.

Thereafter, when the fourth and the subsequent stages RS(4), RS(5), . . . perform the operation similar to the above in accordance with each one scanning period Q, the output signals OUT4, OUT5, vary to the high level for each predetermined period in the one scanning period Q. Furthermore, in a period from the timing Tn−1 to the timing Tn, the TFT 1 of the n-th stage RS(n) is turned on by the output signal OUTn−1 of the n−1-th stage RS(n−1) which has risen to the high level. As a result, outputting the power supply voltage vdd from the source of the TFT 1 of the n-th stage RS(n) causes the potential of the node An to change to the high level, and the TFTs 2 and 5 of the n-th stage RS(n) are turned on meanwhile the TFT 3 is turned off.

Subsequently, in the timing Tn, when the clock signal CK2 rises to the high level, this signal is outputted from the drain of the TFT 2 of the n-th stage RS(n) to the source, and the level of the output signal OUTn changes to the high level. Thereafter, when the clock signal CK2 falls until the timing Tn+1, the output signal OUTn changes to the low level.

Then, in the timing Tn+1, the level of the reset signal Dend now changes to the high level. As a result, when the TFT 1 of the n-th stage RS(n) is turned on, the electric charge accumulated n the node A2 is discharged so that the TFTs 2 and 5 of the second stage RS(2) are turned off and the TFT 3 is turned on. Further, no electric charge is accumulated in the nodes A1 to An in all of the stages RS(1) to RS(n) until the start signal Dst on the high level is subsequently supplied, and the TFTs 2 and 5 are in the ON state while the TFT 3 remains in the OFF state.

Figure 12:
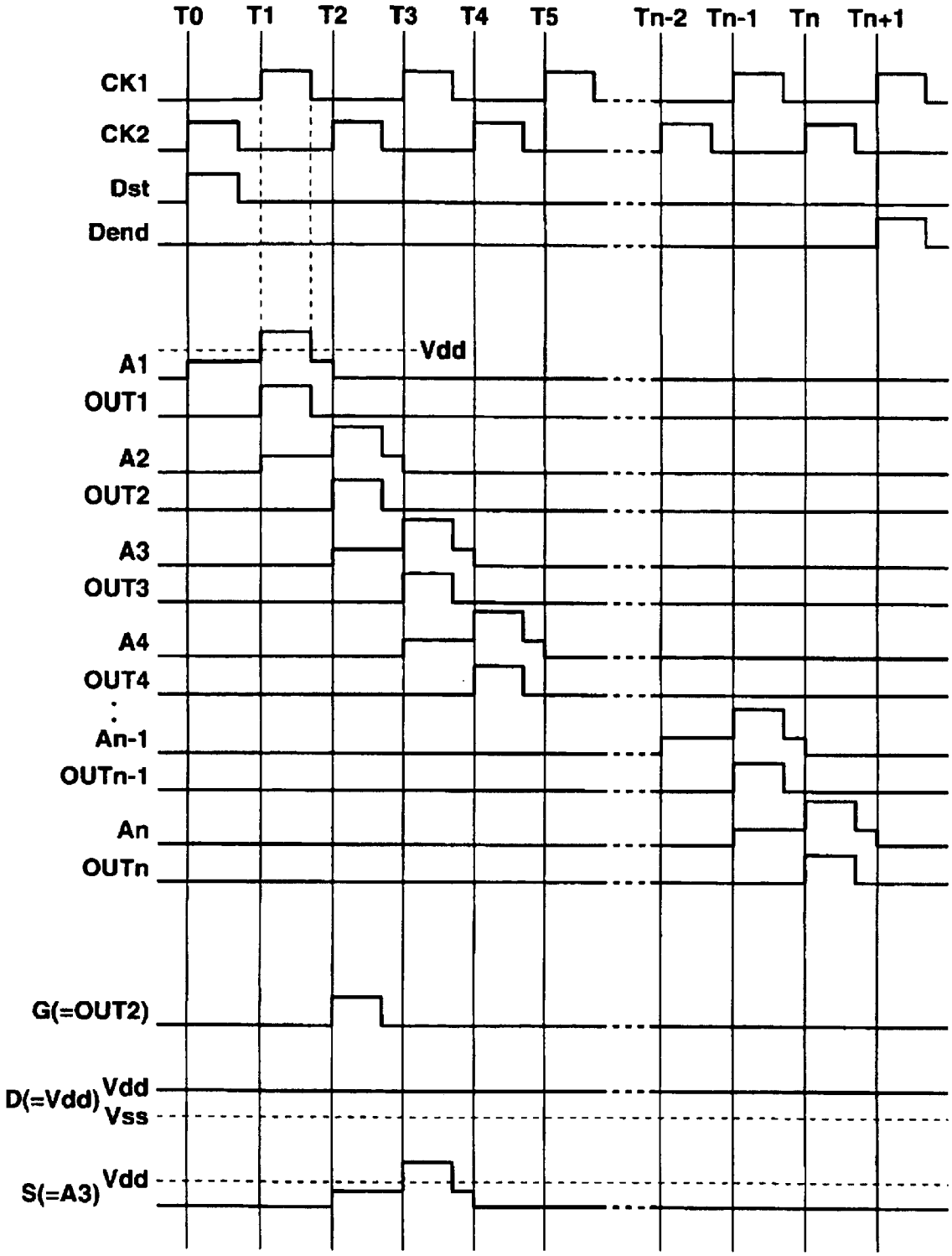
FIG. 12 is a timing chart showing the operation of the shift register illustrated in FIG. 11.

Description will now be given as to how the potentials of the gate, the drain and the source of one TFT 1 change while the output signal shifts from the first stage RS(1) to the n-th stage RS(n) taking the TFT 1 of the third stage RS(3) for instance. The lower three sections in FIG. 12 show changes in potential level of the gate, the drain and the source of the TFT 1 of the third stage RS(3).

As shown in the figure, the gate voltage of the TFT 1 rises to the high level (substantially Vdd) only when the output signal OUT2 of the second stage RS(2) is on the high level in a period from the timing T2 to the timing T3. Since the power supply voltage Vdd is constantly supplied to the drain of the TFT 1, the drain voltage is constantly the power supply voltage vdd. When the electric charge is accumulated in the node A3 in the timing T2, the source voltage of the TFT 1 changes to a voltage level which is lower than vdd by its threshold voltage. When the clock signal CK1 is on the high level in a period from the timing T3 to the timing T4, the source voltage reaches the level which is approximately twofold of the power supply voltage Vdd by the above-described bootstrap effect. On and after change of the output voltage of the fourth stage RS(4) to the high level in the timing T4, the source voltage again falls to the low level.

As described above, the gate voltage of the TFT 1 of the k-th stage RS(k) in one scanning of the shift register is constantly on the low level (reference voltage Vss) except when at least the start signal Dst or the output signal OUTk−1 of the preceding stage once rises to the high level. Therefore, the period in which the gate voltage of each TFT 1 is positive relatively with respect to any lower voltage of the drain voltage and the source voltage is only a period in which the clock signal CK1 or CK2 is once on the high level if the clock signals CK1 and CK2, the start signal Dst and the reset signal Dend are equal to each other, the high level voltage is equal to the power supply voltage Vdd and the low level voltage is equal to the reference voltage Vss.

Further, when the high level voltage of the clock signals CK1 and CK2, the start signal Dst and the reset signal Dend is a voltage attenuated by a parasitic capacitance between the gate and the drain of the TFT 1, for example, it is lower than the potential of the node A3 in the period from the timing T3 to the timing T4, the gate voltage of the TFT 1 is constantly lower than the source voltage and the drain voltage of the TFT. It is, therefore, possible to suppress shift of the gate threshold voltage of the TFT 1 of the k-th stage RS(k) to be positive.

As described above, in the shift register constituting the gate driver 152 in this embodiment, the period in which the gate voltage of the TFT 1 of each stage is positive relatively with respect to the drain and source voltages is short. In connection with the characteristic of the TFT, when the gate voltage becomes positive relatively with respect to the drain and source voltages, the threshold value characteristic is apt to shift to be positive. However, even if the gate voltage becomes negative relatively with respect to the drain and source voltages, the threshold characteristic hardly shift to be negative.

In other words, since the characteristic of the TFT 1 rarely changes even if the shift register of this embodiment is used for a long time, there hardly occurs the case that the TFT 1 is not turned on with the timing at which the TFT 1 should be essentially turned on and the electric charge can not be accumulated in the nodes A1 to An. Therefore, the shift register can stably operate for a long period of time, thereby improving the durability.

Further, a failure of the display portion 210 in which the shift register is applied as the gate driver 152 is of course eliminated, which improves the durability of the digital still camera including this portion.

In this embodiment, the gate driver 152 applied to the liquid crystal display constituting the display portion 210 has a structure shown in FIG. 11, and is configured by the shift register which operates in accordance with the timing chart shown in FIG. 12 by the control signal outputted from the controller 150. However, the shift register applicable as the above-described gate driver 152 is not restricted thereto.

Figure 13:
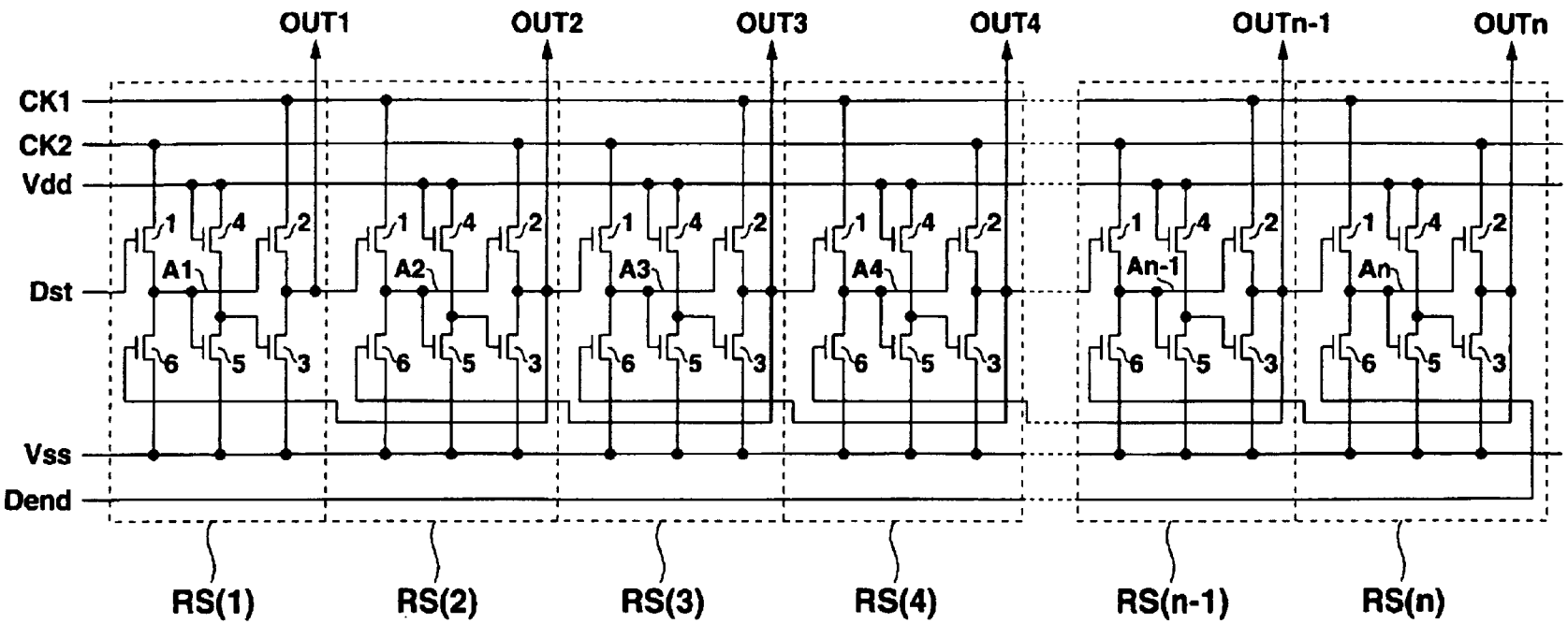
FIG. 13 is a view showing another circuit structure of the shift register used as the gate driver depicted in FIG. 3.

FIG. 13 is a view showing the circuit structure of another shift register applicable as the gate driver 152, the top gate driver 72 and the bottom gate driver 73. Giving description as to a difference from the shift register shown in FIG. 11, the clock signal CK1 is supplied to the drain of the TFT 1 in the odd-numbered stages RS(1), RS(3), . . . , RS(n−1), and the clock signal CK2 is supplied to the same in the even-numbered stages RS(2), RS(4), . . . , RS(n), respectively. The high level voltage of the clock signals CK1 and CK2, the start signal Dst and the reset signal Dend is equal to the power supply voltage Vdd, and the low level voltage of the same is equal to the reference voltage Vss.

A difference in operation of the shift register shown in FIG. 13 from the shift register illustrated in FIG. 11 will now be described with reference to the timing chart of FIG. 14. In a period from the timing T0 to another timing T1, when the start signal Dst rises to the high level and the TFT1 of the first stage RS(1) is turned on, the clock signal CK2 supplied to the drain of the TFT 1 rises to the high level, thereby accumulating the electric charge in the node A1.

In a period from the timing T1 to the next timing T2, when the output signal OUT1 of the first stage RS(1) rises to the high level and the TFT 1 of the second stage RS(2) is turned on, the clock signal CK1 supplied to the drain of the TFT 1 changes to the high level, thus accumulating the electric charge in the node A2. Thereafter, in a period from the timing Tn−1 to the timing Tn, when the output signal OUTn−1 of the n−1-th stage RS(n−1) rises to the high level and the TFT 1 of the n-th stage RS(n) is turned on, the clock signal CK2 fed to the drain of the TFT 1 similarly changes to the high level and the electric charge is accumulated in the node An.

Figure 14:
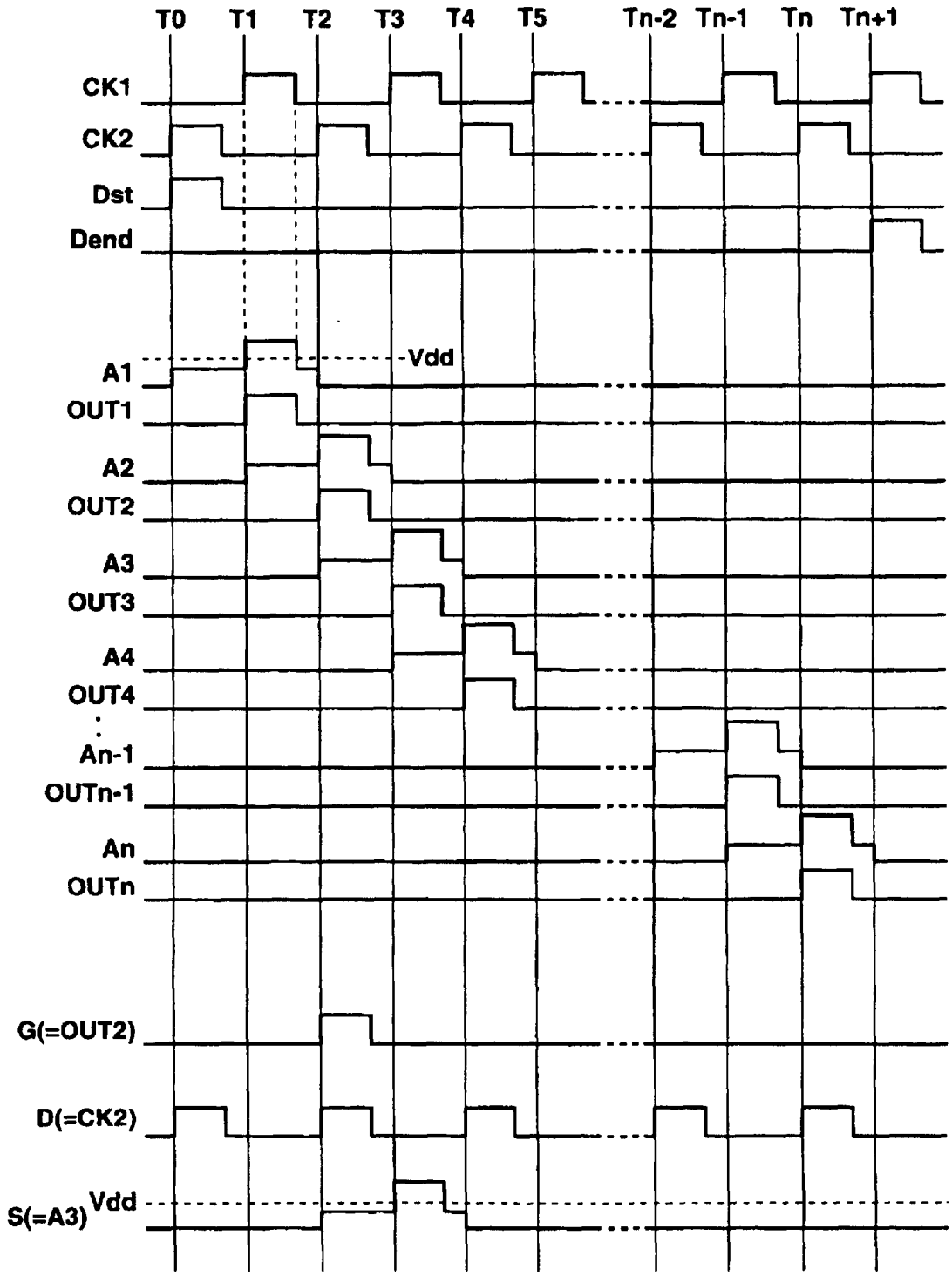
FIG. 14 is a timing chart showing the operation of the shift register illustrated in FIG. 13.

As indicated by the lower three sections in FIG. 14, explaining a change in potential level of the gate, the drain and the source of the TFT 1 in this shift register by taking the third stage RS(3) for instance, only when the output signal OUT2 of the second stage RS(2) is on the high level in the period from the timing T2 to the timing T3, the potential is on the high level (substantially Vdd). The drain voltage is on the high level (substantially vdd) only when the clock signal CK2 is on the high level. When the electric charge is accumulated in the node A3 in the timing T2, the source voltage changes to a voltage level which is lower than Vdd by its threshold voltage. Further, while the clock signal CK1 is on the high level in a period from the timing T3 to the timing T4, the source voltage changes to a level which is approximately twofold of the power supply voltage Vdd.

Here, if the period in which the drain voltage of the TFT 1 is higher than the gate voltage is sufficiently long, the gate threshold voltage is shifted to be negative, and the potential of the node A is increased by the leak electric current in the OFF state, which may possibly provoke a malfunction. However, in this shift register, the period in which the drain voltage of the TFT 1 is on the high level is shorter than that of the shift register illustrated in FIG. 11. That is, the period in which a difference in potential between the gate and the drain and between the source and the drain of the TFT 1 is short. Therefore, the voltage stress applied to the TFT 1 is smaller than that in the shift register depicted in FIG. 11, and the leak electric current is also small. Moreover, the device characteristic of the TFT 1 is hardly deteriorated, and hence a failure is hardly produced even if the shift register is used for a long time.

Figure 15:
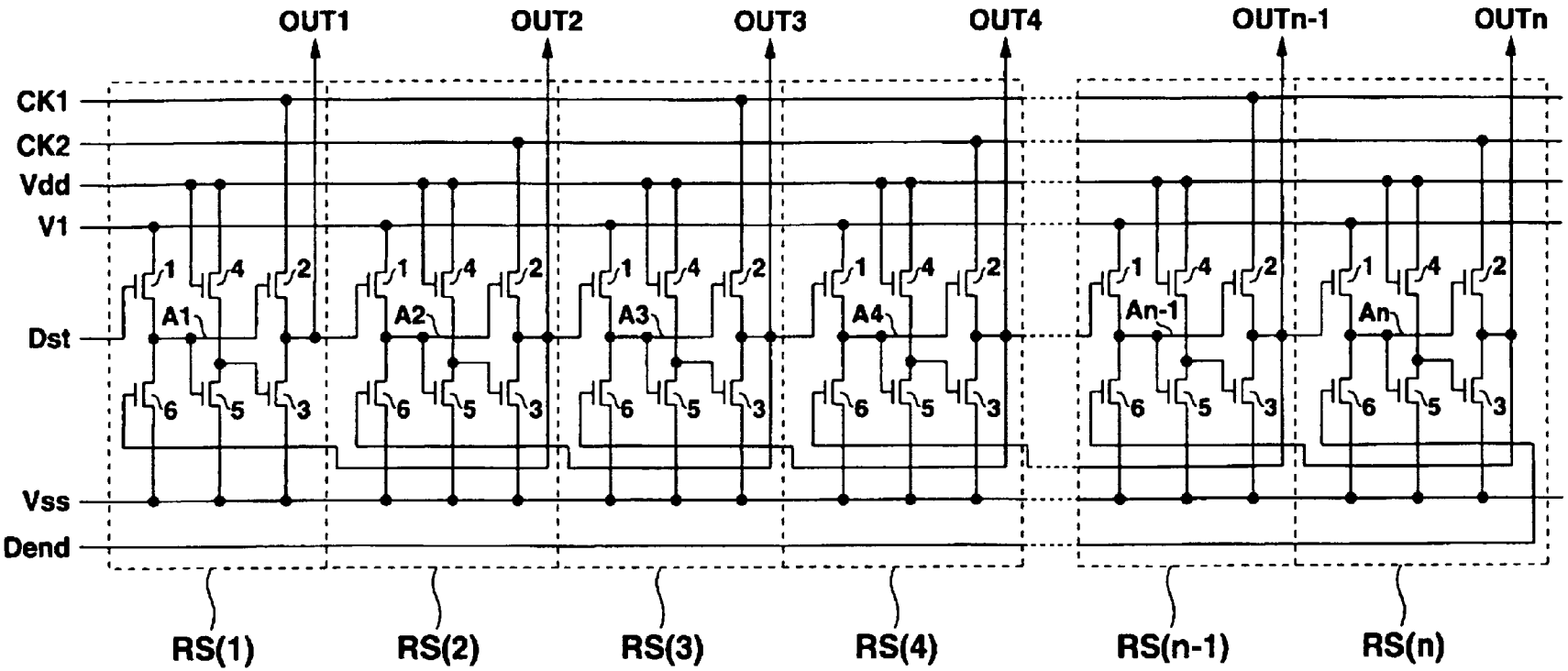
FIG. 15 is a view showing still another circuit structure of the shift register used as the gate driver depicted in FIG. 3.

FIG. 15 is a view showing the circuit structure of still another shift register applicable as the gate driver 152, the top gate driver 72 and the bottom gate driver 73. Giving description as to a difference from the shift register shown in FIG. 11, a voltage signal V1 is supplied. The high level of the voltage signal V1 is lower the level of the power supply voltage Vdd, but it is a level capable of accumulating in the nodes A1 to An the electric charge which is sufficient for turning on the TFTs 2 and 5. On the other hand, the low level of the voltage signal V1 is the same as the reference voltage Vss. The high level voltage of the clock signals CK1 and CK2, the start signal Dst and the reset signal Dend is equal to the power supply voltage Vdd, and the low level voltage of the same is equal to the reference voltage Vss.

A difference in operation of the shift register shown in FIG. 15 from the shift register depicted in FIG. 11 will now be described with reference to the timing chart in FIG. 16. In the operation according to this timing chart, the voltage signal V1 is constantly maintained on the high level.

In a period from the timing T0 to another timing T1, when the start signal Dst changes to the high level and the TFT 1 of the first stage RS(1) is turned on, the voltage signal V1 is outputting from the drain of the TFT 1 to the source, thereby accumulating the electric charge in the node A1. At this time, although the potential of the node A1 is lower than that of the voltage signal V1, which is lower than the power supply voltage Vdd, by the threshold voltage of the TFT 1, it is higher than the threshold voltage of the TFTs 2 and 5. As a result, the TFTs 2 and 5 are turned on and the TFT 3 is turned off in the first stage RS(1). Further, in the timing T1, when the clock signal CK1 rises, the level of the output signal OUT1 becomes the high level.

Thereafter, in a period from the timing Tn−1 to the timing Tn, the output signal OUTn−1 of the n−1-th stage RS(n−1) rises to the high level and the TFT 1 of the n-th stage RS(n) is turned on similarly. Consequently, the electric charge capable of providing the potential lower than the voltage signal V1 by the threshold voltage of the TFT 1 is accumulated in the node An, and the TFTs 2 and 5 are turned on and the TFT 3 is turned off in the n-th stage RS(n). Furthermore, in the timing Tn, when the clock signal CK2 rises, the level of the output signal OUTn becomes the high level.

Description will now be given as to how the potential of the gate, the drain and the source of one TFT 1 changes in this shift register by taking the TFT 1 in the third stage RS(3) for instance with reference to the lower three sections in FIG. 16. AS shown in the drawing, the gate voltage of the TFT 1 is substantially equal to the power supply voltage Vdd only when the output signal OUT2 of the second stage RS(2) is on the high level in a period from the timing T2 to the timing T3.

The drain voltage of the TFT 1 is maintained on a level of the voltage signal V1, namely, a level which is slightly lower than the power supply voltage Vdd. When the electric charge is accumulated in the node A3 in the timing T2, the source voltage of the TFT 1 changes to the voltage level lower than the voltage signal V1 by its threshold voltage. Moreover, this source voltage changes to the level higher than the voltage signal V1 by nearly the power supply voltage Vdd, when the clock signal CK1 is on the high level in a period from the timing T3 to the timing T4.

That is, the level of the source voltage of the TFT 1 at this time is slightly higher than the power supply voltage Vdd but sufficiently lower than a voltage which is twofold of the power supply voltage Vdd. Therefore, in the TFT 1, a difference in potential between the gate and the drain when the gate is on the OFF level becomes smaller, and a difference in potential between the gate and the source when the source voltage is maximum also becomes smaller. Similarly, the gate voltage of the TFT 2, the gate voltage of the TFT 5, and the drain voltage of the TFT 6 do not become large as those in the shift register shown in FIG. 11. Thus, the large voltage stress is not applied to the TFTs 1, 2, 5 and 6, and the device characteristic of the TFT 1, 2, 5 and 6 is hardly deteriorated as compared with the shift register depicted in FIG. 11. Therefore, a failure hardly occurs even if the shift register is used for a long time.

Figure 16:
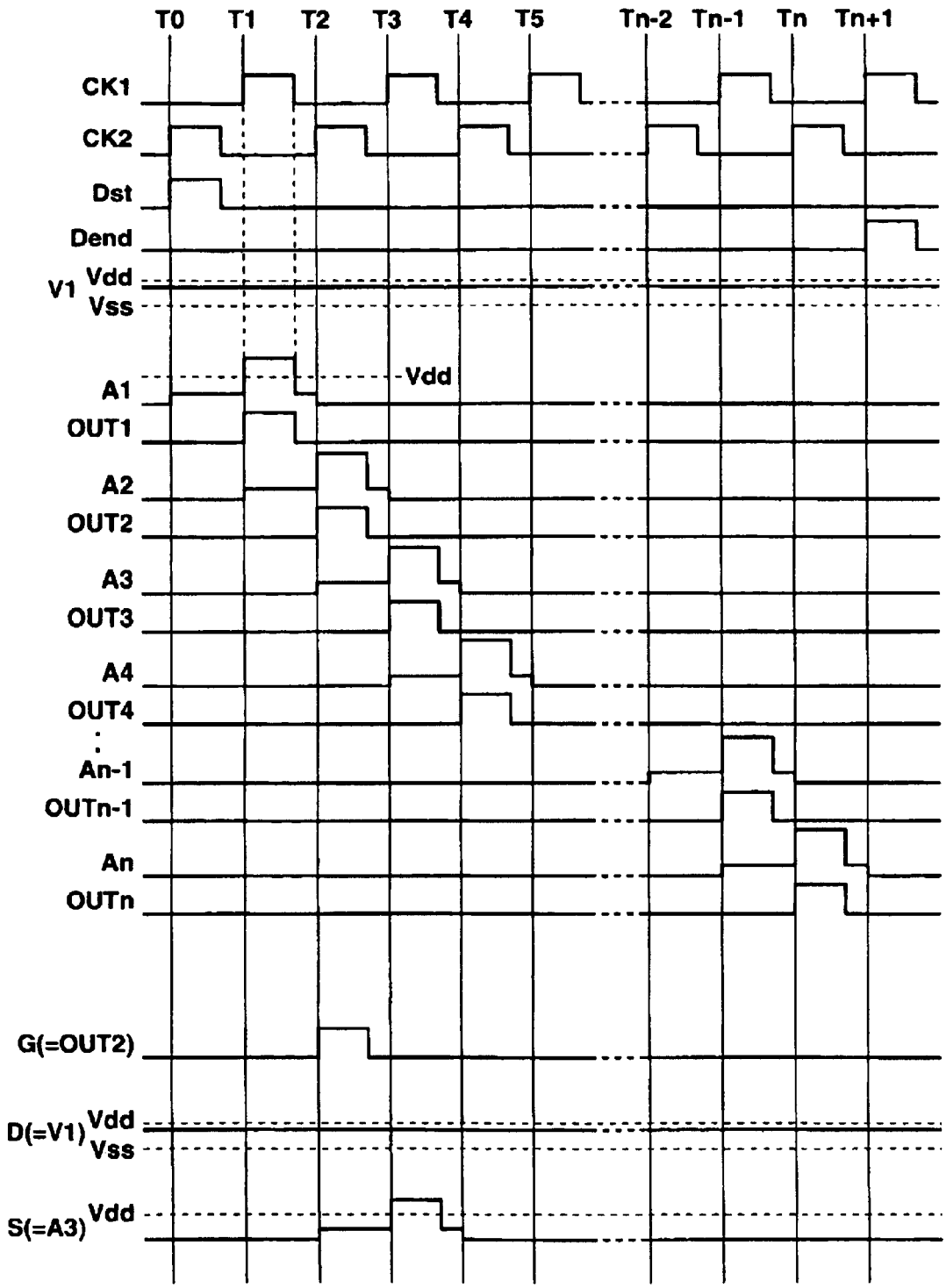
FIG. 16 is a timing chart showing the operation of the shift register illustrated in FIG. 15.
Figure 17:
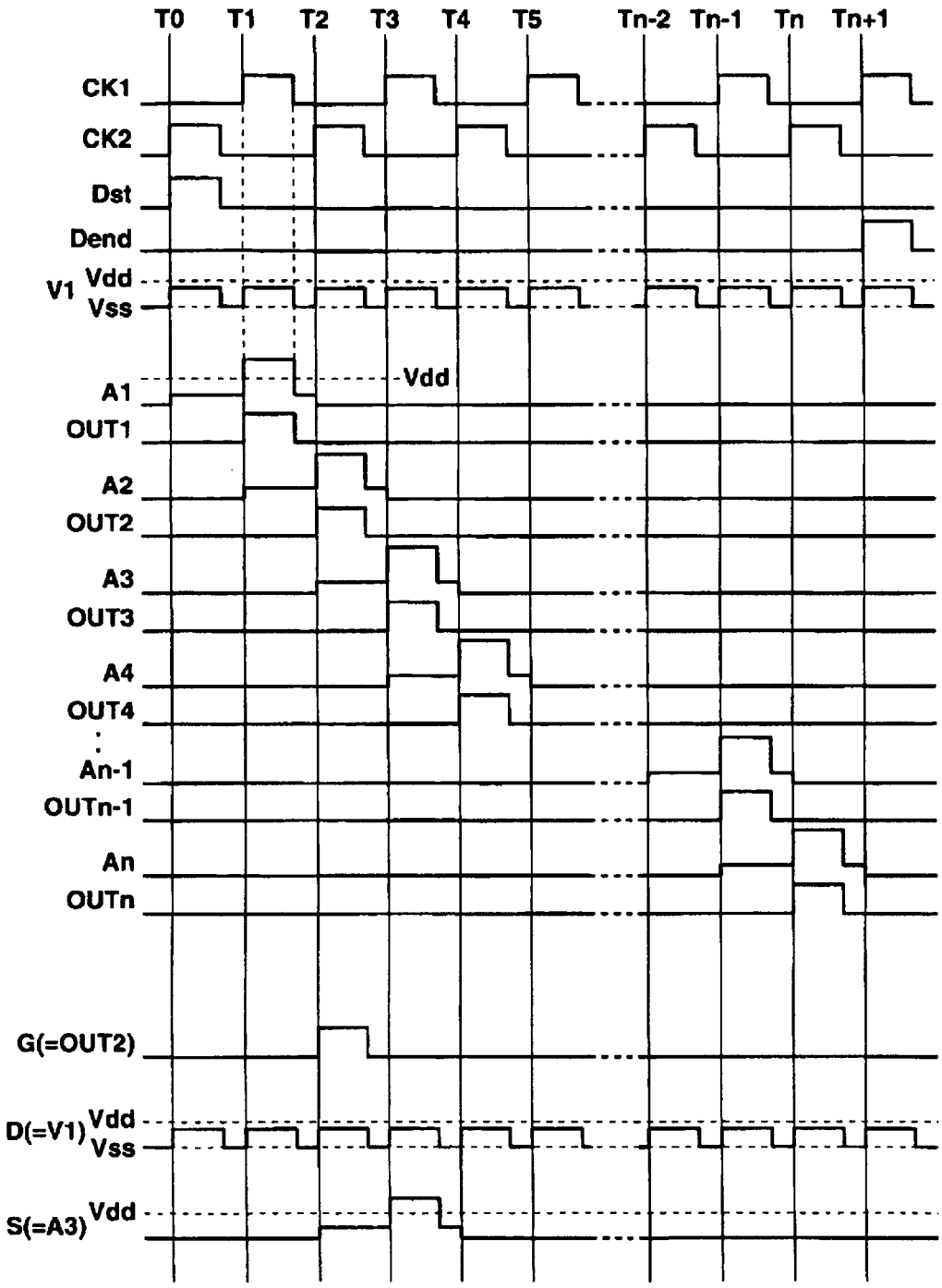
FIG. 17 is another timing chart showing the operation of the shift register illustrated in FIG. 15.

The shift register shown in FIG. 15 can also operate in accordance with the timing chart illustrated in FIG. 17. In the operation according to this timing chart, the voltage signal V1 changes to the high level only in a period in which either the clock signal CK1 or CK2 is on the high level. Description will be given as to a difference of the operation according to this timing chart from the operation according to the timing chart depicted in FIG. 16.

Only when the start signal Dst is on the high level in a period from the timing T0 to another timing T1, the voltage signal V1 rises to the high level, and the electric charge is accumulated in the node A1. Only when the output signal OUT1 is on the high level in a period from the timing T1 to another timing T2, the voltage signal V1 changes to the high level, and the electric charge is accumulated in the node A2. Thereafter, in a period from the timing Tn−1 to the timing Tn, only when the output signal OUTn−1 is on the high level, the voltage signal V1 similarly rises to the high level, thereby accumulating the electric charge in the node An.

In case of this operation, as shown in the lower three sections in FIG. 17 by taking the third stage RS(1) for instance, a period in which a difference in potential between the gate and the drain and between the source and the drain of the TFT 1 is shorter than that in case of the operation illustrated in FIG. 16, and the voltage stress applied to the TFT 1 is small. Therefore, since the device characteristic of the TFT 1 is hardly deteriorated as compared with the case of the operation shown in FIG. 16, a failure hardly occurs even if the shift register is used for a long time.

Figure 18:
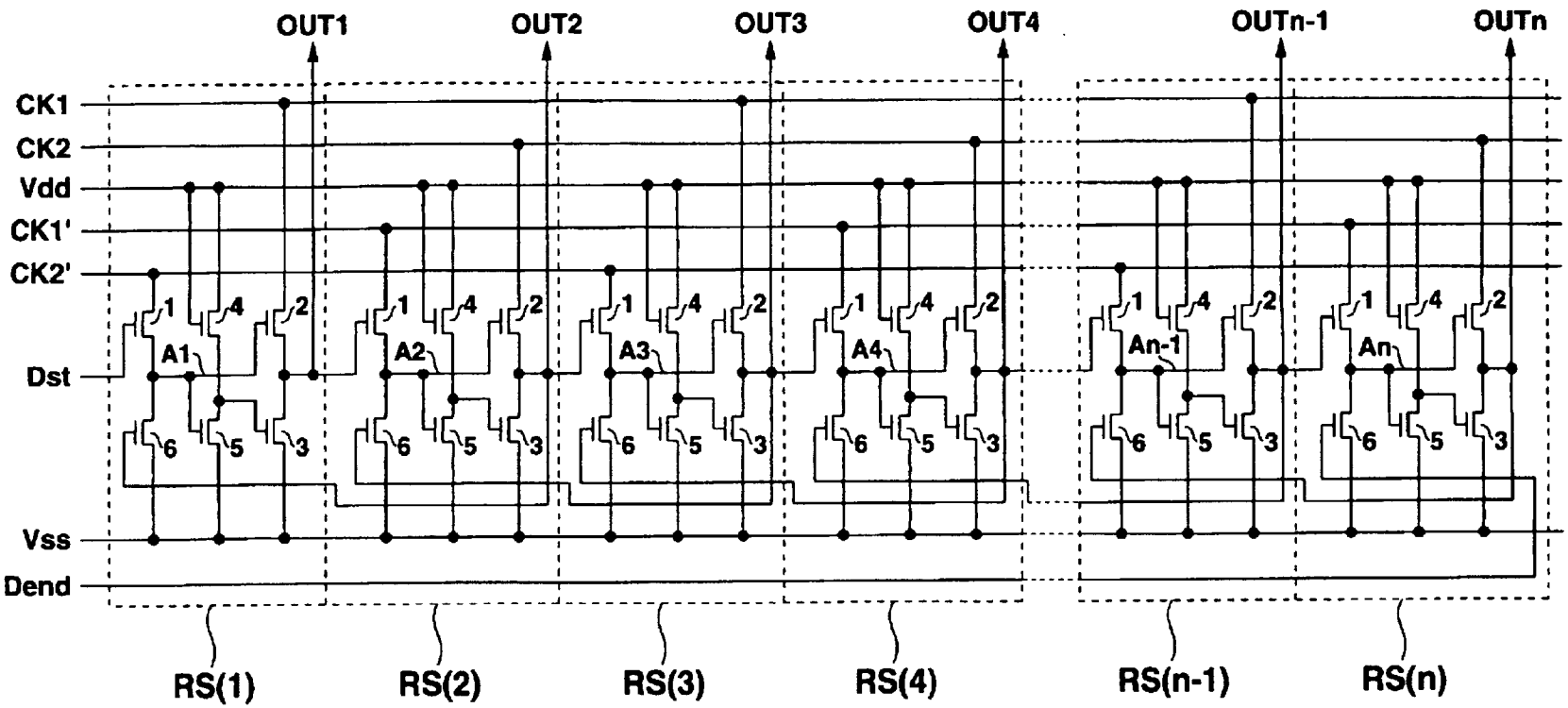
FIG. 18 is a view showing yet another circuit structure of the shift register used as the gate driver depicted in FIG. 3.

FIG. 18 is a view showing the circuit structure of shift registers applicable as the gate driver 152, the top gate driver 72 and the bottom gate driver 73. Explaining a difference from the shift register illustrated in FIG. 13, a clock signal CK1' is supplied to the drain of the TFT 1 in the odd-numbered stages RS(1), RS(3), . . . , RS(n−1), and a clock signal CK2' is supplied to the same in the even-numbered stages RS(2), RS(4), . . . , RS(n), respectively. The high level of the clock signals CK1' and CK2' is lower than the level of the power supply voltage Vdd but it can accumulate in the nodes A1 to An the electric charge which is sufficient for turning on the TFTs 2 and 5.

A difference in operation of the shift register shown in FIG. 18 from the shift register depicted in FIG. 13 will now be described with reference to the timing chart in FIG. 19. When the start signal Dst changes to the high level in a period from the timing T0 to the timing T1, the clock signal CK2' rises to the high level, and the electric charge is accumulated in the node A1. When the output signal OUT1 changes to the high level in a period from the timing T1 to the timing T2, the clock signal CK1' rises to the high level, and the electric charge is accumulated in the node A2. Thereafter, when the output signal OUTn−1 rises to the high level in a period from the timing Tn−1 to the timing Tn, the clock signal CK1' rises to the high level and the electric charge is accumulated in the node An.

Figure 19:
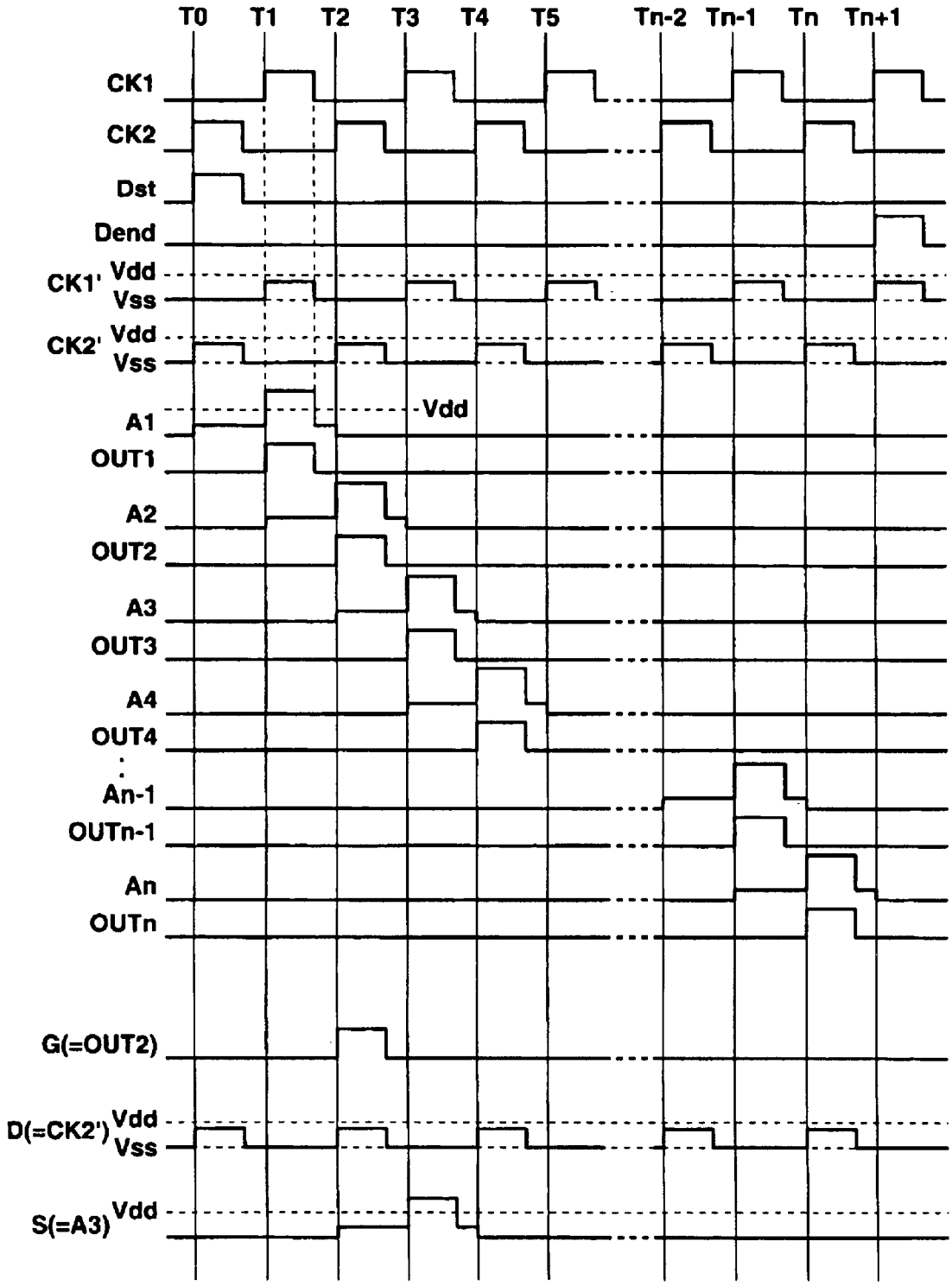
FIG. 19 is a timing chart showing the operation of the shift register illustrated in FIG. 18.

As shown in the lower three sections in FIG. 19 by taking the TFT 1 of the third stage RS(3) for instance, the source voltage of each TFT 1 is slightly higher than the power supply voltage Vdd even when the source voltage is on the maximum level, but it is sufficiently lower than a voltage which is twofold of the power supply voltage Vdd. Similarly, the gate voltage of the TFT 2, the gate voltage of the TFT 5 and the drain voltage of the TFT 6 do not become as large as those of the shift register shown in FIG. 13. Accordingly, the large voltage stress is not applied to the TFTs 1, 2, 5 and 6. Moreover, a period in which a difference in potential between the gate and the drain and between the source and the drain of the TFT 1 is generated is shorter than that in the shift register shown in FIG. 15. Since the device characteristic of the TFTs 1, 2, 5 and 6 is hardly deteriorated as compared with the shift registers shown in FIGS. 13 and 15, a failure is hardly produced even if the shift register is used for a long time.

Second Embodiment

A digital still camera according to this embodiment is substantially the same as that according to the first embodiment but different from the foregoing embodiment in that an angle sensor 240 indicated by a dotted line in FIG. 2 is provided. In addition, a sift register applied as the gate driver 152 in the display portion 210 is different from the first embodiment, and a shift register which can shift an output signal in both forward and backward directions is used in this embodiment. Additionally, in this regard, signals outputted as the control signal group Gcnt from the controller 150 are also different slightly.

The angle sensor 240 detects an angle of a lens unit portion 202 with respect to a camera main body portion 201. A detection signal of the angle sensor 240 is inputted to a CPU 222, and the CPU 222 supplies to a display portion 210 a control signal which indicates that a display scanning direction (shift operation direction of the shift register applied as the gate driver 152) is either the forward direction or the backward direction in accordance with this detection signal.

Figure 20:
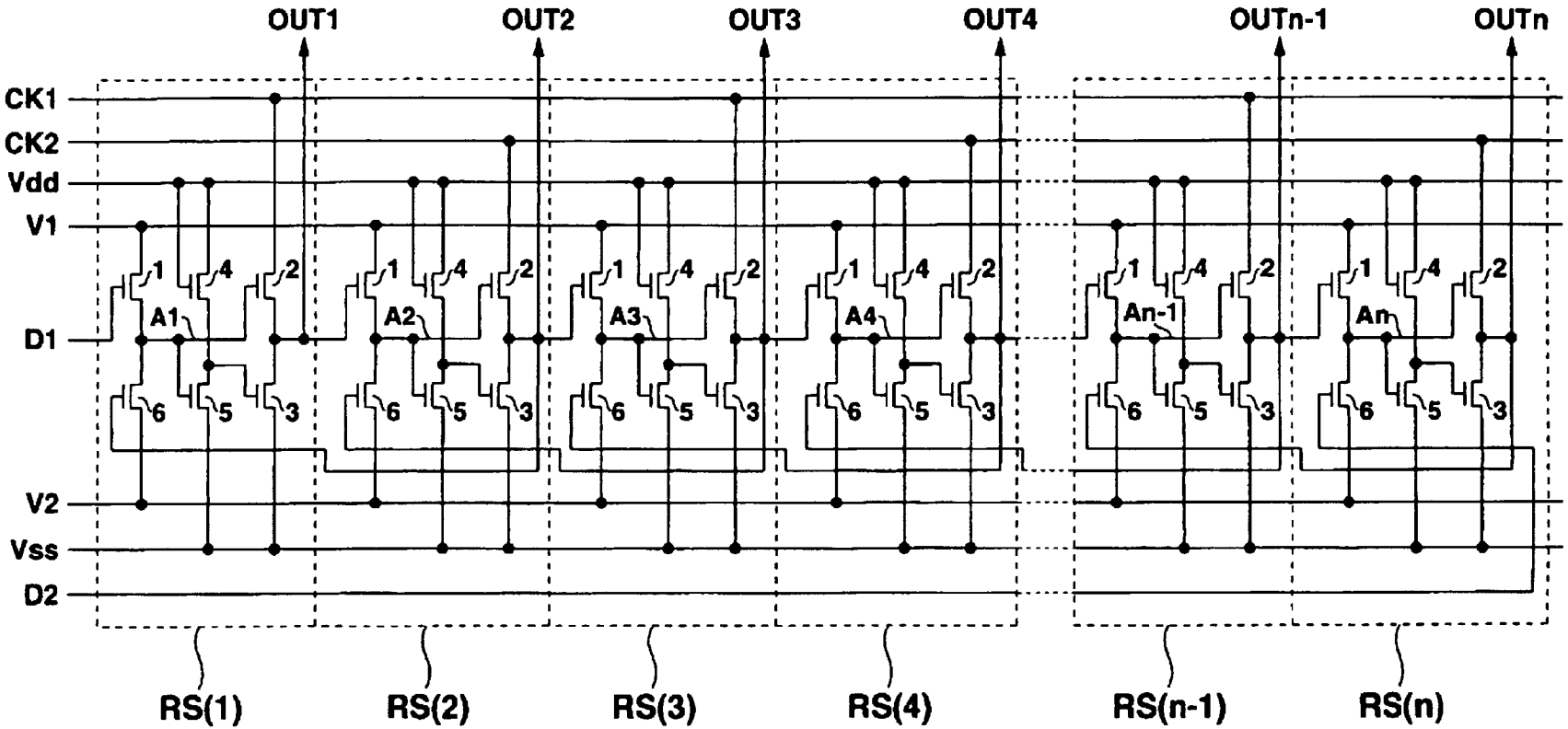
FIG. 20 is a view showing the circuit structure of a shift register used as a gate driver illustrated in FIG. 3 in a second embodiment according to the present invention.

FIG. 20 is a view showing a circuit configuration of the shift register applied as the gate driver 152 in this embodiment. This shift register is also constituted by n stages RS(1) to RS(n) whose number is equal to that of gate lines GL in a display area 151, and each of the stages RS(1) to RS(n) is composed of six TFTs 1 to 6 as similar to the shift register illustrated in FIG. 11. Here, the TFTs 1 to 6 are all likewise n channel type field effect transistors.

Giving description on a difference of the shift register shown in FIG. 20 from that illustrated in FIG. 11, a voltage signal V1 is supplied to the drain of the TFT 1 in each of the stages RS(1) to RS(n) instead of the power supply voltage vdd. A voltage signal V2 is supplied to the source of the TFT 6 in each of the stages RS(1) to RS(n) in place of the reference voltage Vss.

A control signal D1 is fed to the gate of the TFT 1 in the first stage RS(1) instead of the start signal Dst. A control signal D2 is supplied to the gate of the TFT 6 in the n-th stage RS(n) in place of the reset signal Dend. Levels of the voltage signals V1 and V2 differ depending on the forward operation and the backward operation, and the timing in which the control signals D1 and D2 rise to the high level differ depending on the forward operation and the backward operation.

The operation of the digital still camera according to this embodiment will now be described. Explanation will be first given as to the operation of the shift register constituting the above-mentioned gate driver 152 in accordance with the case of forward shift and the case of backward shift with reference to the timing charts of FIGS. 21 and 22.

It is to be noted that the high level of the clock signals CK1 and CK2, the voltage signals V1 and V2, and the control signals D1 and D2 is equal to the power supply voltage Vdd in these timing charts. On the other hand, the low level of these signals is equal to the reference voltage Vss. One scanning period Q corresponds to one horizontal period in the display portion 210.

Further, before starting the shift operation according to these timing charts (before T0), all of the output signals OUT1 to OUTn are on the low level. Further, in any of the stages RS(1) to RS(n), no electric charge is accumulated in the nodes A1 to An, and the TFTs 2 and 5 are in the ON state while the TFT 3 is in the OFF state.

Figure 21:
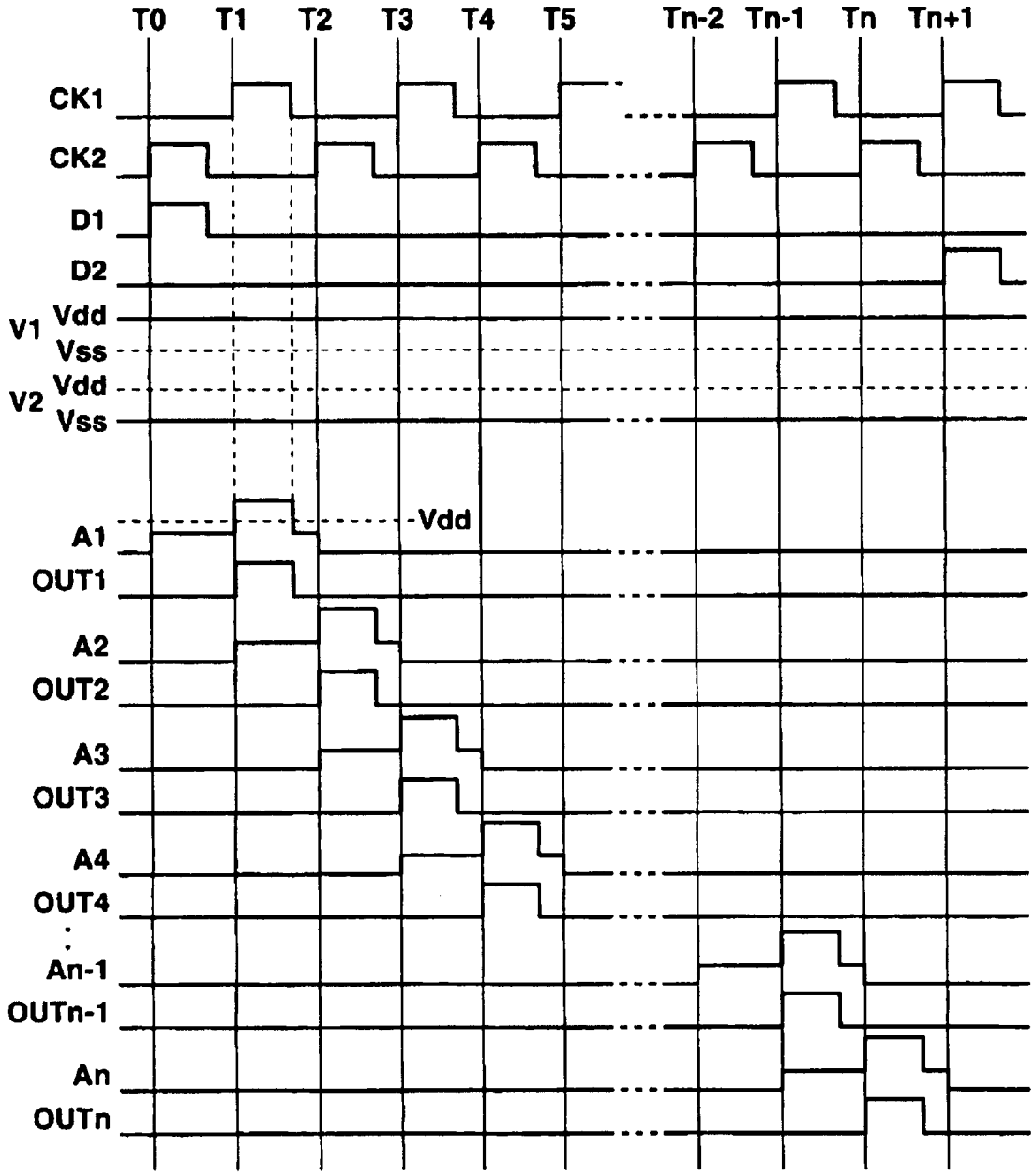
FIG. 21 is a timing chart showing a forward operation of the shift register illustrated in FIG. 20.

FIG. 21 is a timing chart showing the operation in case of the forward shift. In this case, the level of the voltage signal V1 is maintained on the high level equal to the power supply voltage Vdd, and the level of the voltage signal V2 is maintained on the low level equal to the reference voltage Vss. Furthermore, the control signal D1 rises to the high level only in a fixed period from the timing T0 to the timing T1. The control signal D2 rises to the high level only in a fixed period from the timing Tn to the timing Tn+1.

That is, in the first embodiment, when the control signal D1 and the control signal D2 are replaced with the start signal Dst and the reset signal Dend, respectively, the operation equal to that of the shift register explained in conjunction with the timing chart of FIG. 12 can be obtained. Therefore, the output signals OUT1 to OUTn sequentially rise to the high level and are shifted for each fixed period in one scanning period Q.

Figure 22:
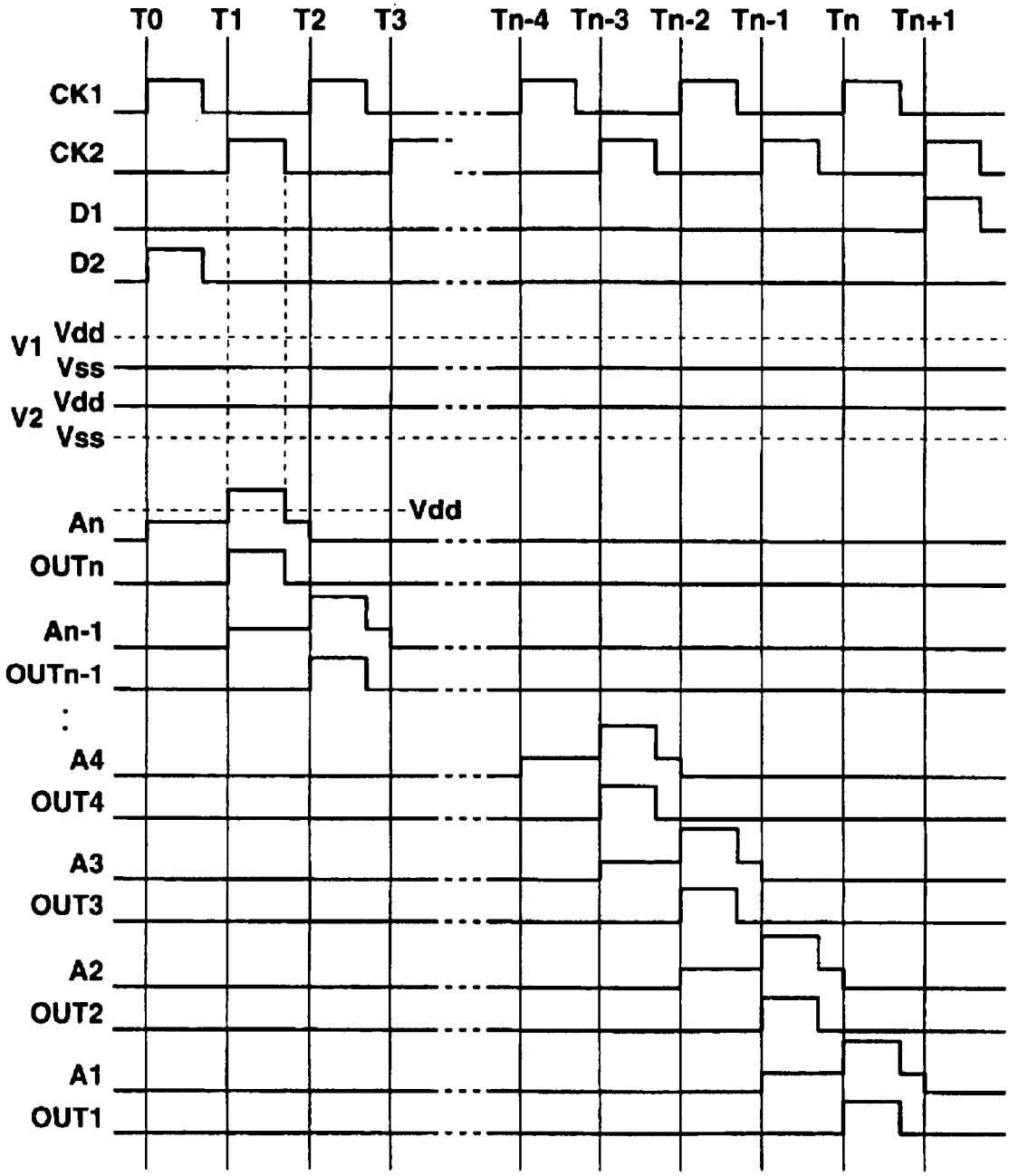
FIG. 22 is a timing chart showing a backward operation of the shift register illustrated in FIG. 20.

On the other hand, FIG. 22 is a timing chart showing the operation in case of the backward shift. In this case, the level of the voltage signal V1 is maintained on the low level equal to the reference voltage Vss, and the level of the voltage signal V2 is maintained on the high level equal to the power supply voltage Vdd. Further, the control signal D2 rises to the high level only in a fixed period from the timing T0 to the timing T1. The control signal D1 rises to the high level only in a fixed period from the timing Tn to the timing Tn+1.

In a period from the timing T0 to the timing T1, when the control signal D2 rises to the high level, the TFT 6 of the n-th stage RS(n) is turned on, and the voltage signal V2 on the high level is outputted from the source of the TFT 6 to the source. As a result, the electric charge is accumulated in the node An of the n-th stage RS(n), and the TFTs 2 and 5 are turned on while the TFT 3 is turned off. Since the TFT 2 of the n-th stage RS(n) is turned on but the clock signal CK2 remains on the low level in this period, the output signal OUT2 remains on the low level.

Subsequently, in the timing T1, when the clock signal CK2 rises to the high level, this signal is outputted from the drain of the TFT 2 of the n-th stage RS(n) to the source, and the output signal OUTn rises to the high level. Thereafter, when the clock signal CK2 falls until the timing T2, the output signal OUTn changes to the low level.

Furthermore, in a period from the timing T1 to the timing T2, the TFT 6 of the n−1-th stage RS(n−1) is turned on by the output signal OUTn of the n-th stage RS(n) which has risen to the high level. Consequently, outputting the voltage signal V2 on the high level from the drain of the TFT 6 in the n−1-th stage RS(n−1) causes the potential of the node An−1 to change to the high level, and the TFTs 2 and 5 are turned on while the TFT 3 is turned off in the n−1-th stage RS(n−1).

Then, in the next timing T2, when the clock signal CK1 changes to the high level, this signal is outputted from the drain of the TFT2 of the n−1-th stage RS(n−1) to the source, and the level of the output signal OUTn−1 varies to the high level. As a result, the TFT 1 is now turned on in the n-th stage RS(n), and the electric charge accumulated in the node An is discharged, and the TFTs 2 and 5 are turned off while the TFT 3 is turned on in the n-th stage RS(n). Thereafter, when the clock signal CK1 falls until the timing T3, the output signal OUTn−1 falls to the low level.

Furthermore, in a period from the timing T1 to another timing T2, the TFT 6 of the n−2-th stage RS(n−2) is turned on by the output signal OUTn−1 of the n−1-th stage RS(n−1) which has risen to the high level. Consequently, when the voltage signal V2 on the high level is outputted from the drain of the TFT 6 in the n−2-th stage RS(n−2), the potential of the node An−2 rises to the high level, and the TFTs 2 and 5 are turned on while the TFT 3 is turned off in the n−2-th stage RS(n−2).

Thereafter, the n−2-th and preceding stages RS(n−2), RS(n−3), . . . repeat the operation similar to the above in accordance with each one scanning period Q toward the preceding stages, and the output signals OUTn−2, OUTn−3, . . . hence change to the high level in each predetermined period within one scanning period Q. Moreover, in a period from the timing Tn−1 to the timing Tn, the TFT 6 of the first stage RS(1) is turned on by the output signal OUT2 of the second stage RS(2) which has risen to the high level. Consequently, the electric charge is accumulated in the node A1 of the first stage RS(1), and the TFTs 2 and 5 are turned on while the TFT 3 is turned off.

Then, in the timing Tn, when the clock signal CK1 changes to the high level, this signal is outputted from the drain of the TFT 2 of the first stage RS(1) to the source, the level of the output signal OUT1 varies to the high level. Thereafter, when the clock signal CK1 falls until the timing Tn+1, the output signal OUT1 changes to the low level.

Subsequently, in the timing Tn+1, the level of the control signal D1 changes to the high level. As a result, the TFT 1 of the first stage RS(1) is turned on, which discharges the electric charge accumulated in the node A1, thereby turning off the TFTs 2 and 5 and turning on the TFT 3 in the second stage RS(2). Moreover, before the control signal D2 changes to the high level, no electric charge is accumulated in the nodes A1 to An in all of the stages RS(1) to RS(n), thus maintaining the TFTs 2 and 5 in the ON stage and the TFT 3 in the OFF state.

The operation of the entire digital still camera according to this embodiment will now be described, but this is the same as the first embodiment except the following point. Explaining a difference from the first embodiment, the angle sensor 240 detects an angle of the lens until portion 202 with respect to the camera main body portion 201 and inputs the detection signal to the CPU 222. The CPU 222 then supplies to the display portion 210 a control signal according to the received detection signal.

In the display portion 210, the controller 150 switches the control signals D1 and D2 and the voltage signals V1 and V2 supplied as the control signal group Gcnt to the gate driver 152 so that the forward shift can be effected, when the control signal indicating that the imaging lens 202a of the lens unit 202 is provided on the opposite side of the display portion 210 is supplied from the CPU 222. When the control signal indicating that the imaging lens 202a is provided on the display portion 210 side is supplied from the CPU 222, the controller 150 switches the control signals D1 and D2 and the voltage signals V1 and V2 fed as the control signal group Gcnt to the gate driver 152 so that the backward shift can be performed.

Description will now be given as to the operation when an image is picked up by the digital still camera according to this embodiment, especially the relationship between the direction of the lens unit portion 202 and an image displayed in the display portion 210 by giving a specific example.

Here, it is assumed that the mode setting key 212a is set in the recording mode and the CPU 222 supplies to the display portion 210 a control signal for changing a scanning direction (shift direction of the shift register constituting the gate driver 152) of the display area 151 in accordance with a detection signal of the angle sensor 240.

Figure 23B:
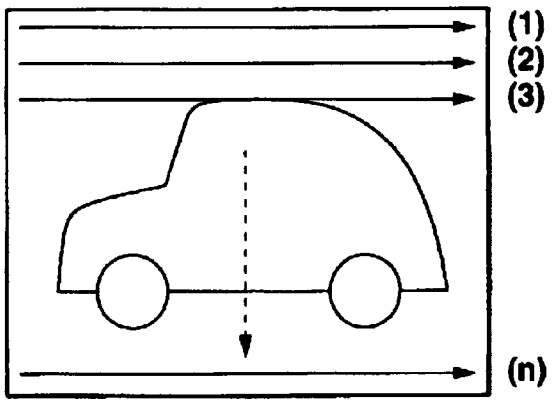
FIG. 23A is a view showing a forward imaging state of the digital still camera in the second embodiment according to the present invention and FIG. 23B is a view showing a displaying state of a display portion.
Figure 23A:
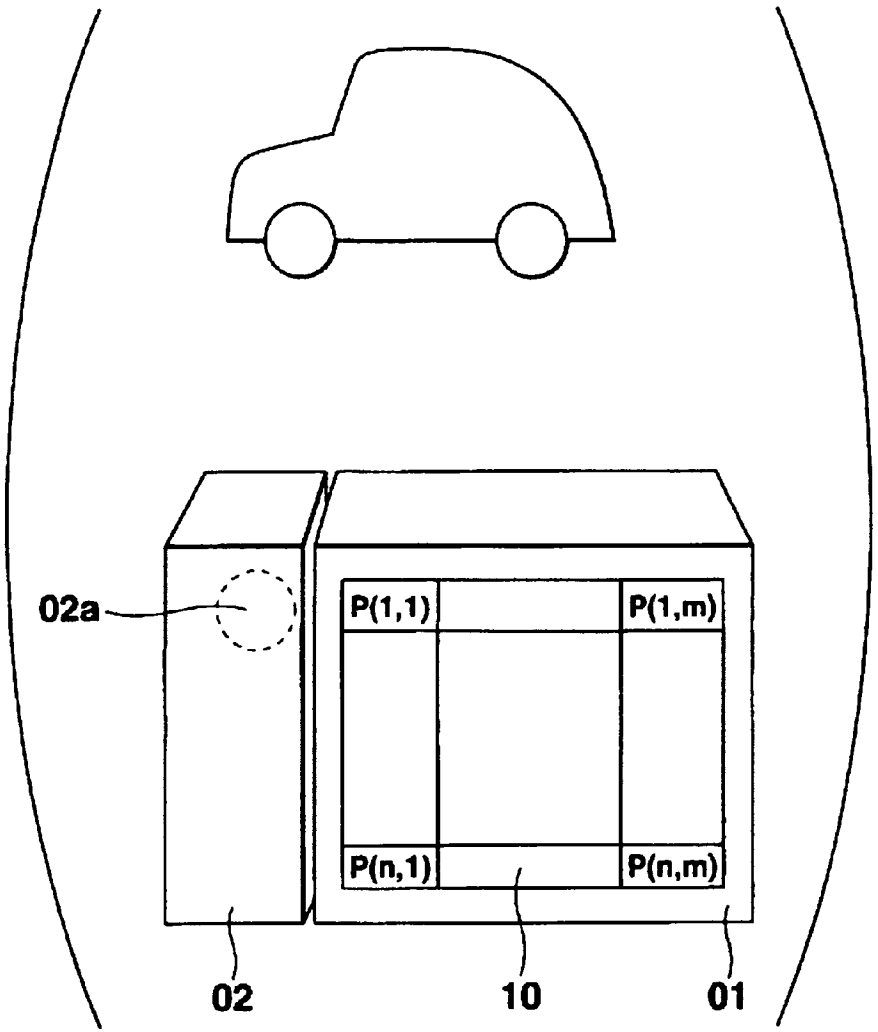

As shown in FIG. 23A, description will be first give on the operation of the digital still camera when picking up an image of an object which exists in front of a camera operator. In this case, the camera operator swivels the imaging lens 202a of the lens unit portion 202 in such a manner that it is situated on the same side as the display portion 210 of the camera main body portion 201, namely, the lens unit portion 202 is positioned at substantially 0° with respect to the camera main body portion 201 and picks up an image. At this time, the scanning direction of the display area 151 by the gate driver 152 is the forward direction.

In this state, as shown in FIG. 23A, the arrangement of the pixels P(1, 1) to P(n, m) in the display area 151 matches with the original vertical and horizontal directions of the display area 151. Further, the vertical and horizontal directions of the lens unit portion 202 matches with the original vertical and horizontal direction of an image. At this time, horizontal scanning from the left to the right and vertical scanning from the top to the bottom in FIG. 23A in accordance with the image formed by the imaging lens 202a cause an electrical signal to be outputted from each pixel of the CCD imaging device 220, and the corresponding image data is developed in the VRAM area of the RAM 224.

On the other hand, in the display portion 210, the developed image data is fetched in accordance with a direction indicted by a horizontal arrow shown in FIG. 23B and outputted to the first to m-th drain lines DL in the display area 151 within one horizontal period. Furthermore, the gate driver 152 sequentially selects the gate lines GL in the order from the first to the n-th gate lines (order from the top line to the lower lines in FIG. 23B) in the display area 151.

As a result, the image data corresponding to the signal outputted from the pixel which is originally provided on the top in the CCD imaging device 220 is displayed on the essentially upper pixel in the display area 151 (upper side in FIG. 23B), and the image data corresponding to the signal outputted from the pixel which is originally provided on the left side in the CCD imaging device 220 is displayed on the essentially left pixel (left side in FIG. 23B) in the display area 151. Therefore, as shown in FIG. 23B, an image whose direction is equal to that of the picked-up image.

Figure 24B:
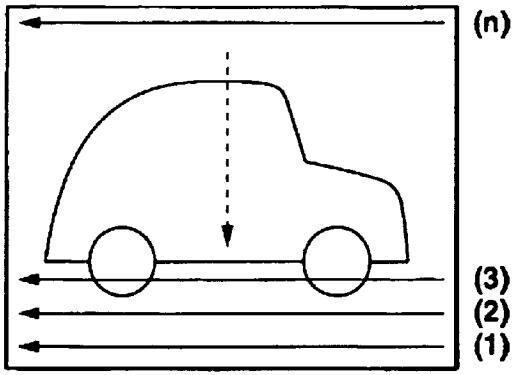
FIG. 24A is a view showing a backward imaging state of the digital still camera in the second embodiment according to the present invention and FIG. 24B is a view showing a displaying state of the display portion.
Figure 24A:
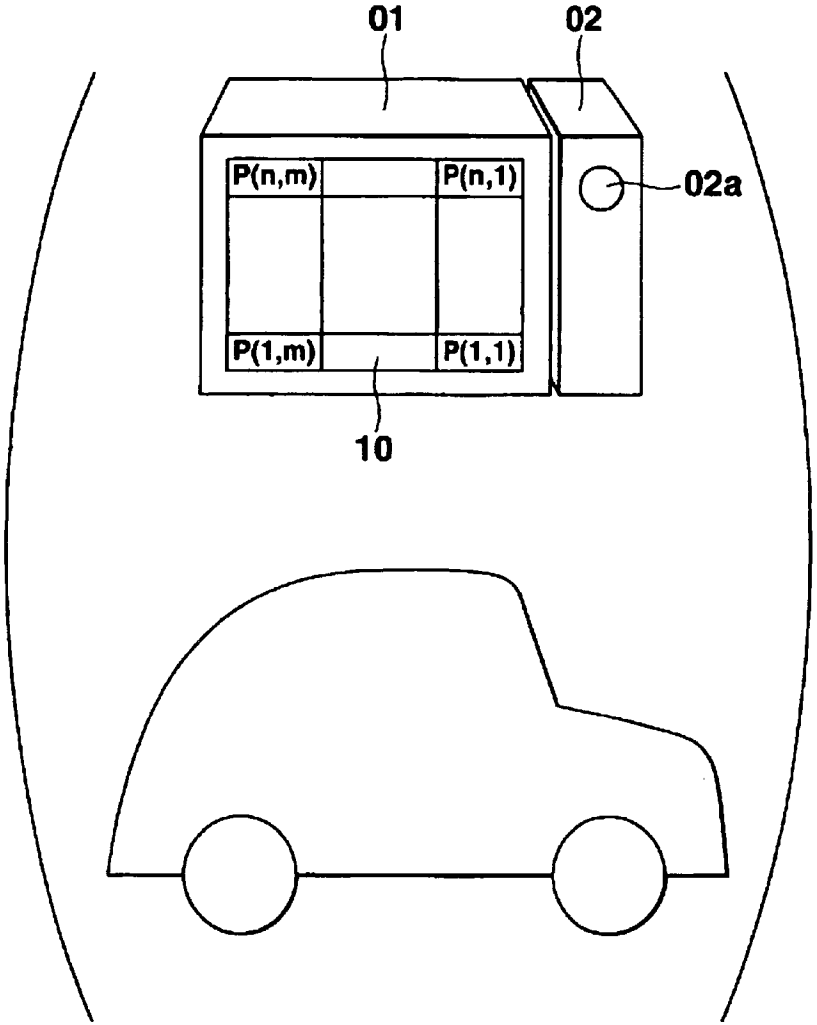

Subsequently, as shown in FIG. 24A, description will now be given as to the operation of the digital still camera when an object is provided on the display portion 210 side, for example, when a camera operator him/herself is an object. In this case, the camera operator swivels the imaging lens 202a of the lens unit portion 202 in such a manner that this lens comes to the opposite side of the display portion 210 of the camera main body portion 201, namely he/she swivels the lens unit portion 202 so as to be positioned at substantially 180° with respect to the camera main body portion 201 in order to pick up an image. At this time, the scanning direction of the display area 151 by the gate driver 152 is the backward direction.

In this state, as shown in FIG. 24A, the arrangement of the pixels P(1, 1) to P(n, m) in the display area 151 is opposite to the original vertical and horizontal directions of the display area 151. Moreover, the vertical and horizontal directions of the lens unit portion 202 match with the vertical and horizontal directions of an image. At this time, horizontal scanning from the right and left and vertical scanning from the top to the bottom in FIG. 24A cause an electrical signal to be outputted from each pixel of the CCD imaging device 220, and the corresponding image data is developed in the VRAM area of the RAM 224.

On the other hand, in the display portion 210, the developed image data is fetched in accordance with the direction indicated by a horizontal arrow shown in FIG. 24B and outputted to the first to the m-th drain liens DL in the display area 151 within one horizontal period. In addition, the gate driver 152 sequentially selects the gate lines GL in the order from the first to the n-th gate lines (order from the lowest gate line to the upper gate lines in FIG. 24B) in the display area 151.

Consequently, the image data corresponding to the signal outputted from the pixel which is originally provided on the top in the CCD imaging device 220 is displayed on the essentially lower pixel (lower side in FIG. 24B) in the display area 151, and the image data corresponding to the signal outputted from the pixel which is originally provided on the left in the CCD imaging device 220 is displayed on the essentially right pixel (right side in FIG. 24B) in the display area 151. Therefore, as shown in FIG. 24B, a mirror of the picked-up image is displayed.

As described above, in the shift register applied as the gate driver 152 in the digital still camera according to this embodiment, the TFT 1 functions as a transistor for accumulating the electric charge in the nodes A1 to An and the TFT 6 serves as a transistor for discharging the accumulated electric charge in case of the forward operation. On the other hand, in case of the backward operation, the TFT 1 functions as a transistor for discharging the electric charge accumulated in the nodes A1 to An and the TFT 6 acts as a transistor for accumulating the electric charge.

Since the TFTs 1 and 6 can have such functions, a number of the TFTs 1 to 6 constituting the respective stages RS(1) to RS(n) can be equal to that in the shift registers applied as the gate driver 152 in the first embodiment. Therefore, an area can not be increased as compared with that in the first embodiment, and the relative area of the image display region can not be small even if the gate driver 152 is formed on the same substrate as that of the display area 151.

In addition, by applying the shift register capable of performing shift operation in both the forward direction and the backward direction to the gate driver 152, a mirror image of an image picked up by the CCD imaging device 220 can be displayed on the display portion 210 by only controlling the control signal group Gcnt supplied to the controller 150 to the gate driver 152. That is, in the digital still camera according to this embodiment, the mirror image can be displayed on the display portion 210 without executing the complicated control for reading the image data developed in the VRAM area.

In this embodiment, the gate driver 152 has the structure shown in FIG. 20 and is constituted by the shift register which operates in accordance with the timing chart shown in FIG. 21 or 22 by the control signal outputted from the controller 150. In this embodiment, however, the method for driving the shift register applicable as the gate driver 152 is not restricted thereto, and the structure of the shift register is not limited thereto.

Figure 25:
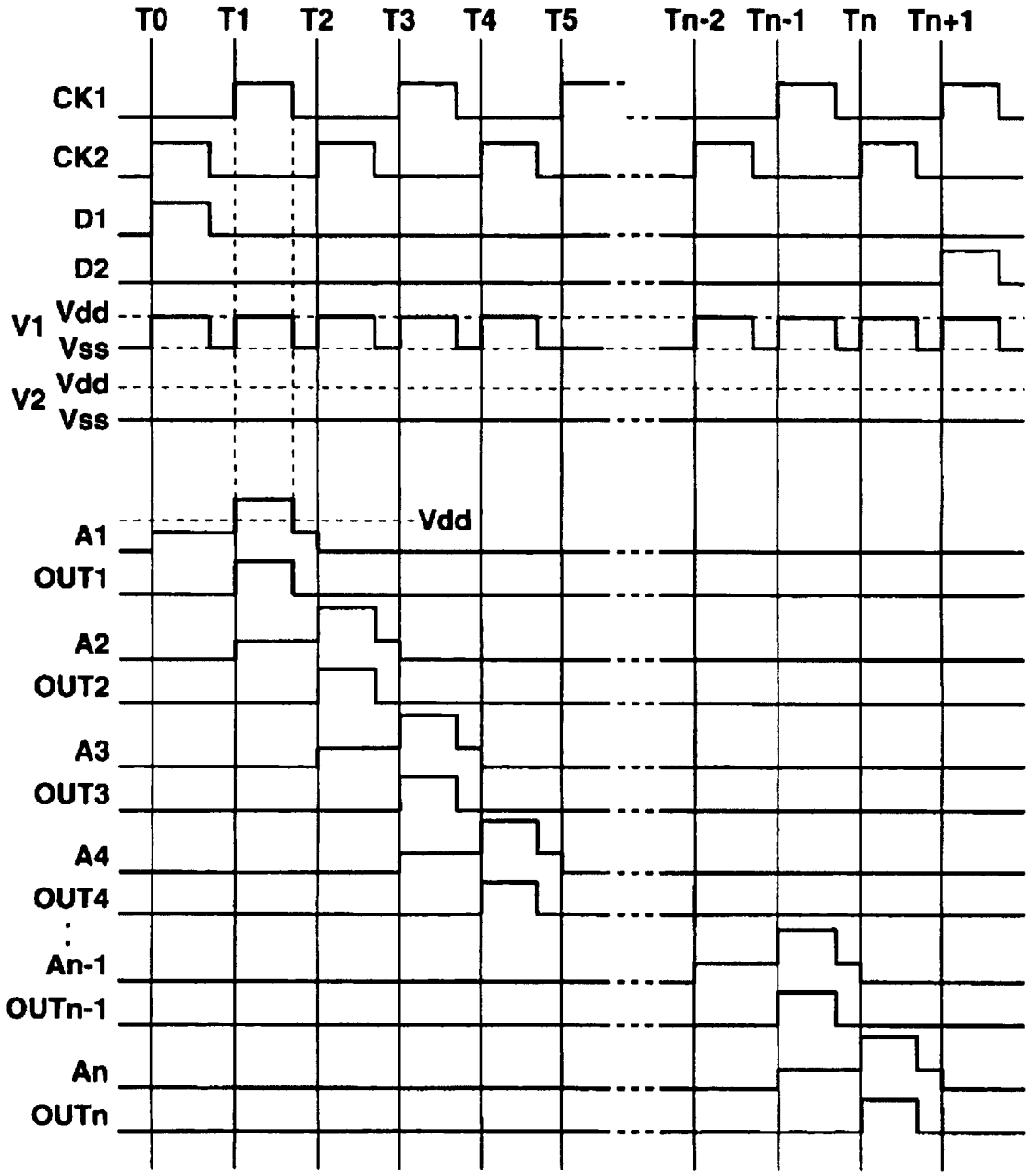
FIG. 25 is another timing chart showing the forward operation of the shift register illustrated in FIG. 20.
Figure 26:
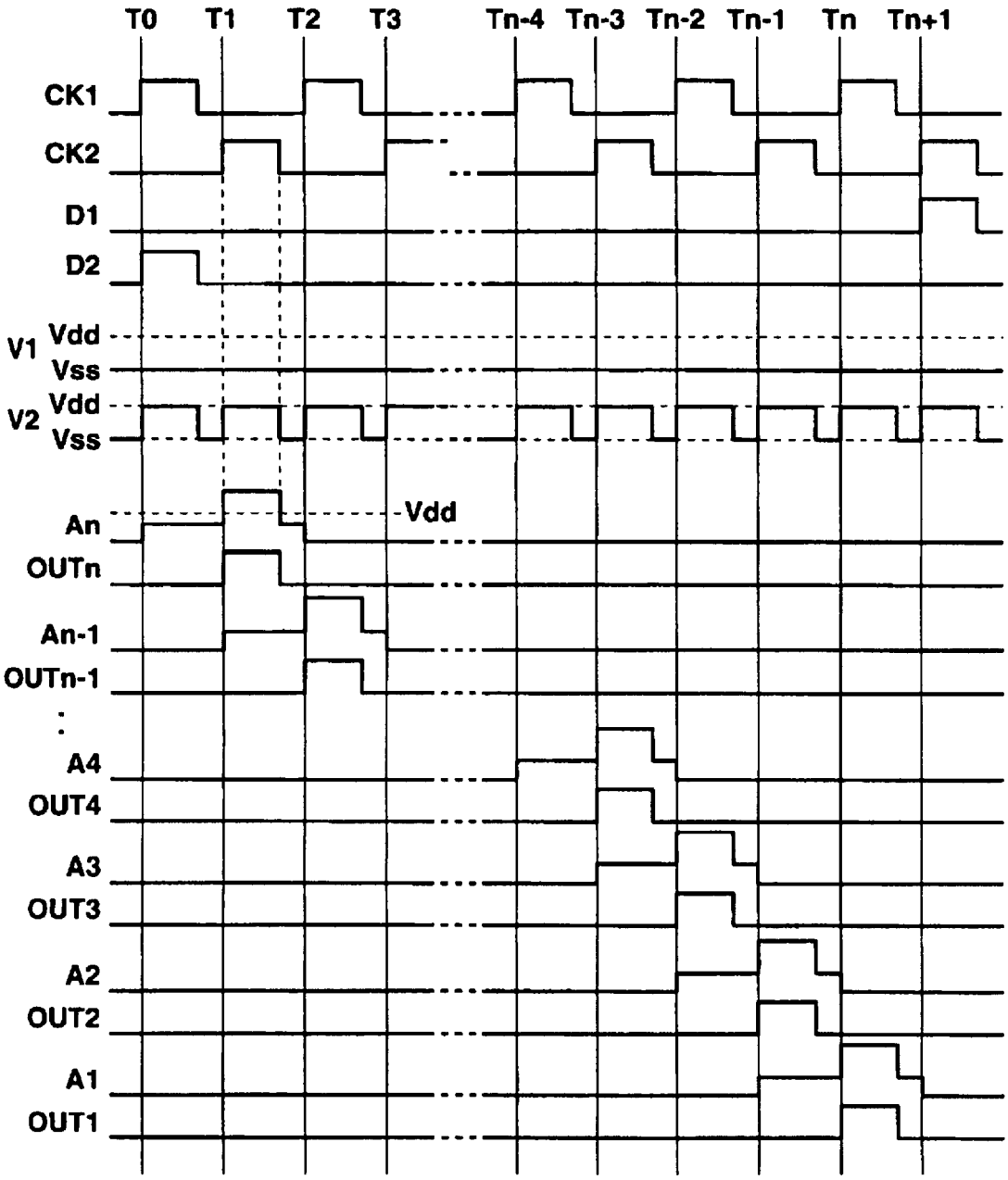
FIG. 26 is another timing chart showing the backward operation of the shift register illustrated in FIG. 20.

FIGS. 25 and 26 are timing charts showing another operation of the shift register illustrated in FIG. 20. In case of the forward operation, as shown in FIG. 25, the voltage signal V2 is maintained on the low level as similar to the case in FIG. 21, but the voltage signal V1 rises to the high level only when the clock signal CK1 or CK2 is on the high level. For example, in the period from the timing T0 to T1, when the control signal D1 changes to the high level, the clock signal CK1 also rises to the high level so that the TFT 1 is turned on in the first stage RS(1), thereby accumulating the electric charge in the node A1.

On the other hand, in case of the backward operation, as shown in FIG. 26, the voltage signal V1 is maintained on the low level as similar to the case in FIG. 22, but the voltage signal V2 rises to the high level only when the clock signal CK1 or CK2 is on the high level. For example, in the period from the timing T0 to the timing T1, when the control signal D2 changes to the high level, the clock signal CK2 also rises to the high level, and the TFT 1 is turned on in the n-th stage RS(n), thereby accumulating the electric charge in the node An.

In these cases, the period in which a difference in potential between the gate and the drain and between the source and the drain of each of the TFTs 1 and 6 becomes shorter than that in case of operating in accordance with the timing charts shown in FIGS. 21 and 22. As a result, the voltage stress applied to the TFTs 1 and 6 can be reduced, and the characteristic is hardly deteriorated, thereby resisting use for a long time.

Figure 27:
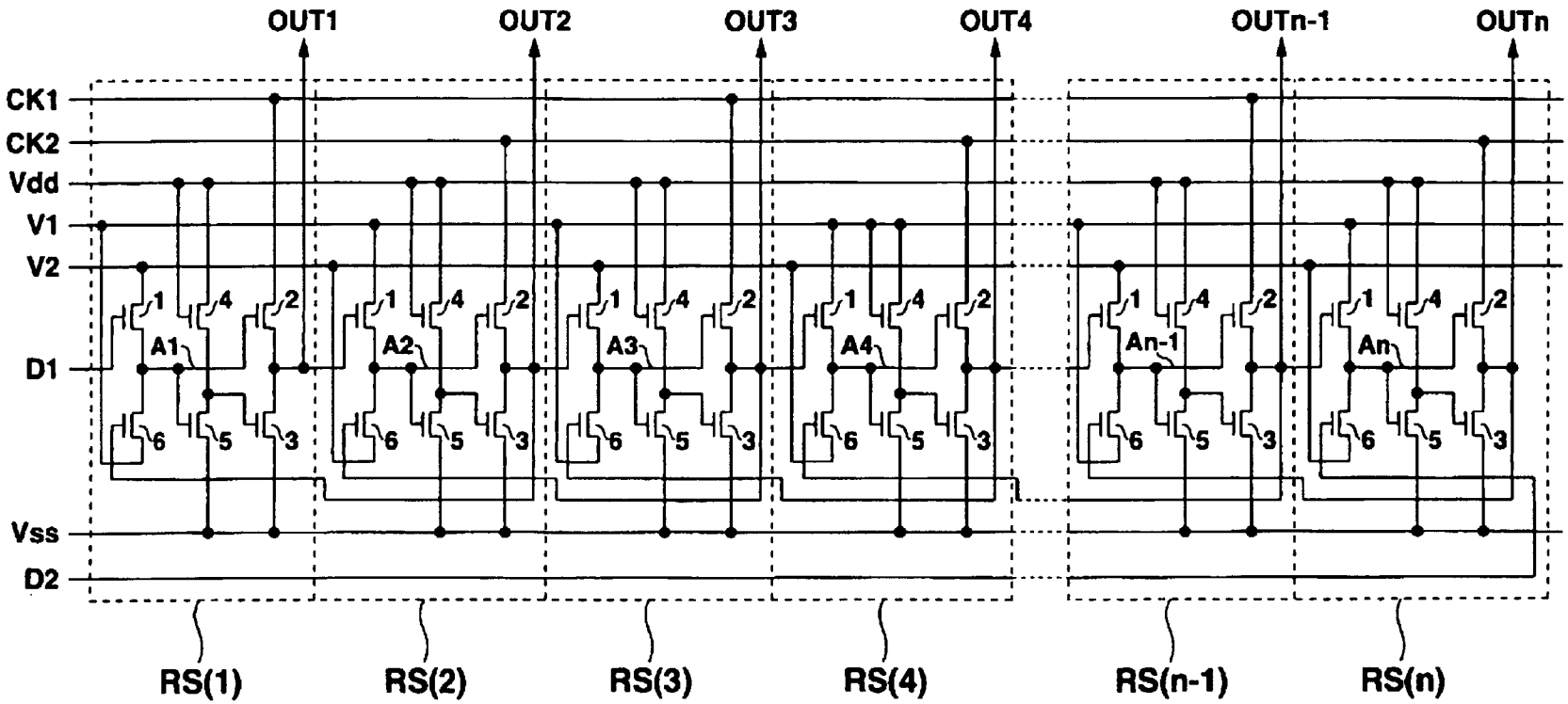
FIG. 27 is a view showing a further circuit structure of the shift register in the second embodiment according to the present invention.

FIG. 27 is a view showing a circuit structure of a further shift register applicable as the gate driver 152 in this embodiment. Giving description as to a difference from the shift register shown in FIG. 20, the voltage signal V2 is supplied to the drain of the TFT 1 and the voltage signal V1 is supplied to the source of the TFT 6 in the odd-numbered stages RS(1), RS(3), . . . , RS(n−1). The voltage signal V1 is supplied to the drain of the TFT 1 and the voltage signal V2 is fed to the source of the TFT 6 in the even-numbered stages RS(2), RS(4), . . . , RS(n).

Figure 28:
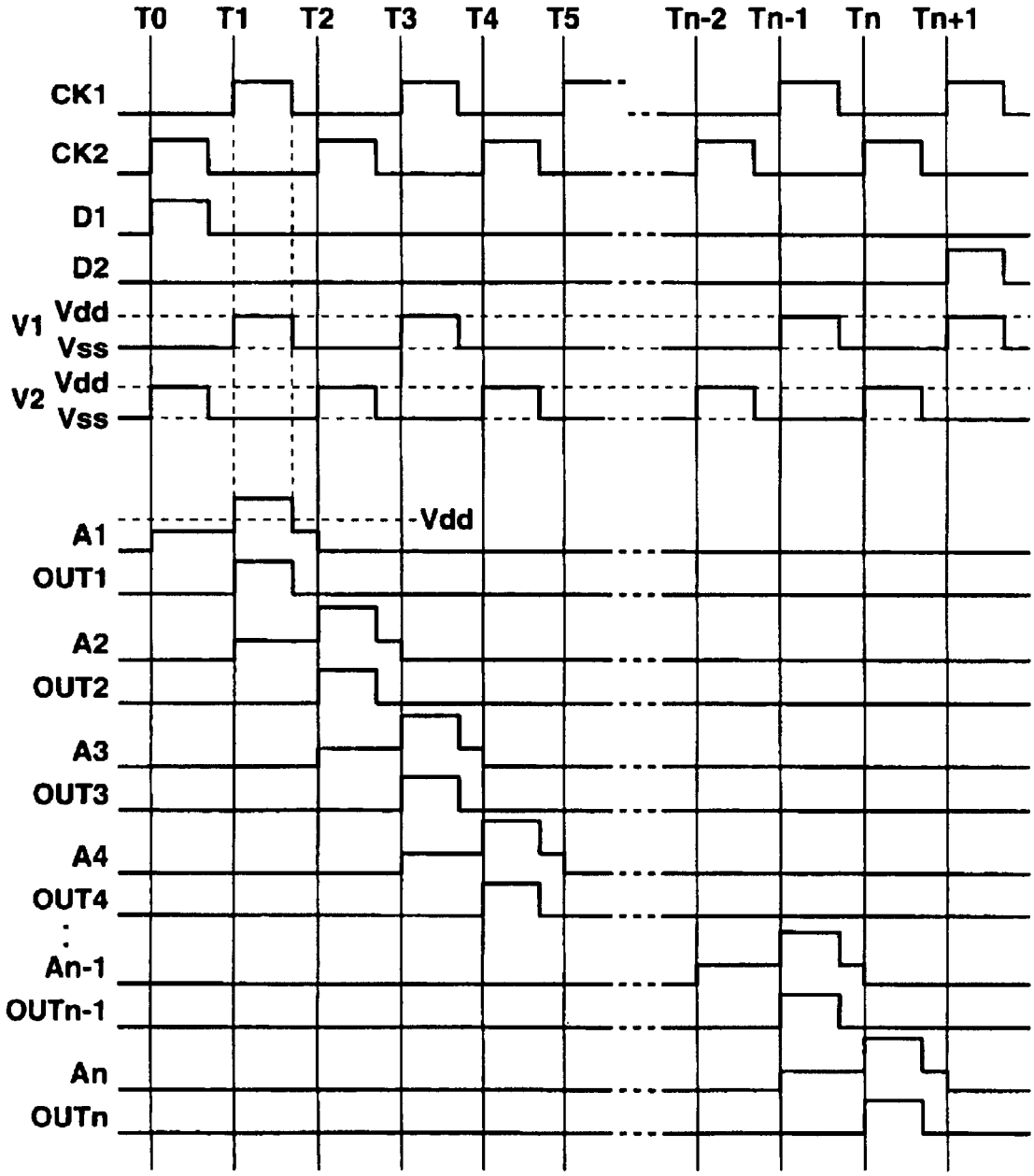
FIG. 28 is a timing chart showing a forward operation of the shift register depicted in FIG. 27.
Figure 29:
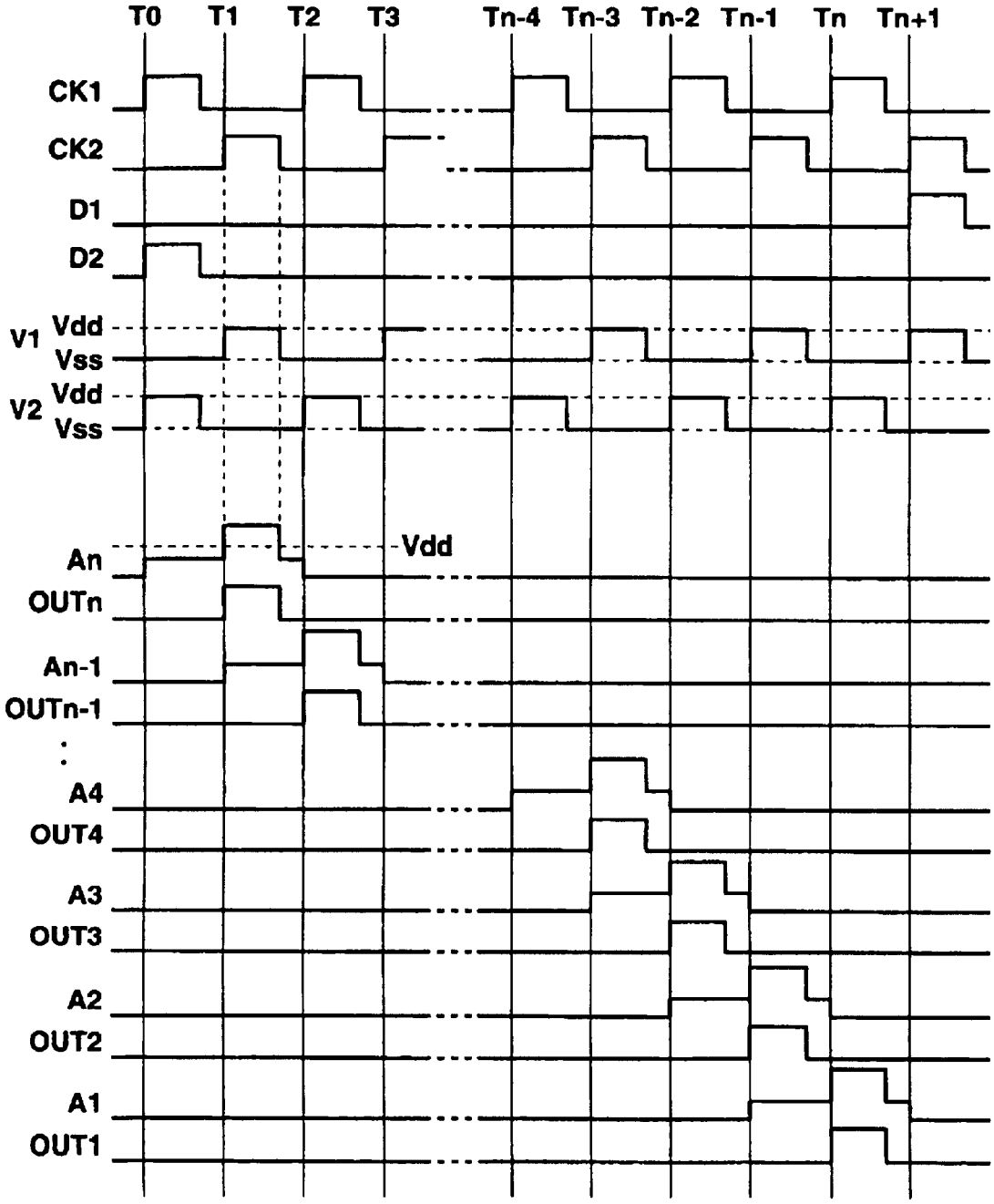
FIG. 29 is a timing chart showing a backward operation of the shift register depicted in FIG. 27.

The operation of the shift register shown in FIG. 27 will now be described with reference to the timing charts in FIGS. 28 and 29. In case of the forward operation, in a period from the timing T0 to the timing T1, when the control signal D1 rises to the high level, the TFT 1 of the first stage RS(1) is turned on, and the electric charge is accumulated in the node A1 by the voltage signal V2 which has risen to the high level. In a period from the timing T1 to the timing T2, when the clock signal CK1 changes to the high level, the output signal OUT1 of the first stage RS(1) rises to the high level. This turns on the TFT 1 of the second stage RS(2), and the electric charge is accumulated in the node A2 by the voltage signal V1 which has risen to the high level.

In a next period from the timing T2 to the timing T3, when the clock signal CK2 changes to the high level, the output signal OUT2 of the second stage RS(2) rises to the high level. This turns on the TFT 1 of the third stage RS(3), and the electric charge is accumulated in the node A3 by the voltage signal V2 which has risen to the high level. Additionally, the TFT 6 of the first stage RS(1) is turned on by the output signal OUT2 which has risen to the high level. At this time, since the voltage signal V1 is on the low level, the electric charge accumulated in the node A1 is discharged.

Thereafter, similarly, in a period from the timing Tn to the timing Tn+1, when the clock signal CK2 changes to the high level, the output signal OUTn of the n-th stage RS(n) rises to the high level. Consequently, the TFT 6 of the n−1-th stage RS(n−1) is turned on. Further, since the voltage signal V1 is on the low level, the electric charge accumulated in the node An−1 is discharged. Then, in the timing Tn+1, the control signal D2 varies to the high level, and the TFT6 of the n-th stage RS(n) is turned on. At this time, since the voltage signal V2 is on the low level, the electric charge accumulated in the node An is discharged.

On the other hand, in case of the backward operation, in the period from the timing T0 to the timing T1, when the control signal D2 rises to the high level, the TFT 6 of the n-th stage RS(n) is turned on, and the electric charge is accumulated in the node An by the voltage signal V2 which has risen to the high level. In the period from the timing T1 to the timing T2, when the clock signal CK2 changes to the high level, the output signal OUTn of the n-th stage RS(n) rises to the high level. As a result, the TFT 6 of the n−1-th stage RS(n−1) is turned on, and the electric charge is accumulated in the node An−1 by the voltage signal V2 which has risen to the high level.

In the next period from the timing T2 to the timing T3, when the clock signal CK1 changes to the high level, the output signal OUTn−1 of the n−1-th stage RS(n−1) rises to the high level. Consequently, the TFT 1 of the n-th stage RS(n) is turned on, and the voltage signal V1 is on the low level, thereby discharging the electric charge accumulated in the node An.

Thereafter, similarly, in the period from the timing Tn to the timing Tn+1, when the clock signal CK1 changes to the high level, the output signal OUT1 of the first stage RS(1) rises to the high level. As a result, the TFT 1 of the second stage RS(2) is turned on, and the voltage signal V1 is on the low level, thereby discharging the electric charge accumulated in the node A2. Then, in the timing Tn+1, the control signal D1 varies to the high level, and the TFT 1 of the first stage RS(1) is turned on. At this time, since the voltage signal V2 is on the low level, the electric charge accumulated in the node A1 is discharged.

Figure 30:
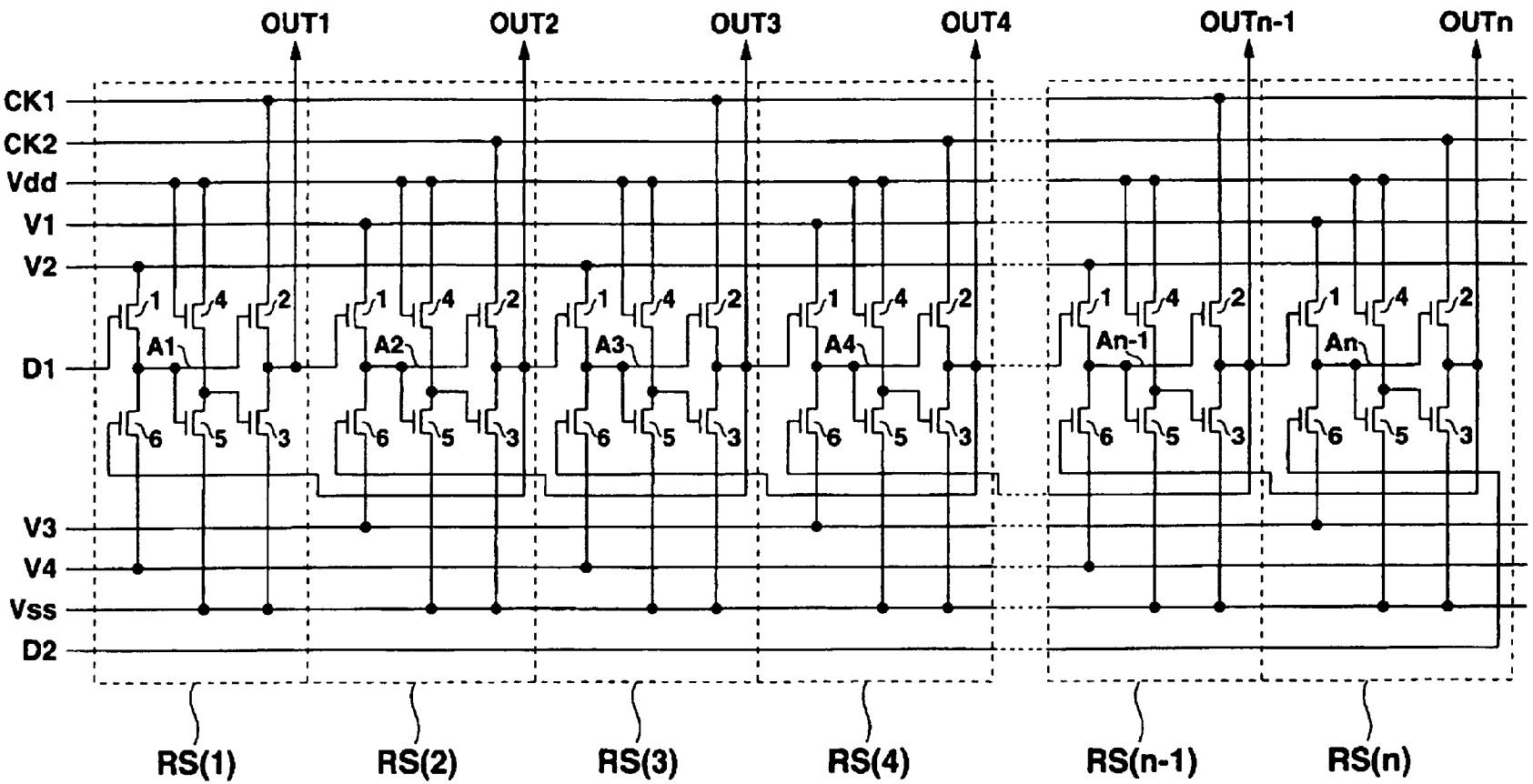
FIG. 30 is a view showing a still further circuit structure of the shift register in the second embodiment according to the present invention.

FIG. 30 is a view showing a circuit structure of a still further shift register applicable as the gate driver 152 in this embodiment. Giving description as to a difference from the shift register illustrated in FIG. 20, the voltage signal is supplied to the drain of the TFT 1 and the voltage signal V4 is fed to the source of the TFT 6 in the odd-numbered stages RS(1), RS(3), . . . , RS(n−1). In the even-numbered stages RS(2), RS(4), . . . , RS(n), the voltage signal V1 is supplied to the drain of the TFT 1, and the voltage signal V3 is supplied to the source of the TFT 6.

The operation of the shift register shown in FIG. 30 will now be explained with reference to the timing charts of FIGS. 31 and 32. If the voltage signal fed to the source of the TFT 6 in the odd-numbered stages RS(1), RS(3), . . . , RS(n−1) is substituted by V4 and the voltage signal fed to the source of the TFT 6 in the even-numbered stages RS(2), RS(4), . . . , RS(n) is substituted by V3, the operation of this shift register is substantially the same as that of the shift register illustrated in FIG. 27.

Figure 31:
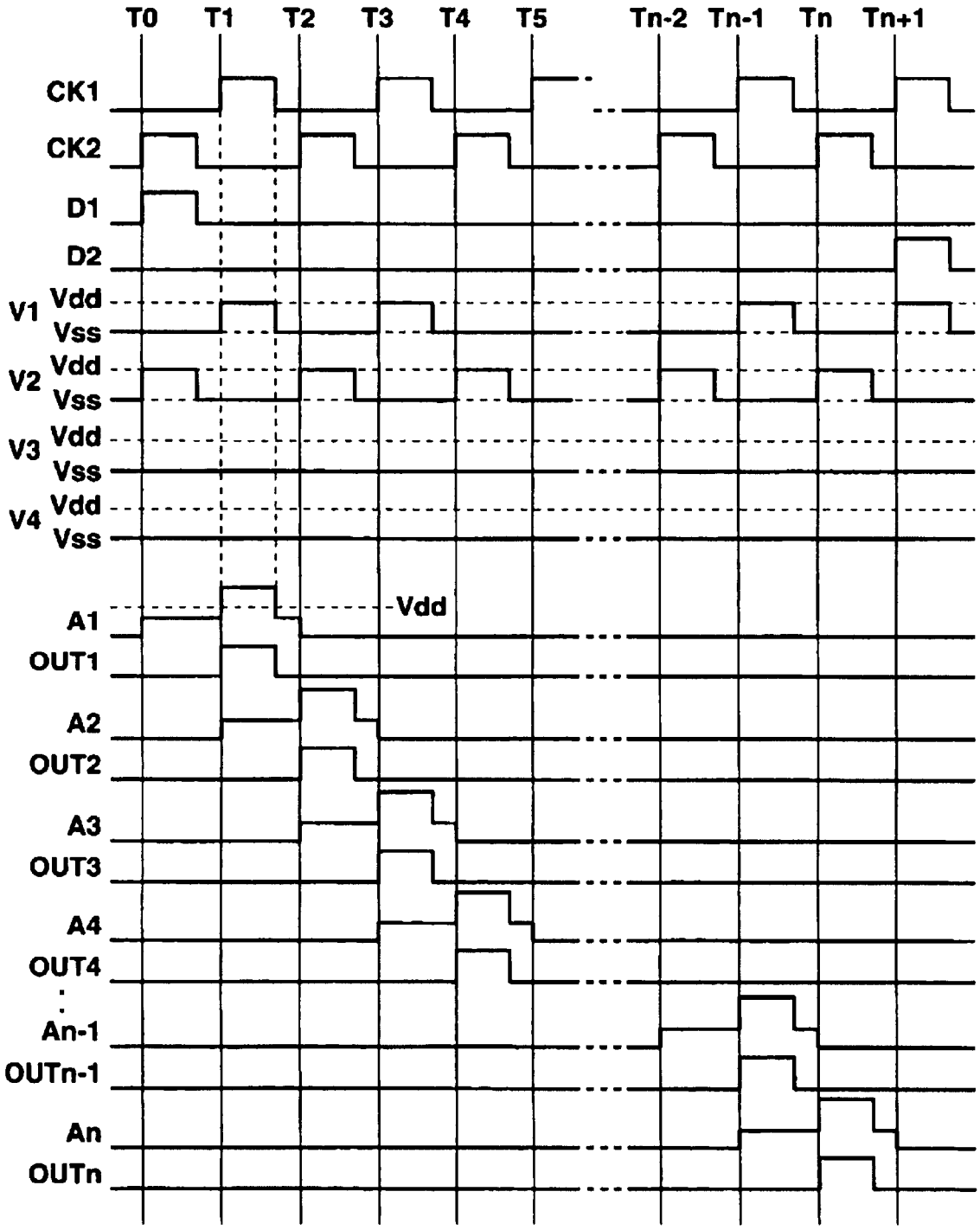
FIG. 31 is a timing chart showing the forward operation of the shift register illustrated in FIG. 27.
Figure 32:
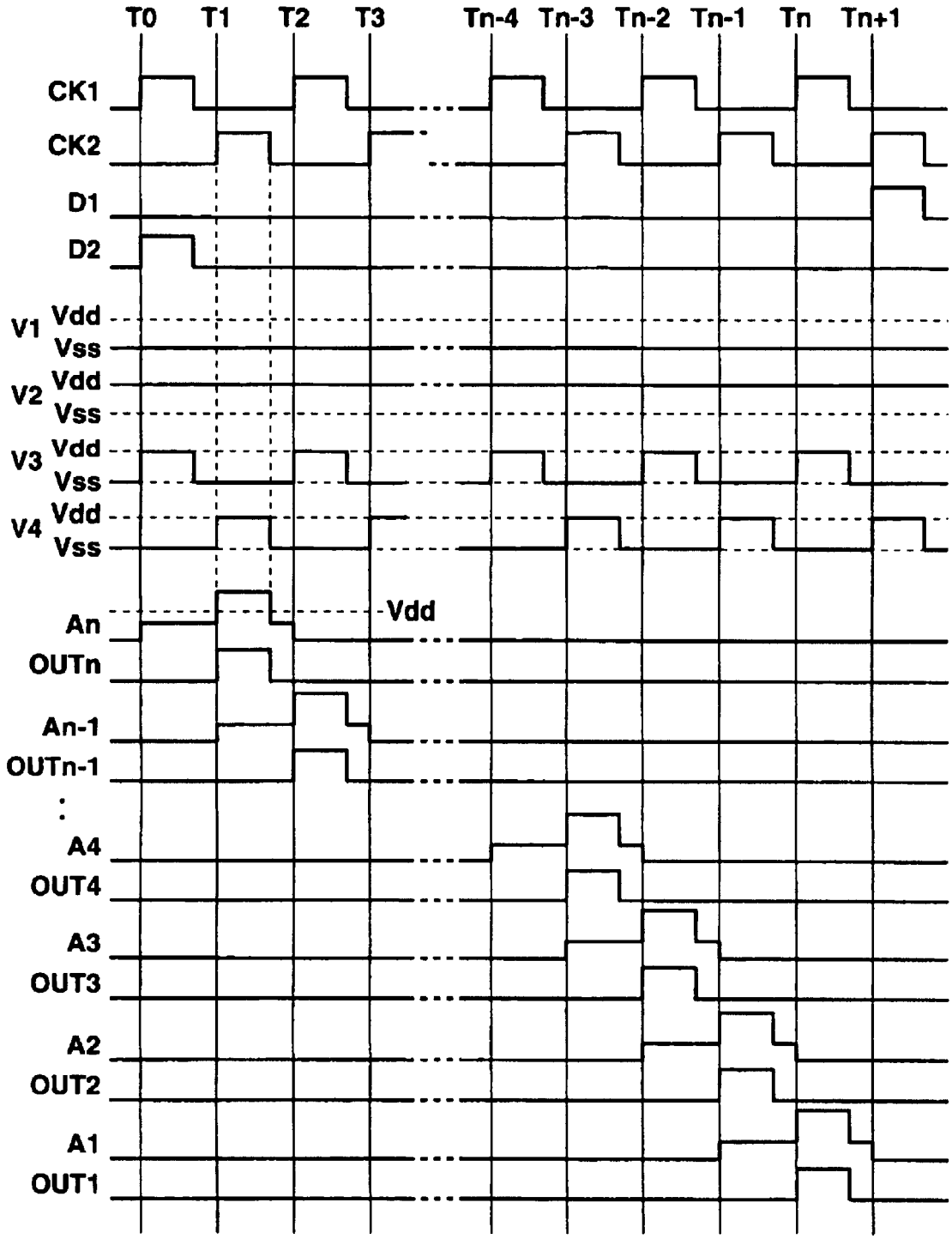
FIG. 32 is a timing chart showing the backward operation of the shift register illustrated in FIG. 27.

In case of the forward operation shown in FIG. 31, however, the source voltage (voltages signals V3 and V4) of the TFT 6 in each of the stages RS(1) to RS(n) is maintained on the low level. Furthermore, in case of the backward operation shown in FIG. 32, the drain voltage (voltage signals V1 and V2) of the TFT 1 of each of the stages RS(1) to RS(n) is maintained on the low level. That is, in regard to the TFT 1 in the forward operation and the TFT 6 in the backward operation, a period in which a difference in potential is produced between the gate and the drain and the source of the drain is short. Thus, since the voltage stress applied to the TFTs 1 and 6 can be reduced, the device characteristic of the TFTs 1 and 6 is hardly deteriorated, and a failure is unlikely to occur even in use for a long time.

In each shift register described in this embodiment, the high level of the voltage signals V1 to V4 supplied to the drain of the TFT 1 or the source of the TFT 6 may be lower than the power supply voltage Vdd if it is a voltage level which can successfully turn on the TFTs 2 and 5 by the electric charge accumulated in the nodes A1 to An. Therefore, the voltage stress applied to the TFTs 1 and 6 as well as the TFTs 2 and 5 can be smaller than that in case of operating the shift register in accordance with each of the above-mentioned timing charts.

The long normal operation is enabled by setting respective values (W/L) of the TFT 1, the TFT 2, the TFT 3, the TFT 4, the TFT 5 and the TFT 6 as values (W/L) of the TFT 21, the TFT 25, the TFT 26, the TFT 23, the TFT 22 and the TFT 24 shown in Tables 1 and 2.

Other Embodiments

The present invention is not restricted to the above-described first and second embodiments, and various modifications and applications of this invention are possible. Other embodiments to which the present invention is applied will be described hereinafter.

In the second embodiment, the direction of the shift operation by the shift register applied as the gate driver 152, namely, the forward direction or the backward direction is automatically set in accordance with an angle of the lens unit portion 202 with respect to the camera main body portion 201 detected by the angle sensor 240. Selection of the forward operation or the backward operation may be, however, determined by a user manipulating keys of the key input portion 212.

The example where the shift register illustrated in FIGS. 11, 13, 15, 18, 20, 27 and 30 is applied as the gate driver 152 of the liquid crystal display has been described. However, the shift register may be used as a driver for selecting lines in a display unit other than the liquid crystal display, for example, a plasma display, a field emission display, an organic EL display. Moreover, such a shift register may be also used as a driver for driving an imaging device having imaging pixels being aligned in a predetermined arrangement (for example, a matrix arrangement) as shown in FIG. 10.

The shift register shown in FIGS. 11, 13, 15, 18, 20, 27 and 30 may be applied to any use other than that as a driver for driving an imaging device or a display device. For example, such a shift register can be also applied to the case where serial data is converted into parallel data in a data processor and the like.

The TFTs 1 to 6 constituting the shift register described in the first and second embodiments are all of the n channel type. On the other hand, the p channel type TFTs can be also used. For example, when the TFTs which are all of the p channel type are used, inverting the high and low levels of each signal from those of the n channel type TFTs can suffice.

In the first and second embodiments, although description has been given as to the example where the present invention is applied to the digital still camera for picking up a still image, the present invention can be also applied to a video camera using a liquid crystal display and the like for a finder for picking up a moving image and visually confirming an image which is in the shooting process. When the direction of the liquid crystal display can swivel with respect to the imaging lens in the video camera, the shift register described in the second embodiment can be used as the gate driver for the liquid crystal display to display an mirror image.

As described above, in the shift register according to the present invention, fluctuations in the characteristic of the first or second transistor is reduced, and the stable operation is enabled for a long time.

Further, by adjusting the high level of the first and second voltage signals and its period, a failure of the first and second transistor hardly occurs, thereby enabling the stable operation for a long time.

Furthermore, when accumulation of the electric charge in the wiring of either the first or second transistor and discharge of the accumulated electric charge can be switched, the shift operation in both the forward direction and the backward direction is enabled.

Moreover, an electronic apparatus in which the shift register according to the present invention is applied as the driver can be superior in the durability.

In addition, by applying the shift register capable of performing the shift operation in the both forward and backward directions as the driver, an image whose vertical direction is inverted can be readily displayed.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A shift register comprising a plurality of stages electrically connected to each other, each of said stages comprising:

a first transistor having a first control terminal, which is turned on by a signal on a predetermined level supplied from one stage to said first control terminal, and outputs said signal on a predetermined level from one end of a first electric current path to the other end of said first electric current path;

a second transistor having a second control terminal, which is turned on in accordance with a voltage applied to a wiring between said second control terminal and the other end of said first electric current path of said first transistor, and outputs a first or second signal supplied from outside to one end of a second electric current path as an output signal from the other end of said second electric current path;

a load for outputting a power supply voltage supplied from outside;

a third transistor having a third control terminal, which is turned on in accordance with a voltage applied to a wiring between said third control terminal and the other end of said first electric current path of said first transistor, and outputs said power supply voltage, which is fed from outside through said load, from one end of a third electric current path to the other end of said third electric current path so that said power supply voltage outputted from said load is displaced to a voltage on a predetermined level; and a fourth transistor having a fourth control terminal, which is turned on in accordance with a voltage applied to a wiring between said fourth control terminal and said load, has one end of a fourth electric current path, connected to the other end of said second electric current path of said second transistor, and outputs a reference voltage from the other end of said fourth electric current path to one end of said fourth electric current path, a first value indicative of a channel-width/a channel-length of said fourth transistor being equal to or larger than a second value indicative of a channel-width/a channel-length of said second transistor.

2. The shift register according to claim 1, further comprising a fifth transistor having a fifth control terminal which resets a voltage applied to said wiring between said second control terminal of said second transistor and the other end of said first electric current path of said first transistor by turning on said fifth control terminal by an output signal of the other stage.

3. A shift register comprising a plurality of stages electrically connected to each other, each of said stages comprising:

a first transistor having a first control terminal, which is turned on by a signal on a predetermined level supplied from one stage to said first control terminal, and outputs said signal on a predetermined level from one end of a first electric current path to the other end of said first electric current path;

a second transistor having a second control terminal, which is turned on in accordance with a voltage applied to a wiring between said second control terminal and the other end of said first electric current path of said first transistor, and outputs a first or second signal supplied from outside to one end of a second electric current path as an output signal from the other end of said second electric current path;

a third transistor having a third control terminal, which outputs a power supply voltage from one end of a third electric current path to the other end of said third electric current path;

a fourth transistor having a fourth control terminal, which is turned on in accordance with a voltage applied to a wiring between said fourth control terminal and the other end of said first electric current path of said first transistor, and outputs from one end of a fourth electric current path to the other end of said fourth electric current path said power supply voltage supplied from said third transistor so that said power supply voltage outputted from said third transistor is displaced to a voltage on a predetermined level; and a fifth transistor having a fifth control terminal, which is turned on in accordance with a voltage applied to a wiring between said fifth control terminal and said third transistor, has one end of a fifth electric current path being connected to the other end of said second electric current path of said second transistor, and outputs a reference voltage from the other end of said fifth electric current path to one end of said fifth electric current path, a first value indicative of a channel-width/a channel-length of said third transistor being larger than 1/20 of a second value indicative of a channel-width/a channel-length of said second transistor.

4. The shift register according to claim 3, further comprising a sixth transistor having a sixth control terminal, which resets a voltage applied to said wiring between said second control terminal of said second transistor and the other end of said first electric current path of said first transistor by turning on said sixth control terminal by an output signal of the other stage.

5. A shift register comprising a plurality of stages electrically connected to each other, each of said stages comprising:

a first transistor having a first control terminal, which is turned on by a signal on a predetermined level supplied from one stage to said first control terminal, and outputs said signal on a predetermined level from one end of a first electric current path to the other end of said first electric current path;

a second transistor having a second control terminal, which is turned on in accordance with a voltage applied to a wiring between said second control terminal and the other end of said first electric current path of said first transistor, and outputs a first or second signal supplied from outside to one end of a second electric current path as an output signal from the other end of said second electric current path;

a third transistor having a third control terminal, which outputs a power supply voltage from one end of a third electric current path to the other end of said third electric current path;

a fourth transistor having a fourth control terminal, which is turned on in accordance with a voltage applied to a wiring between said fourth control terminal and the other end of said first electric current path of said first transistor, and outputs from one end of a fourth electric current path to the other end of said fourth electric current path said power supply voltage supplied from said third transistor so that said power supply voltage outputted from said third transistor is displaced to a voltage on a predetermined level;

a fifth transistor having a fifth control terminal, which is turned on in accordance with a voltage applied to a wiring between said fifth control terminal and said third transistor, has one end of a fifth electric current path being connected to the other end of said second electric current path of said second transistor, and outputs a reference voltage from the other end of said fifth electric current path to one end of said fifth electric current path; and a sixth transistor having a sixth control terminal, which resets a voltage applied to said wiring between said second control terminal of said second transistor and the other end of said first electric current path of said first transistor by turning on said sixth control terminal by an output signal of the other stage, a first value indicative of a channel-width/a channel-length of said fifth transistor being larger than a second value indicative of a channel-width/a channel-length of said first transistor.

6. The shift register according to claim 5, wherein a third value indicative of a channel-width/a channel-length of said second transistor is larger than said second value.

7. The shift register according to claim 5, wherein said first value is larger than a fourth value indicative of a channel-width/a channel-length of said sixth transistor.

8. The shift register according to claim 5, wherein a third value indicative of a channel-width/a channel-length of said second transistor is larger than a fourth value indicative of a channel-width/a channel-length of said sixth transistor.

9. The shift register according to claim 5, wherein said second value is larger than a fifth value indicative of a channel-width/a channel-length of said third transistor.

10. The shift register according to claim 5, wherein a fourth value indicative of a channel-width/a channel-length of said sixth transistor is larger than a fifth value indicative of a channel-width/a channel-length of said third transistor.

11. The shift register according to claim 5, wherein said second value is larger than a sixth value indicative of a channel-width/a channel-length of said fourth transistor.

12. The shift register according to claim 5, wherein a fourth value indicative of a channel-width/a channel-length of said sixth transistor is larger than a sixth value indicative of a channel-width/a channel-length of said fourth transistor.

13. A shift register comprising a plurality of stages electrically connected to each other, each stage of said shift register comprising:

a first transistor having a first control terminal to which an output signal of a stage on one side is supplied and one end of an electric current path to which a first voltage signal is supplied;

a second transistor having a second control terminal to which an output signal of a stage on the other side is supplied and one end of an electric current path to which a second voltage signal is supplied; and a third transistor having a third control terminal being connected to the other end of each electric current path of said first and second transistors, which is turned on or off by said first or second voltage signal supplied to a wiring between said third control terminal and said first or second transistor through said first or second transistor, and outputs as an output signal of the corresponding stage from the other end of an electric current path a first or second clock signal supplied to one end of said electric current path when turned on, at least one of said first and second transistors discharging electric charge accumulated in said wiring by an output signal of a stage on one side or the other side supplied to said first or second control terminal.

14. The shift register according to claim 13, wherein one of said first and second transistors of a stage on one end in a plurality of said stages is turned on when a first control signal is supplied from outside to said control terminal, and electric charge is thereby accumulated in said wiring; and the other one of said first and second transistors of a stage on the other end in a plurality of said stages is turned on when a second control signal is supplied from outside to said control terminal, and electric charge accumulated in said wiring is thereby discharged.

15. The shift register according to claim 13, wherein by switching levels of said first and second voltage signals, electric charge is accumulated in said wiring through one of said first and second transistors, and electric charge accumulated in said wiring can be discharged through the other one of said first and second transistors.

16. The shift register according to claim 15, wherein levels of said first and second voltage signals are switched in such a manner than one of said first and second voltage signals is maintained on a low level.

17. The shift register according to claim 13, wherein a phase of said first clock signal and that of said second clock signal are different from each other by 180°.

18. The shift register according to claim 13, wherein respective transistors constituting each stage of a plurality of said stages are field effect transistors which are of the same channel type.

19. The shift register according to claim 13, further comprising:

a fourth transistor having a fourth control terminal connected to the other end of each electric current path of said first and second transistors, which has on and off timings synchronized with said third transistor, and discharges from the other end of an electric current path a signal supplied from a voltage source to one end of said electric current path through a load when turned on; and a fifth transistor having a fifth control terminal connected to said voltage source through said load, which is turned on by a signal connected from said voltage source when said fourth transistor is turned off, and has one end of an electric current path connected to the other end of an electric current path of said third transistor.

20. An electronic apparatus comprising:

(A) a shift register comprising in each stage:

a first transistor having a first control terminal, which is turned on by a signal on a predetermined level supplied from one stage to said first control terminal, and outputs said signal on a predetermined level from one end of a first electric current path to the other end of said first electric current path;

a second transistor having a second control terminal, which is turned on in accordance with a voltage applied to a wiring between said second control terminal and the other end of said first electric current path of said first transistor, and outputs a first or second signal supplied from outside to one end of a second electric current path as an output signal from the other end of said second electric current path;

a third transistor having a third control terminal, which outputs a power supply voltage from one end of a third electric current path to the other end of said third electric current path;

a fourth transistor having a fourth control terminal, which is turned on in accordance with a voltage applied to a wiring between said fourth control terminal and the other end of said first electric current path of said first transistor, and outputs from one end of a fourth electric current path to the other end of said fourth electric current path said power supply voltage supplied from said third transistor so that said power supply voltage outputted from said third transistor is displaced to a voltage on a predetermined level;

a fifth transistor having a fifth control terminal, which is turned on in accordance with a voltage applied to a wiring between said fifth control terminal and said third transistor, has one end of a fifth electric current path being connected to the other end of said second electric current path of said second transistor, and outputs a reference voltage from the other end of said fifth electric current path to one end of said fifth electric current path; and a sixth transistor having a sixth control terminal, which resets a voltage applied to said wiring between said second control terminal of said second transistor and the other end of said first electric current path of said first transistor by turning on said sixth control terminal by an output signal of the other stage; and (B) a drive device driven in accordance with said output signals from said second transistors of said shift register, a first value indicative of a channel-width/a channel-length of said fifth transistor being larger than a second value indicative of a channel-width/a channel-length of said first transistor.

21. The electronic apparatus according to claim 20, wherein a third value indicative of a channel-width/a channel-length of said second transistor is larger than said second value.

22. The electronic apparatus according to claim 20, wherein said first value is larger than a fourth value indicative of a channel-width/a channel-length of said sixth transistor.

23. The electronic apparatus according to claim 20, wherein a third value indicative of a channel-width/a channel-length of said second transistor is larger than a fourth value of a channel-width/a channel-length of said sixth transistor.

24. The electronic apparatus according to claim 20, wherein said second value is larger than a fifth value indicative of a channel-width/a channel-length of said third transistor.

25. The electronic apparatus according to claim 20, wherein a fourth value indicative of a channel-width/a channel-length of said sixth transistor is larger than a fifth value indicative of a channel-width/a channel-length of said third transistor.

26. The electronic apparatus according to claim 20, wherein said second value is larger than a sixth value indicative of a channel-width/a channel-length of said fourth transistor.

27. The electronic apparatus according to claim 20, wherein a fourth value indicative of a channel-width/a channel-length of said sixth transistor is larger than a sixth value indicative of a channel-width/a channel-length of said fourth transistor.

28. The electronic apparatus according to claim 20, wherein said drive device includes a liquid crystal display device.

29. The electronic apparatus according to claim 20, wherein said drive device has a photosensor.

*30. A shift register comprising a plurality of stages electrically connected to each other, at least one of said stages comprising:*

*a first transistor having a first control terminal, which is turned on by a signal on a predetermined level supplied from one stage to said first control terminal, and outputs a signal on a predetermined level from one end of a first electric current path to the other end of said first electric current path;*

*a second transistor having a second control terminal, which is turned on in accordance with a voltage applied to a wiring between said second control terminal and the other end of said first electric current path of said first transistor, and outputs a signal supplied from outside to one end of a second electric current path as an output signal from the other end of said second electric current path;*

*a load for outputting a power supply voltage supplied from outside;*

*a third transistor having a third control terminal, which is turned on in accordance with a voltage applied to a wiring between said third control terminal and the other end of said first electric current path of said first transistor, and outputs said power supply voltage, which is fed from outside through said load, from one end of a third electric current path to the other end of said third electric current path so that said power supply voltage outputted from said load is displaced to a voltage on a predetermined level; and*

*a fourth transistor having a fourth control terminal, which is turned on in accordance with a voltage applied to a wiring between said fourth control terminal and said load, has one end of a fourth electric current path, connected to the other end of said second electric current path of said second transistor, and outputs a reference voltage from the other end of said fourth electric current path to one end of said fourth electric current path;*

*wherein a first value indicative of a channel-width/a channel-length of said fourth transistor is equal to or larger than a second value indicative of a channel-width/a channel-length of said second transistor.*

*31. An electronic apparatus comprising:*

*(A) a shift register comprising a plurality of stages electrically connected to each other, at least one of said stages including:*

*a first transistor having a first control terminal, which is turned on by a signal on a predetermined level supplied from one stage to said first control terminal, and outputs a signal on a predetermined level from one end of a first electric current path to the other end of said first electric current path;*

*a second transistor having a second control terminal, which is turned on in accordance with a voltage applied to a wiring between said second control terminal and the other end of said first electric current path of said first transistor, and outputs a signal supplied from outside to one end of a second electric current path as an output signal from the other end of said second electric current path;*

*a load for outputting a power supply voltage supplied from outside;*

*a third transistor having a third control terminal, which is turned on in accordance with a voltage applied to a wiring between said third control terminal and the other end of said first electric current path of said first transistor, and outputs said power supply voltage, which is fed from outside through said load, from one end of a third electric current path to the other end of said third electric current path so that said power supply voltage outputted from said load is displaced to a voltage on a predetermined level; and*

*a fourth transistor having a fourth control terminal, which is turned on in accordance with a voltage applied to a wiring between said fourth control terminal and said load, has one end of a fourth electric current path, connected to the other end of said second electric current path of said second transistor, and outputs a reference voltage from the other end of said fourth electric current path to one end of said fourth electric current path; and*

*(B) a drive device driven in accordance with said output signal from said at least one second transistor of said shift register;*

*wherein a first value indicative of a channel-width/a channel-length of said fourth transistor is equal to or larger than a second value indicative of a channel-width/a channel-length of said second transistor.*

*32. A shift register comprising a plurality of stages electrically connected to each other, at least one of said stages comprising:*

*a first transistor having a first control terminal, which is turned on by a signal on a predetermined level supplied from one stage to said first control terminal, and outputs a signal on a predetermined level from one end of a first electric current path to the other end of said first electric current path;*

*a second transistor having a second control terminal, which is turned on in accordance with a voltage applied to a wiring between said second control terminal and the other end of said first electric current path of said first transistor, and outputs a signal supplied from outside to one end of a second electric current path as an output signal from the other end of said second electric current path;*

*a third transistor having a third control terminal, which outputs a power supply voltage from one end of a third electric current path to the other end of said third electric current path;*

*a fourth transistor having a fourth control terminal, which is turned on in accordance with a voltage applied to a wiring between said fourth control terminal and the other end of said first electric current path of said first transistor, and outputs from one end of a fourth electric current path to the other end of said fourth electric current path said power supply voltage supplied from said third transistor so that said power supply voltage outputted from said third transistor is displaced to a voltage on a predetermined level; and*

*a fifth transistor having a fifth control terminal, which is turned on in accordance with a voltage applied to a wiring between said fifth control terminal and said third transistor, has one end of a fifth electric current path being connected to the other end of said second electric current path of said second transistor, and outputs a reference voltage from the other end of said fifth electric current path to one end of said fifth electric current path;*

*wherein a first value indicative of a channel-width/a channel-length of said third transistor is larger than 1/20 of a second value indicative of a channel-width/a channel-length of said second transistor.*

*33. An electronic apparatus comprising:*

*(A) a shift register comprising a plurality of stages electrically connected to each other, at least one of said stages including:*

*a first transistor having a first control terminal, which is turned on by a signal on a predetermined level supplied from one stage to said first control terminal, and outputs a signal on a predetermined level from one end of a first electric current path to the other end of said first electric current path;*

*a second transistor having a third control terminal, which is turned on in accordance with a voltage applied to a wiring between said second control terminal and the other end of said first electric current path of said first transistor, and outputs a signal supplied from outside to one end of a second electric current path as an output signal from the other end of said second electric current path;*

*a third transistor having a third control terminal, which outputs a power supply voltage from one end of a third electric current path to the other end of said third electric current path;*

*a fourth transistor having a fourth control terminal, which is turned on in accordance with a voltage applied to a wiring between said fourth control terminal and the other end of said first electric current path of said first transistor, and outputs from one end of a fourth electric current path to the other end of said fourth electric current path said power supply voltage supplied from said third transistor so that said power supply voltage outputted from said third transistor is displaced to a voltage on a predetermined level; and*

*a fifth transistor having a fifth control terminal, which is turned on in accordance with a voltage applied to a wiring between said fifth control terminal and said third transistor, has one end of a fifth electric current path being connected to the other end of said second electric current path of said second transistor, and outputs a reference voltage from the other end of said fifth electric current path to one end of said fifth electric current path; and*

*(B) a drive device driven in accordance with said output signal from said at least one second transistor of said shift register;*

*wherein a first value indicative of a channel-width/a channel-length of said third transistor is larger then 1/20 of a second value indicative of a channel-width/a channel-length of said second transistor.*

*34. A shift register comprising a plurality of stages electrically connected to each other, at least one of said stages comprising:*

*a first transistor having a first control terminal, which is turned on by a signal on a predetermined level supplied from one stage to said first control terminal, and outputs a signal on a predetermined level from one end of a first electric current path to the other end of said first electric current path;*

*a second transistor having a second control terminal, which is turned on in accordance with a voltage applied to a wiring between said second control terminal and the other end of said first electric current path of said first transistor, and outputs a signal supplied from outside to one end of a second electric current path as an output signal from the other end of said second electric current path;*

*a third transistor having a third control terminal, which outputs a power supply voltage from one end of a third electric current path to the other end of said third electric current path;*

*a fourth transistor having a fourth control terminal, which is turned on in accordance with a voltage applied to a wiring between said fourth control terminal and the other end of said first electric current path of said first transistor, and outputs from one end of a fourth electric current path to the other end of said fourth electric current path said power supply voltage supplied from said third transistor so that said power supply voltage outputted from said third transistor is displaced to a voltage on a predetermined level;*

*a fifth transistor having a fifth control terminal, which is turned on in accordance with a voltage applied to a wiring between said fifth control terminal and said third transistor, has one end of a fifth electric current path being connected to the other end of said second electric current path of said second transistor, and outputs a reference voltage from the other end of said fifth electric current path to one end of said fifth electric current path; and*

*a sixth transistor having a sixth control terminal, which resets a voltage applied to said wiring between said second control terminal of said second transistor and the other end of said first electric current path of said first transistor by turning on said sixth control terminal by an output signal of the other stage;*

*wherein a first value indicative of a channel-width/a channel-length of said fifth transistor is larger than a second value indicative of a channel-width/a channel-length of said first transistor.*

*35. An electronic apparatus comprising:*

*(A) a shift register comprising a plurality of stages electrically connected to each other, at least one of said stages including:*

*a first transistor having a first control terminal, which is turned on by a signal on a predetermined level supplied*

*from one stage to said first control terminal, and outputs a signal on a predetermined level from one end of a first electric current path to the other end of said first electric current path;*

*a second transistor having a second control terminal, which is turned on in accordance with a voltage applied to a wiring between said second control terminal and the other end of said first electric current path of said first transistor, and outputs a signal supplied from outside to one end of a second electric current path as an output signal from the other end of said second electric current path;*

*a third transistor having a third control terminal, which outputs a power supply voltage from one end of a third electric current path to the other end of said third electric current path;*

*a fourth transistor having a fourth control terminal, which is turned on in accordance with a voltage applied to a wiring between said fourth control terminal and the other end of said first electric current path of said first transistor, and outputs from one end of a fourth electric current path to the other end of said fourth electric current path said power supply voltage supplied from said third transistor so that said power supply voltage outputted from said third transistor is displaced to a voltage on a predetermined level;*

*a fifth transistor having a fifth control terminal, which is turned on in accordance with a voltage applied to a wiring between said fifth control terminal and said third transistor, has one end of a fifth electric current path being connected to the other end of said second electric current path of said second transistor, and outputs a reference voltage from the other end of said fifth electric current path to one end of said fifth electric current path; and*

*a sixth transistor having a sixth control terminal, which resets a voltage applied to said wiring between said second control terminal of said second transistor and the other end of said first electric current path of said first transistor by turning on said sixth control terminal by an output signal of the other stage; and*

*(B) a drive device driven in accordance with said output signal from said at least one second transistor of said shift register;*

*wherein a first value indicative of a channel-width/a channel-length of said fifth transistor is larger than a second value indicative of a channel-width/a channel-length of said first transistor.*

*36. A shift register comprising a plurality of stages electrically connected to each other, at least one of said stages comprising:*

*a first transistor having a first control terminal to which a signal of a stage on one side is supplied and one end of an electric current path to which a first voltage signal differing from said signal is supplied;*

*a second transistor having a second control terminal to which a signal of a stage on the other side is supplied and one end of an electric current path to which a second voltage signal is supplied; and*

*a third transistor having a third control terminal being connected to the other end of each electric current path of said first and second transistors, which is turned on or off by said first or second voltage signal supplied to a wiring between said third control terminal and said first or second transistor through said first or second transistor, and outputs as an output signal of the corresponding stage from the other end of an electric current path a clock signal supplied to one end of said electric current path when turned on;*

*wherein at least one of said first and second transistors discharges electric charges accumulated in said wiring by a signal of a stage on one side or the other side supplied to said first or second control terminal.*

*37. An electronic apparatus comprising:*

*(A) a shift register comprising a plurality of stages electrically connected to each other, at least one of said stages including:*

*a first transistor having a first control terminal to which a signal of a stage on one side is supplied and one end of an electric current path to which a first voltage signal differing from said signal is supplied;*

*a second transistor having a second control terminal to which a signal of a stage on the other side is supplied and one end of an electric current path to which a second voltage signal is supplied; and*

*a third transistor having a third control terminal being connected to the other end of each electric current path of said first and second transistors, which is turned on or off by said first or second voltage signal supplied to a wiring between said third control terminal and said first or second transistor through said first or second transistor, and outputs as an output signal of the corresponding stage from the other end of an electric current path a clock signal supplied to one end of said electric current path when turned on;*

*wherein at least one of said first and second transistors discharges electric charges accumulated in said wiring by a signal of a stage on one side or the other side supplied to said first or second control terminal; and*

*(B) a drive device driven in accordance with said output signal from said at least one third transistor of said shift register.*

*38. A shift register comprising a plurality of stages electrically connected to each other, at least one of said stages comprising:*

*a first transistor having a first control terminal to which a signal of a preceding stage is supplied and one end of a first electric current path to which a first voltage signal differing from said signal is supplied;*

*a second transistor having a second control terminal to which a signal of a next stage is supplied and one end of a second electric current path to which a second voltage signal is supplied; and*

*a third transistor having a third control terminal being connected to the other end of each of the first and second electric current paths of said first and second transistors, which is turned on or off by said first or second voltage signal supplied to a wiring between said third control terminal and said first or second transistor through said first or second transistor, and outputs as an output signal of the corresponding stage from the other end of a third electric current path a clock signal supplied to one end of said electric current path when turned on;*

*wherein at least one of said first and second transistors discharges electric charges accumulated in said wiring by a signal of said preceding stage or said next stage supplied to said first or second control terminal.*

*39. An electronic apparatus comprising:*

*(A) a shift register comprising a plurality of stages electrically connected to each other, at least one of said stages including:*

*a first transistor having a first control terminal to which a signal of a preceding stage is supplied and one end of a first electric current path to which a first voltage signal differing from said signal is supplied;*

*a second transistor having a second control terminal to which a signal of a next stage is supplied and one end of a second electric current path to which a second voltage signal is supplied; and*

*a third transistor having a third control terminal being connected to the other end of each of the first and second electric current paths of said first and second transistors, which is turned on or off by said first or second voltage signal supplied to a wiring between said third control terminal and said first or second transistor through said first or second transistor, and outputs as an output signal of the corresponding stage from the other end of a third electric current path a clock signal supplied to one end of said electric current path when turned on;*

*wherein at least one of said first and second transistors discharges electric charges accumulated in said wiring by a signal of said preceding stage or said next stage supplied to said first or second control terminal; and*

*(B) a drive device driven in accordance with said output signal from said at least one third transistor of said shift register.*

*40. A shift register comprising a plurality of stages electrically connected to each other, at least one of said stages comprising:*

*a first transistor having a first control terminal to which a signal of a preceding stage is supplied and one end of a first electric current path to which a first voltage signal differing from said signal is supplied;*

*a second transistor having a second control terminal to which a signal of a next stage is supplied an one end of a second electric current path to which a second voltage signal is supplied;*

*a third transistor having a third control terminal being connected to the other end of each of the first and second electric current paths of said first and second transistors, which is turned on or off by said first or second voltage signal supplied to a wiring between said third control terminal and said first or second transistor through said first or second transistor, and outputs as an output signal of the corresponding stage from the other end of a third electric current path a clock signal supplied to one end of said third electric current path when turned on;*

*a fourth transistor having a fourth control terminal, which outputs a power supply voltage from one end of a fourth electric current path to the other end of said fourth electric current path;*

*a fifth transistor having a fifth control terminal, which is turned on in accordance with a voltage applied to a wiring between said fifth control terminal and the other end of said first electric current path of said first transistor, and outputs from one end of a fifth electric current path to the other end of said fifth electric current path said power supply voltage supplied from said fourth transistor so that said power supply voltage outputted from said fourth transistor is displaced to a voltage on a predetermined level; and*

*a sixth transistor having a sixth control terminal, which is turned on in accordance with a voltage applied to a wiring between said sixth control terminal and said fourth transistor, has one end of a sixth electric current path being connected to the other end of said third electric current path of said third transistor, and outputs a reference voltage from the other end of said sixth electric current path to one end of said sixth electric current path;*

*wherein at least one of said first and second transistors discharges electric charges accumulated in said wiring by a signal of said preceding stage or said next stage supplied to said first or second control terminal.*

*41. An electronic apparatus comprising:*

*(A) a shift register comprising a plurality of stages electrically connected to each other, at least one of said stages including:*

*a first transistor having a first control terminal to which a signal of a preceding stage is supplied and one end of a first electric current path to which a first voltage signal differing from said signal is supplied;*

*a second transistor having a second control terminal to which a signal of a next stage is supplied and one end of a second electric current path to which a second voltage signal is supplied;*

*a third transistor having a third control terminal being connected to the other end of each of the first and second electric current paths of said first and second transistors, which is turned on or off by said first or second voltage signal supplied to a wiring between said third control terminal and said first or second transistor through said first or second transistor, and outputs as an output signal of the corresponding stage from the other end of a third electric current path a clock signal supplied to one end of said third electric current path when turned on;*

*a fourth transistor having a fourth control terminal, which outputs a power supply voltage from one end of a fourth electric current path to the other end of said fourth electric current path;*

*a fifth transistor having a fifth control terminal, which is turned on in accordance with a voltage applied to a wiring between said fifth control terminal and the other end of said first electric current path of said first transistor, and outputs from one end of a fifth electric current path to the other end of said fifth electric current path said power supply voltage supplied from said fourth transistor so that said power supply voltage outputted from said fourth transistor is displaced to a voltage on a predetermined level; and*

*a sixth transistor having a sixth control terminal, which is turned on in accordance with a voltage applied to a wiring between said sixth control terminal and said fourth transistor, has one end of a sixth electric current path being connected to the other end of said third electric current path of said third transistor, and outputs a reference voltage from the other end of said sixth electric current path to one end of said sixth electric current path;*

*wherein at least one of said first and second transistors discharges electric charges accumulated in said wiring by a signal of said preceding stage or said next stage supplied to said first or second control terminal; and*

*(B) a drive device driven in accordance with said output signal from said at least one third transistor of said shift register.*

* * * * *